US012604727B2

(12) United States Patent
Lee et al.

(10) Patent No.: US 12,604,727 B2
(45) Date of Patent: Apr. 14, 2026

(54) SEMICONDUCTOR CHIP INCLUDING LOW-K DIELECTRIC LAYER

(71) Applicant: Samsung Electronics Co., Ltd., Suwon-si (KR)

(72) Inventors: Yeonjin Lee, Suwon-si (KR); Junyong Noh, Yongin-si (KR); Minjung Choi, Suwon-si (KR); Junghoon Han, Hwaseong-si (KR); Yunrae Cho, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 329 days.

(21) Appl. No.: 18/127,342

(22) Filed: Mar. 28, 2023

(65) Prior Publication Data

US 2023/0230915 A1      Jul. 20, 2023

Related U.S. Application Data

(63) Continuation of application No. 16/848,246, filed on Apr. 14, 2020, now Pat. No. 11,776,894.

(30) Foreign Application Priority Data

Aug. 20, 2019    (KR) ........................ 10-2019-0101872

(51) Int. Cl.
*H01L 23/522*       (2006.01)
*H01L 21/56*        (2006.01)
(Continued)

(52) U.S. Cl.
CPC ........ *H01L 23/5222* (2013.01); *H01L 21/561* (2013.01); *H01L 21/76832* (2013.01);
(Continued)

(58) Field of Classification Search
None
See application file for complete search history.

(56) References Cited

U.S. PATENT DOCUMENTS 7,955,955 B2    6/2011  Lane et al.
8,580,657 B2   11/2013  Kuo et al.
(Continued)

FOREIGN PATENT DOCUMENTS

CN       101681890 A     3/2010
CN       101685794 A     3/2010
(Continued)

OTHER PUBLICATIONS

Chisca et al., "Dielectric and conduction properties of polyimide films," CAS 2011 Proceedings (2011 International Semiconductor Conference), vol. 2. pp. 253-256, IEEE, 2011.
(Continued)

*Primary Examiner* — Bradley Smith
(74) *Attorney, Agent, or Firm* — Muir Patent Law, PLLC

(57) ABSTRACT

A semiconductor chip includes a device layer on a substrate, the device layer including a plurality of semiconductor devices; a wiring structure and a lower inter-wiring dielectric layer each on the device layer, the lower inter-wiring dielectric layer surrounding the wiring structure and having a lower permittivity than silicon oxide; an upper inter-wiring dielectric layer arranged on the lower inter-wiring dielectric layer; an isolation recess arranged along an edge of the substrate, the isolation recess formed on side surfaces of the lower and upper inter-wiring dielectric layers and having a bottom surface at a level equal to or lower than that of a bottom surface of the lower inter-wiring dielectric layer; and a cover dielectric layer covering the side surfaces of the lower and upper inter-wiring dielectric layers and the bottom surface of the isolation recess.

20 Claims, 45 Drawing Sheets

(51) Int. Cl.

| | |
|---|---|
| *H01L 21/768* | (2006.01) |
| *H01L 21/78* | (2006.01) |
| *H01L 23/00* | (2006.01) |
| *H01L 23/31* | (2006.01) |
| *H01L 23/48* | (2006.01) |
| *H01L 23/485* | (2006.01) |
| *H01L 23/528* | (2006.01) |
| *H01L 23/532* | (2006.01) |
| *H10D 84/01* | (2025.01) |

(52) U.S. Cl.
CPC .......... *H01L 21/78* (2013.01); *H01L 23/3185* (2013.01); *H01L 23/481* (2013.01); *H01L 23/485* (2013.01); *H01L 23/5226* (2013.01); *H01L 23/5283* (2013.01); *H01L 23/53295* (2013.01); *H01L 24/05* (2013.01); *H10D 84/01* (2025.01); *H01L 23/562* (2013.01); *H01L 2224/0237* (2013.01); *H01L 2224/024* (2013.01)

(56) References Cited

U.S. PATENT DOCUMENTS

| | | | |
|---|---|---|---|
| 8,680,653 | B2 | 3/2014 | Miccoli et al. |
| 9,559,005 | B2 | 1/2017 | Tsai et al. |
| 9,620,488 | B2 | 4/2017 | Yu et al. |
| 9,704,904 | B2 | 7/2017 | Lai et al. |
| 9,761,483 | B1 | 9/2017 | Chang et al. |
| 9,793,406 | B2 | 10/2017 | Chang et al. |
| 2004/0235272 | A1 | 11/2004 | Howard et al. |
| 2010/0283129 | A1 | 11/2010 | Tetani et al. |
| 2017/0053902 | A1* | 2/2017 | Yu ........................ H01L 23/481 |
| 2018/0261555 | A1 | 9/2018 | Cho et al. |
| 2019/0035750 | A1 | 1/2019 | Han et al. |

FOREIGN PATENT DOCUMENTS

| | | | |
|---|---|---|---|
| CN | 106252323 | A | 12/2016 |
| CN | 106469718 | A | 3/2017 |
| CN | 106486506 | A | 3/2017 |
| CN | 106653845 | A | 5/2017 |
| CN | 107170825 | A | 9/2017 |
| CN | 102354692 | B | 10/2017 |
| CN | 108573918 | A | 9/2018 |
| JP | 5819999 | B2 | 11/2015 |
| JP | 2016164942 | A | 9/2016 |
| JP | 2017041587 | A | 2/2017 |
| TW | 201620105 | A | 6/2016 |
| WO | 2017/208535 | A1 | 12/2017 |

OTHER PUBLICATIONS

First Office Action dated Jul. 29, 2024 for corresponding DE Patent Application No. 102020109675.5.

Nguyen et al., "Assembly-level reliability: a methodology for effective manufacturing of IC packages," IEEE transactions on reliability 44.1 (2002): 14-18.

Pan et al., "Evaluation of dicing blue film for wire bond and bumped flip chip wafers," Journal of Functional Materials and Devices, 2013 (05).

\* cited by examiner

250
240
230
220 SRS
210

CPD

CPD

STR

PD
PV
SPD
SPV
MS
ML
MV
ML-L
MV-L
130
120
110

260
250
240
230
220 SRSd
RGN
210

295

CPD

PD
PV
SPD
SPV
MS
ML
MV
ML-L
MV-L
130
120
110

CPD

RGN

SEMICONDUCTOR CHIP INCLUDING LOW-K DIELECTRIC LAYER

CROSS-REFERENCE TO RELATED APPLICATION

This application is a continuation of U.S. patent application Ser. No. 16/848,246, filed on Apr. 14, 2020, which claims priority under 35 U.S.C. § 119 to Korean Patent Application No. 10-2019-0101872, filed on Aug. 20, 2019, in the Korean Intellectual Property Office, the disclosure of each of these applications being hereby incorporated herein by reference in its entirety.

BACKGROUND

The inventive concept relates to a semiconductor chip, and more particularly, to a semiconductor chip including a low-k dielectric layer.

With rapid development of the electronics industry and user needs, electronic devices and equipment are becoming lighter and more compact than ever. Accordingly, semiconductor chips/packages used in electronic devices are getting to have higher degrees of integration than ever, and thus design rules for the components of semiconductor chips/packages have been decreased. Therefore, a low-k dielectric layer has been introduced to reduce parasitic capacitance in a semiconductor chip, and more particularly, between wirings.

SUMMARY

The inventive concept provides a semiconductor chip for securing mechanical reliability during singulation of the semiconductor chip.

According to an aspect of the inventive concept, there is provided a semiconductor chip. The semiconductor chip includes a device layer on a substrate, the device layer including a plurality of semiconductor devices; a wiring structure and a lower inter-wiring dielectric layer each on the device layer, the lower inter-wiring dielectric layer surrounding the wiring structure and having a lower permittivity than silicon oxide; an upper inter-wiring dielectric layer on the lower inter-wiring dielectric layer, the upper inter-wiring dielectric layer having a permittivity that is equal to or higher than a permittivity of silicon oxide; an isolation recess along an edge of the substrate, the isolation recess formed on a side surface of the lower inter-wiring dielectric layer and a side surface of the upper inter-wiring dielectric layer and having a bottom surface at a level that is equal to or lower than a level of a bottom surface of the lower inter-wiring dielectric layer; and a cover dielectric layer covering the side surfaces of the lower inter-wiring dielectric layer and the upper inter-wiring dielectric layer and the bottom surface of the isolation recess.

According to another aspect of the inventive concept, there is provided a semiconductor chip including a device layer on a substrate, the device layer including a plurality of semiconductor devices; a wiring structure and a lower inter-wiring dielectric layer each on the device layer, the lower inter-wiring dielectric layer surrounding the wiring structure; an upper inter-wiring dielectric layer on the lower inter-wiring dielectric layer; an isolation recess arranged along the entirety of an edge of the substrate and extending from a top surface of the upper inter-wiring dielectric layer at least to the same level as a bottom surface of the lower inter-wiring dielectric layer; and an upper cover dielectric layer filling the isolation recess, covering at least a portion of the top surface of the upper inter-wiring dielectric layer, and having a step portion along at least a portion of the edge of the substrate.

According to a further aspect of the inventive concept, there is provided a semiconductor chip including a device layer on a substrate that has four sides which form a rectangular shape in a plan view, the device layer including a plurality of semiconductor devices; a wiring structure and a lower inter-wiring dielectric layer each on the device layer, the lower inter-wiring dielectric layer surrounding the wiring structure; an upper inter-wiring dielectric layer on the lower inter-wiring dielectric layer; an isolation recess arranged along the entirety of an edge of the substrate and extending from a top surface of the upper inter-wiring dielectric layer at least to the same level as a bottom surface of the lower inter-wiring dielectric layer; a pad pattern on the upper inter-wiring dielectric layer and a pad via passing through the upper inter-wiring dielectric layer, the pad via electrically connecting the pad pattern to the wiring structure; and an upper cover dielectric layer filling the isolation recess, covering at least a portion of the top surface of the upper inter-wiring dielectric layer, and having a step portion along at least one of the four sides of the substrate at a level that is higher than a top surface of the lower inter-wiring dielectric layer and lower than the top surface of the upper inter-wiring dielectric layer.

BRIEF DESCRIPTION OF THE DRAWINGS

Embodiments of the inventive concept will be more clearly understood from the following detailed description taken in conjunction with the accompanying drawings in which:

FIGS. 1 through 7 are cross-sectional views of stages in a method of manufacturing a semiconductor chip, according to embodiments;

FIG. 10 is a cross-sectional view showing main elements of a semiconductor chip, according to embodiments;

Figure 11:
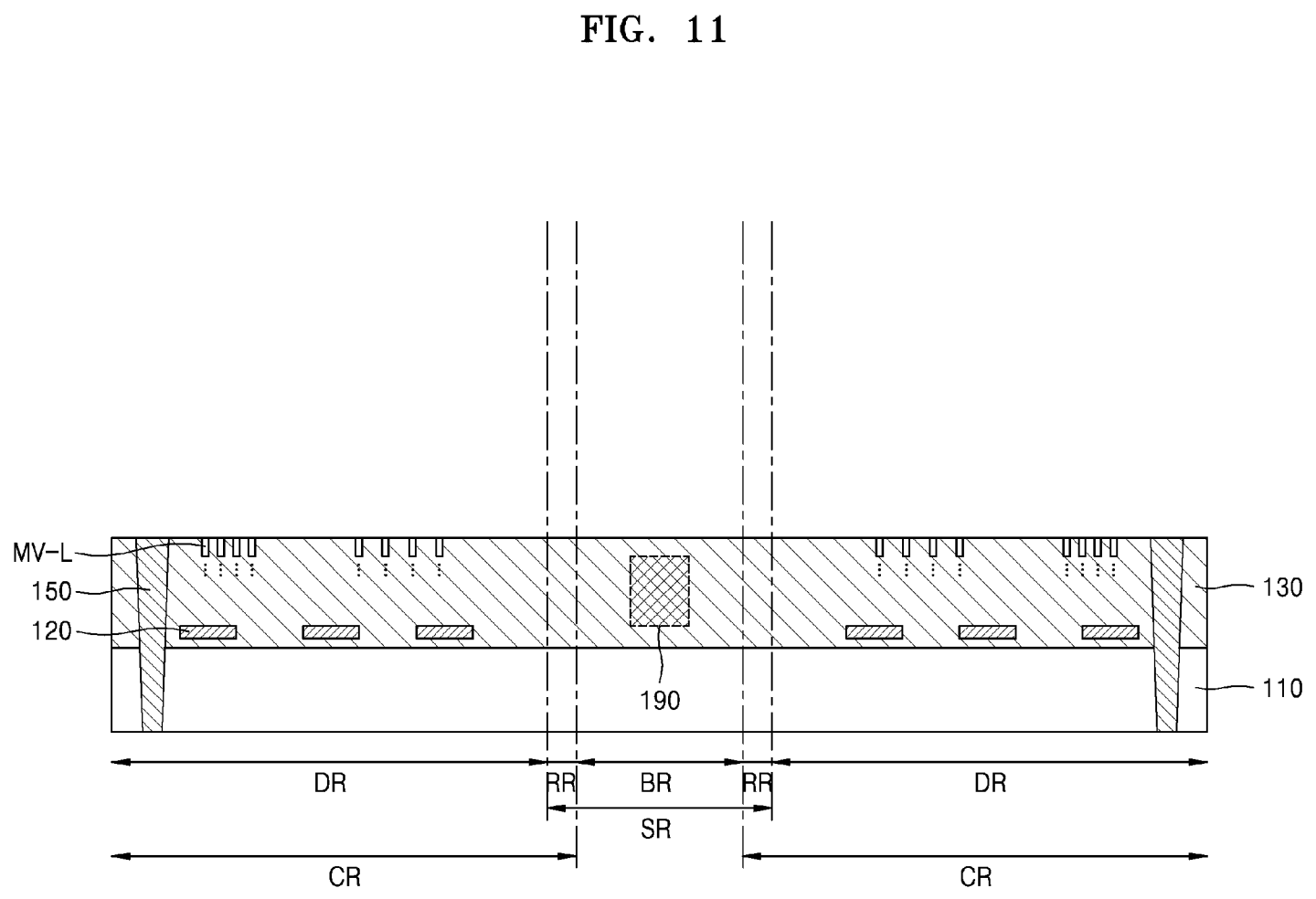

FIGS. 11 through 15 are cross-sectional views of stages in a method of manufacturing a semiconductor chip, according to embodiments;

Figure 17:
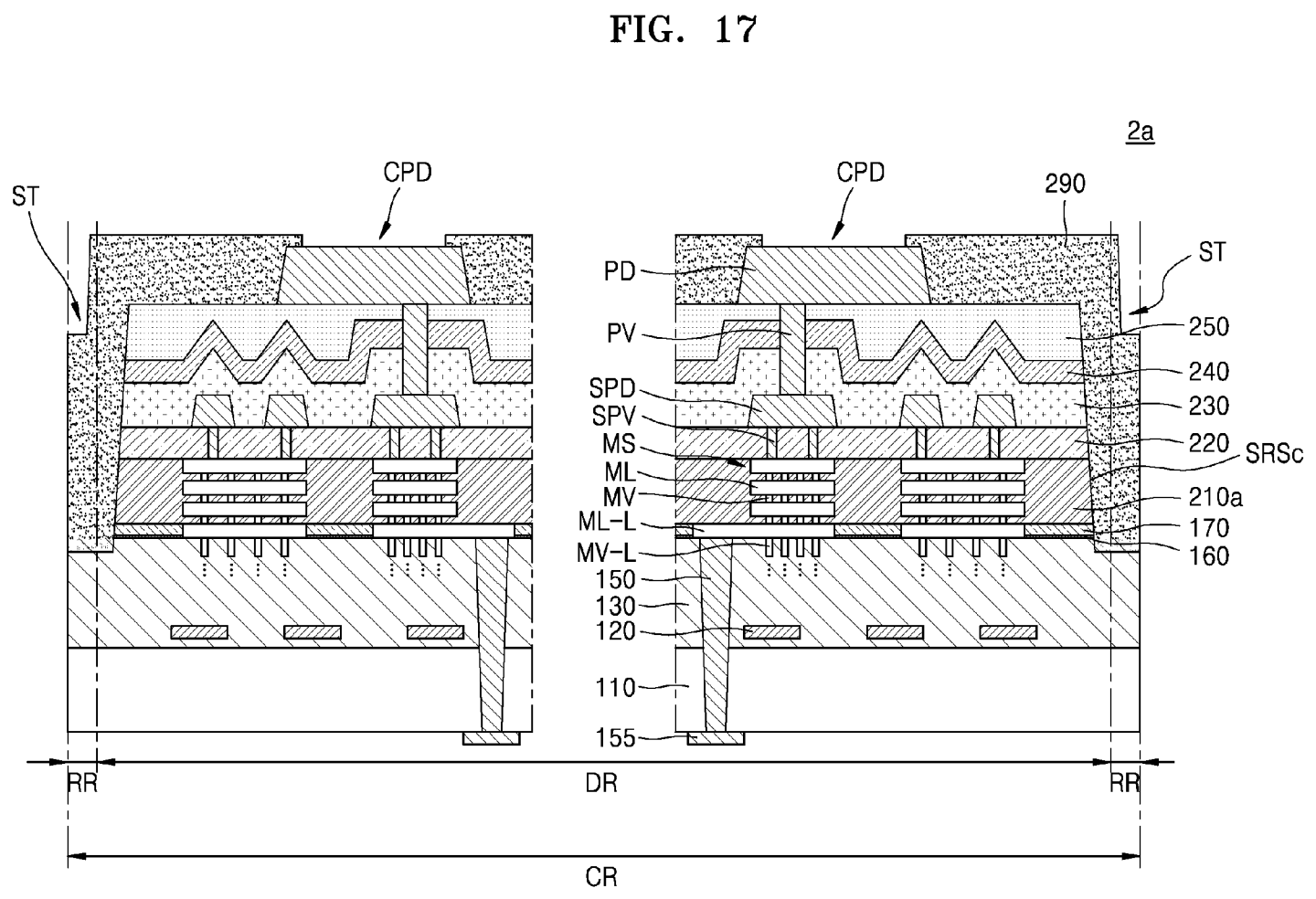

FIG. 17 is a cross-sectional view showing main elements of a semiconductor chip, according to embodiments;

Figure 18A:
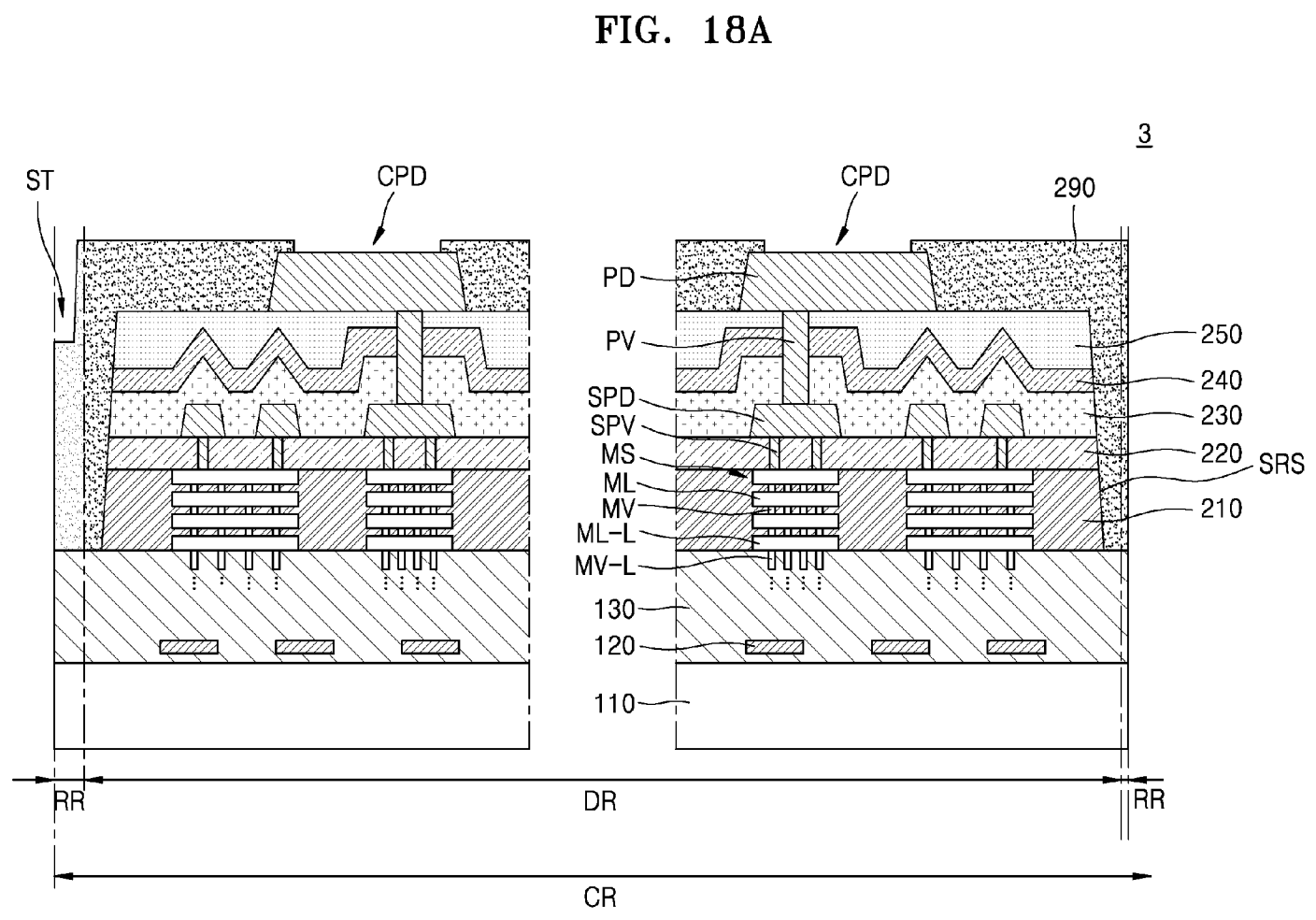

FIGS. 18A and 18B are respectively a cross-sectional view and a plan view that show main elements of a semiconductor chip, according to embodiments;

Figure 19A:
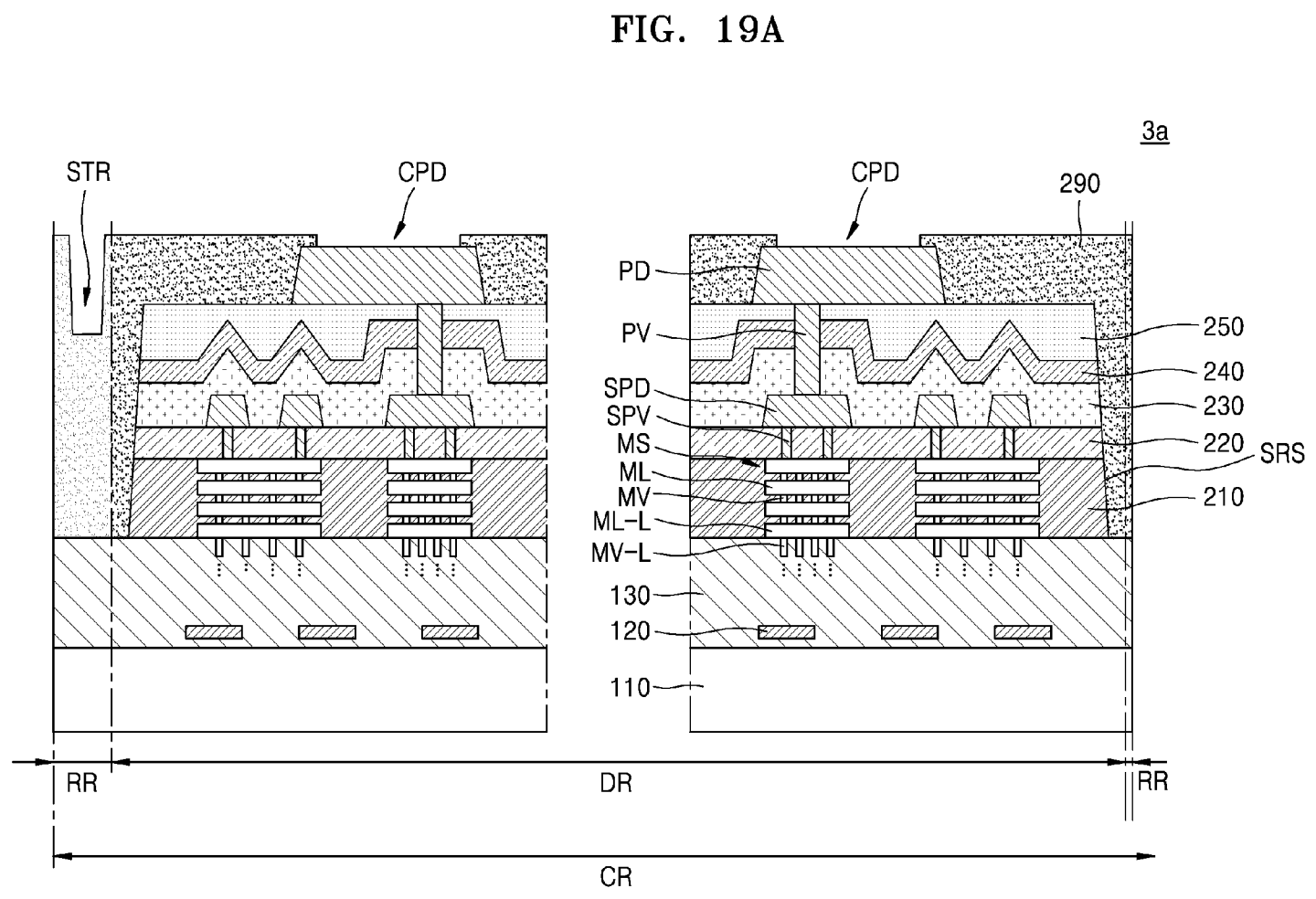

FIGS. 19A and 19B are respectively a cross-sectional view and a plan view that show main elements of a semiconductor chip, according to embodiments;

Figure 21:
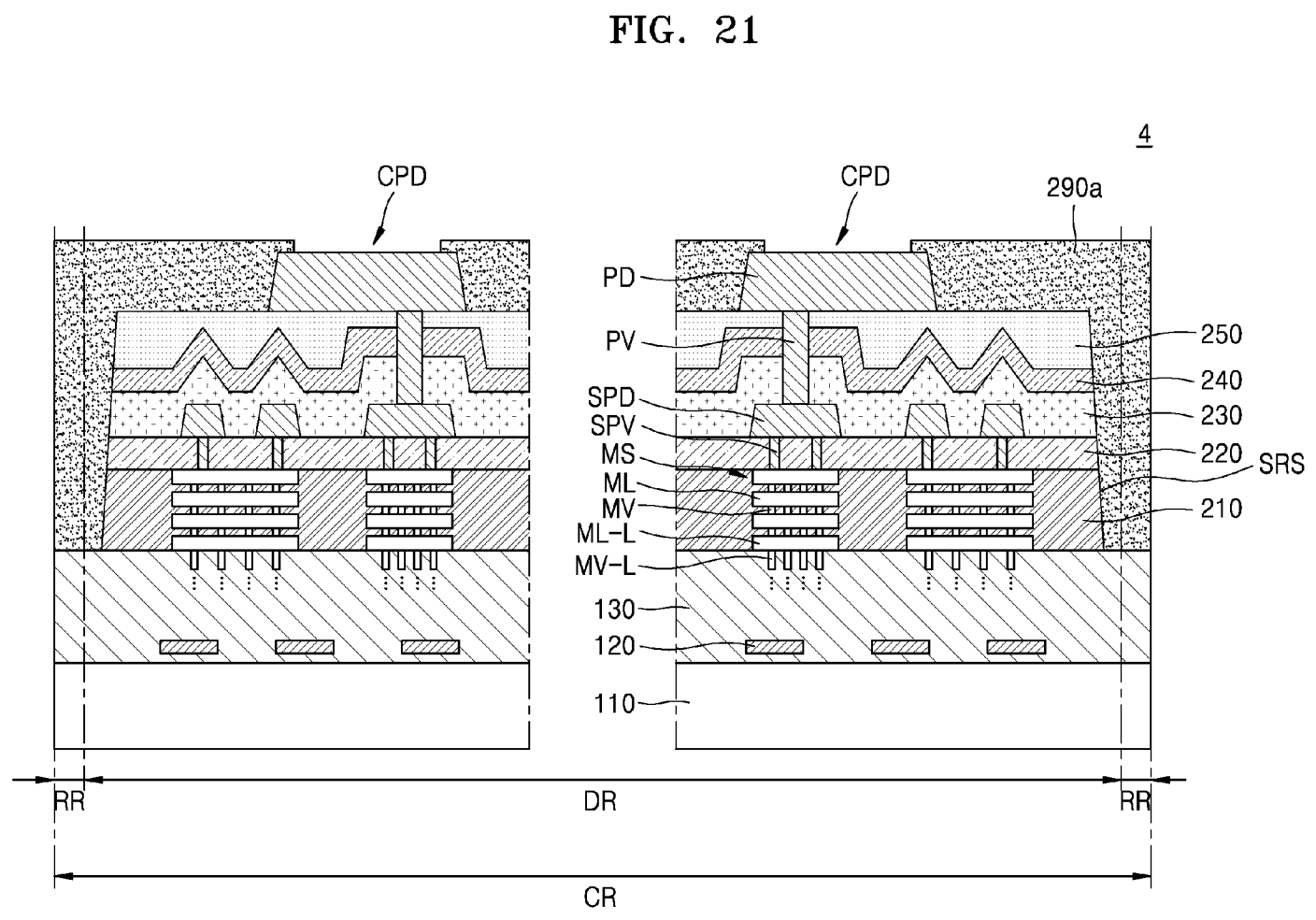

FIG. 21 is a cross-sectional view showing main elements of a semiconductor chip, according to embodiments;

Figure 24:
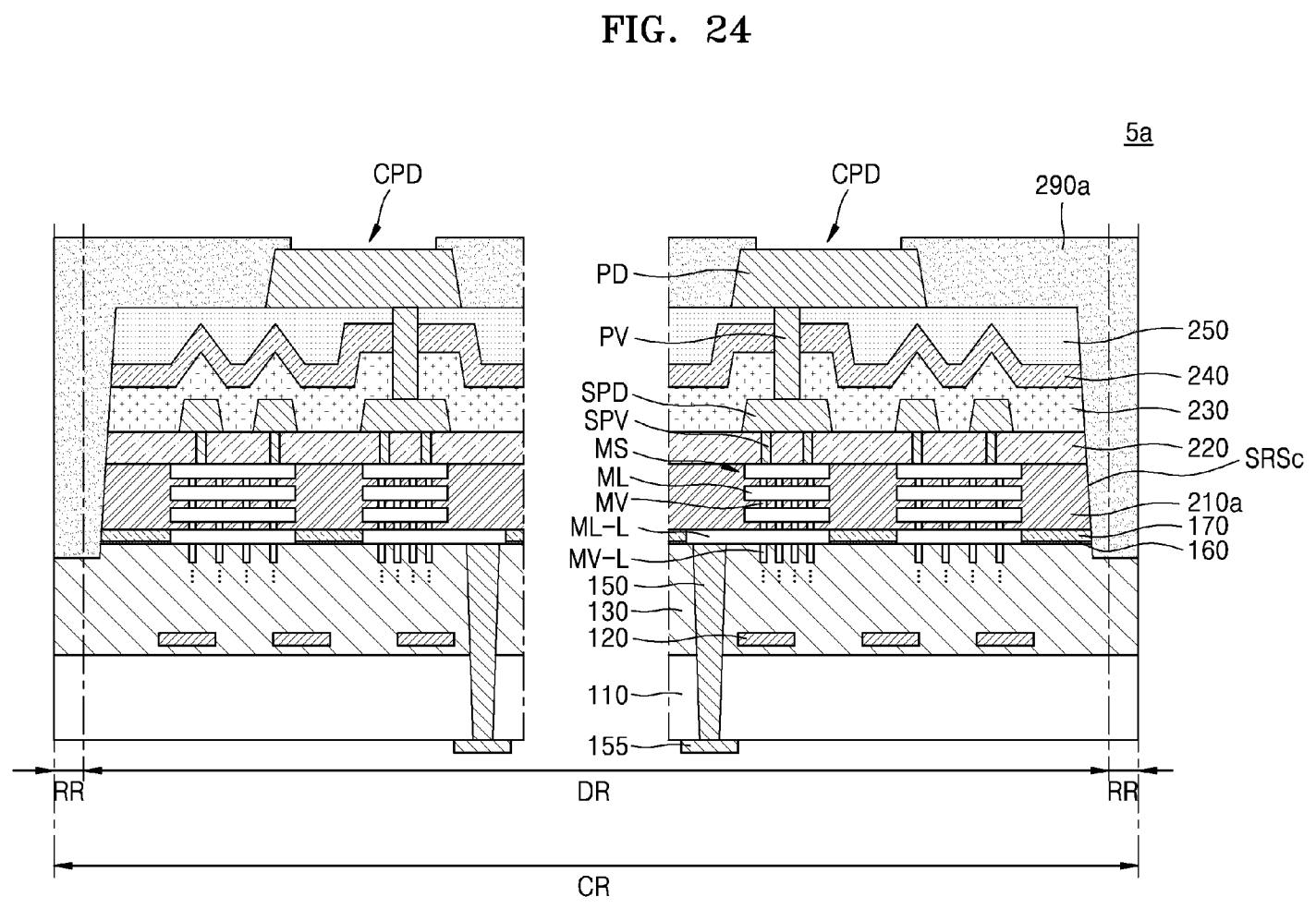

FIGS. 22 through 24 are cross-sectional views showing main elements of semiconductor chips, according to embodiments;

Figure 25:
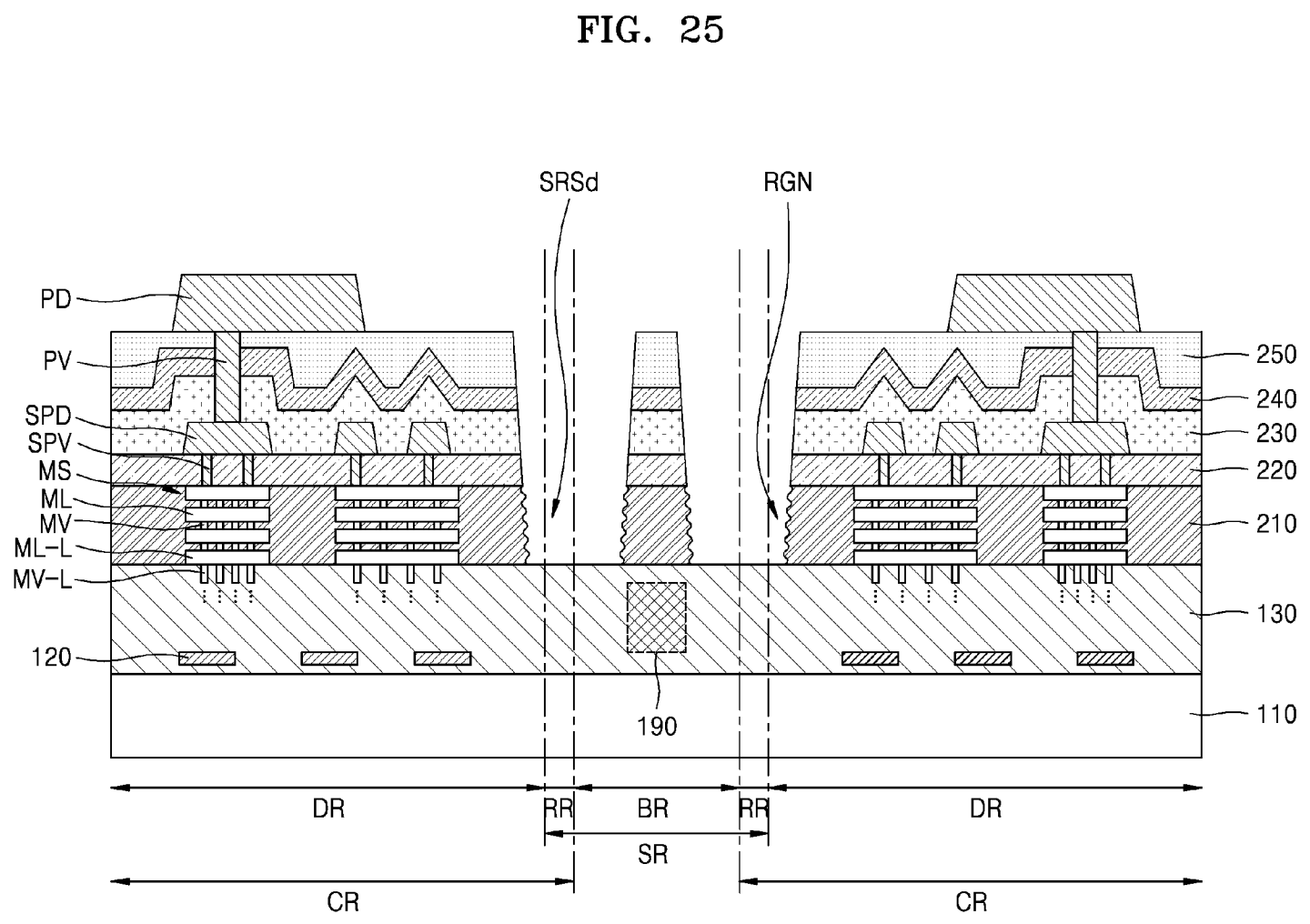
Figure 26:
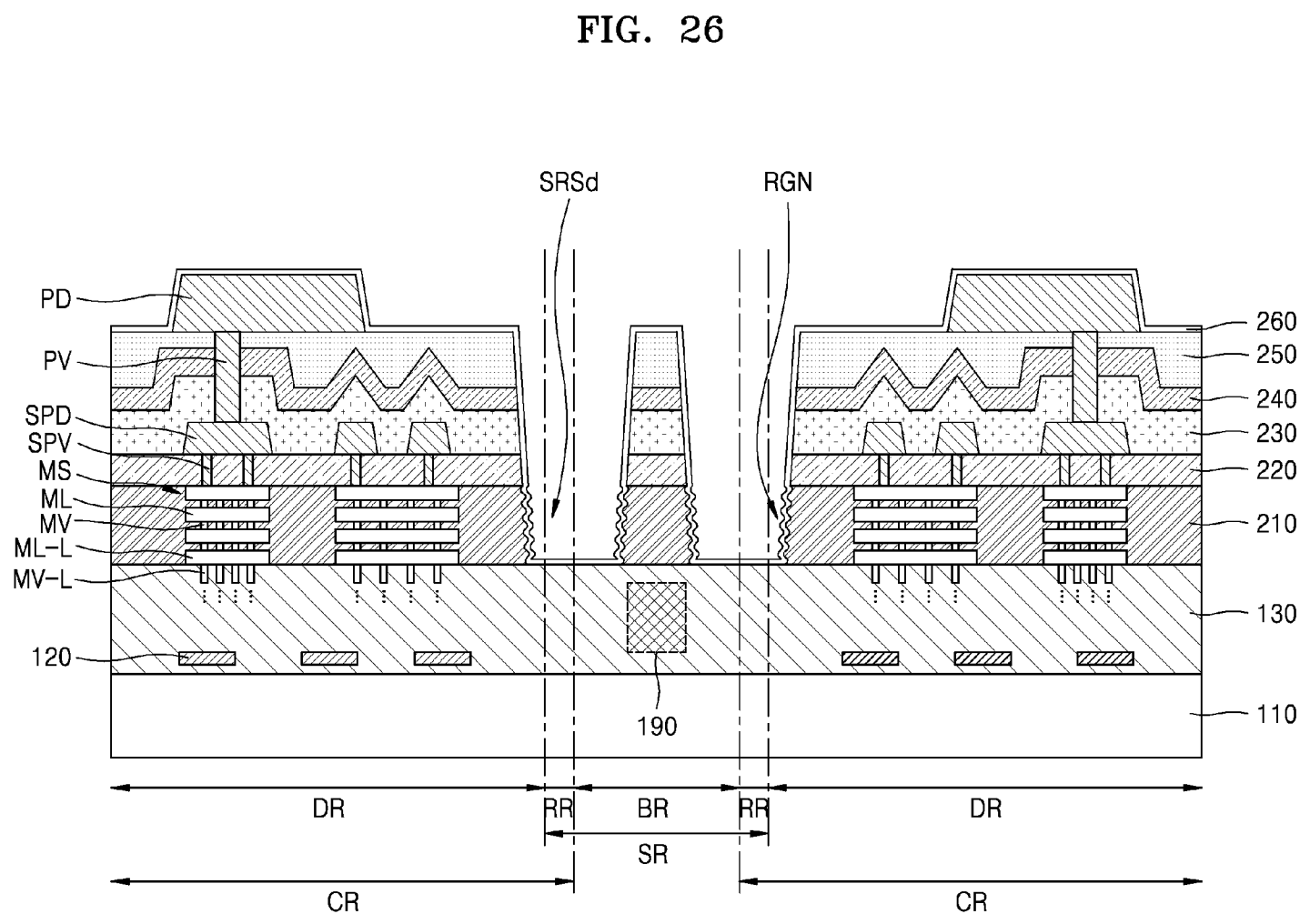

FIGS. 25 and 26 are cross-sectional views of stages in a method of manufacturing a semiconductor chip, according to embodiments;

Figure 27:
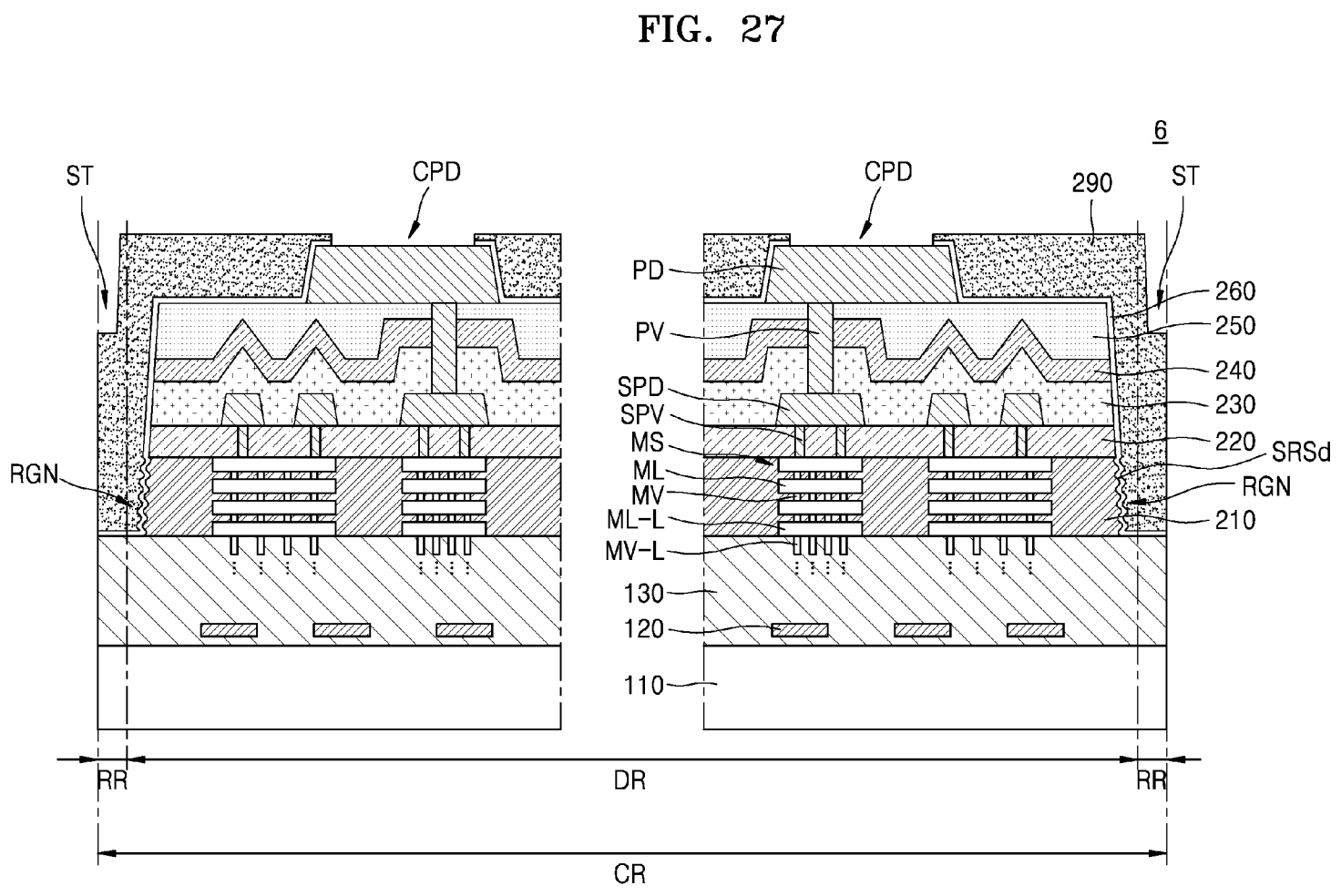

FIG. 27 is a cross-sectional view showing main elements of a semiconductor chip, according to embodiments;

Figure 31A:
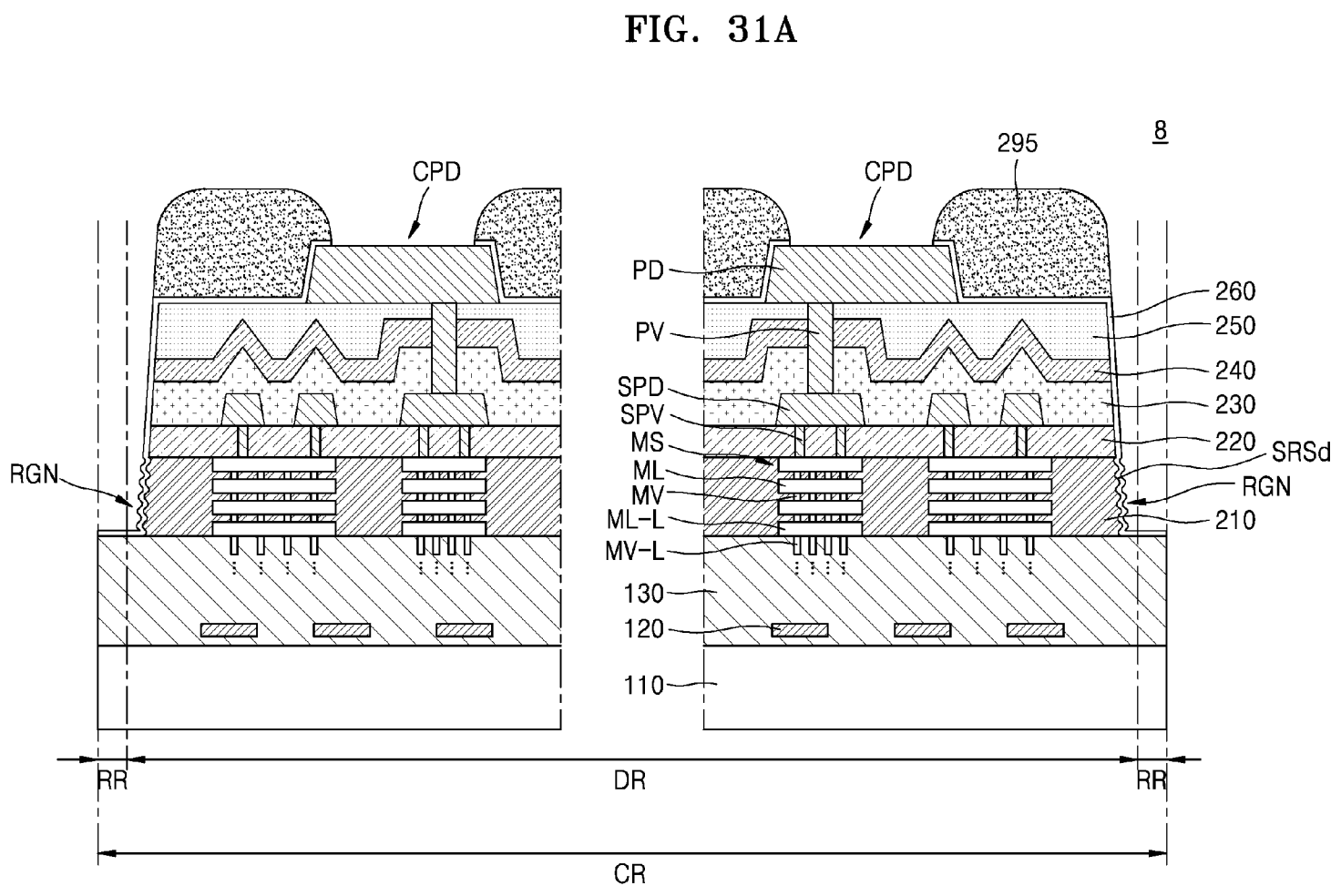

FIGS. 31A and 31B are respectively a cross-sectional view and a plan view that show main elements of a semiconductor chip, according to embodiments;

Figure 37A:
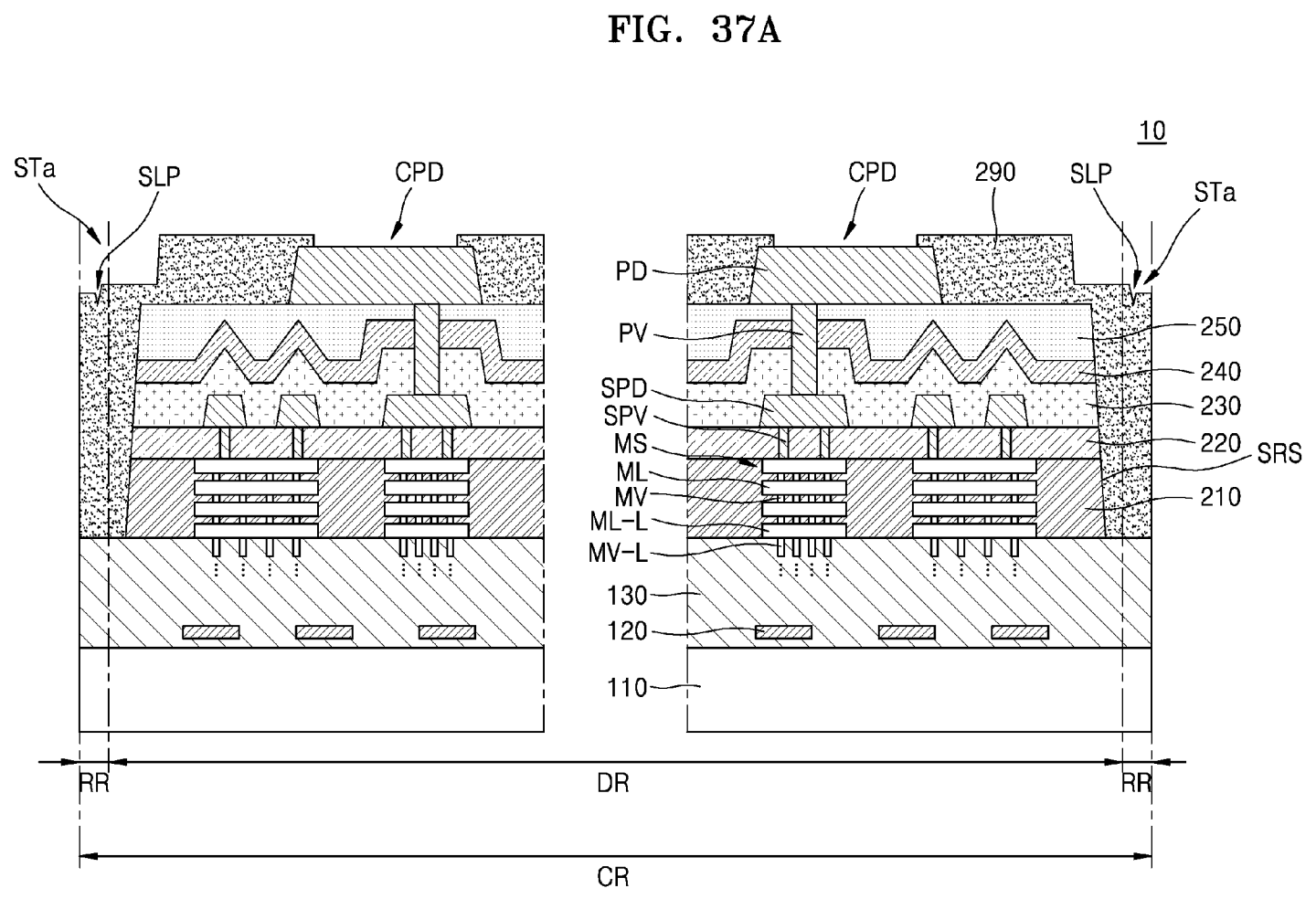

FIGS. 37A and 37B are respectively a cross-sectional view and a plan view that show main elements of a semiconductor chip, according to embodiments;

Figure 39A:
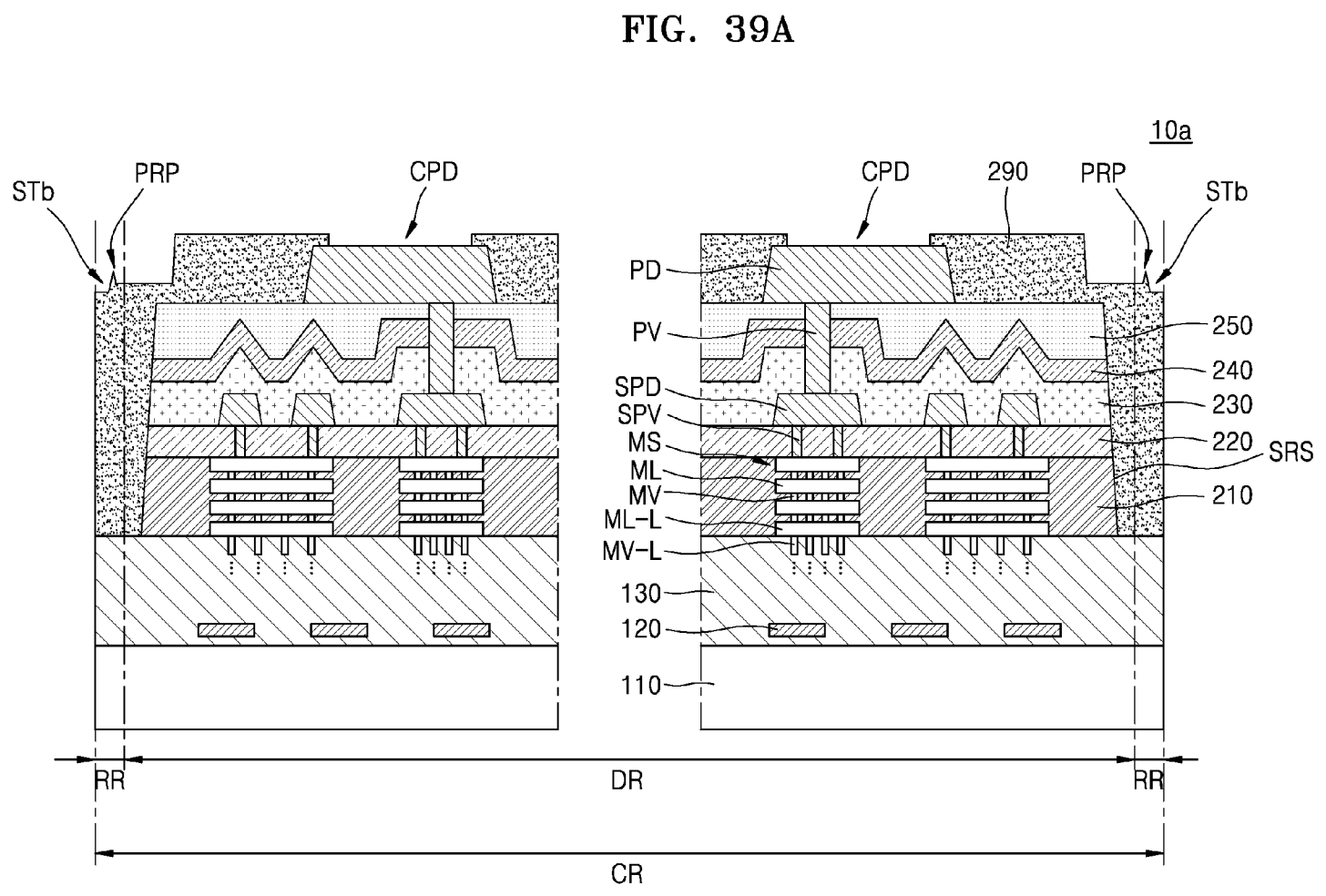

FIGS. 39A and 39B are respectively a cross-sectional view and a plan view that show main elements of a semiconductor chip, according to embodiments.

DETAILED DESCRIPTION OF THE EMBODIMENTS

FIGS. 1 through 7 are cross-sectional views of stages in a method of manufacturing a semiconductor chip, according to embodiments. FIGS. 8A and 8B are respectively a cross-sectional view and a plan view that show main elements of a semiconductor chip, according to embodiments.

Figure 1:
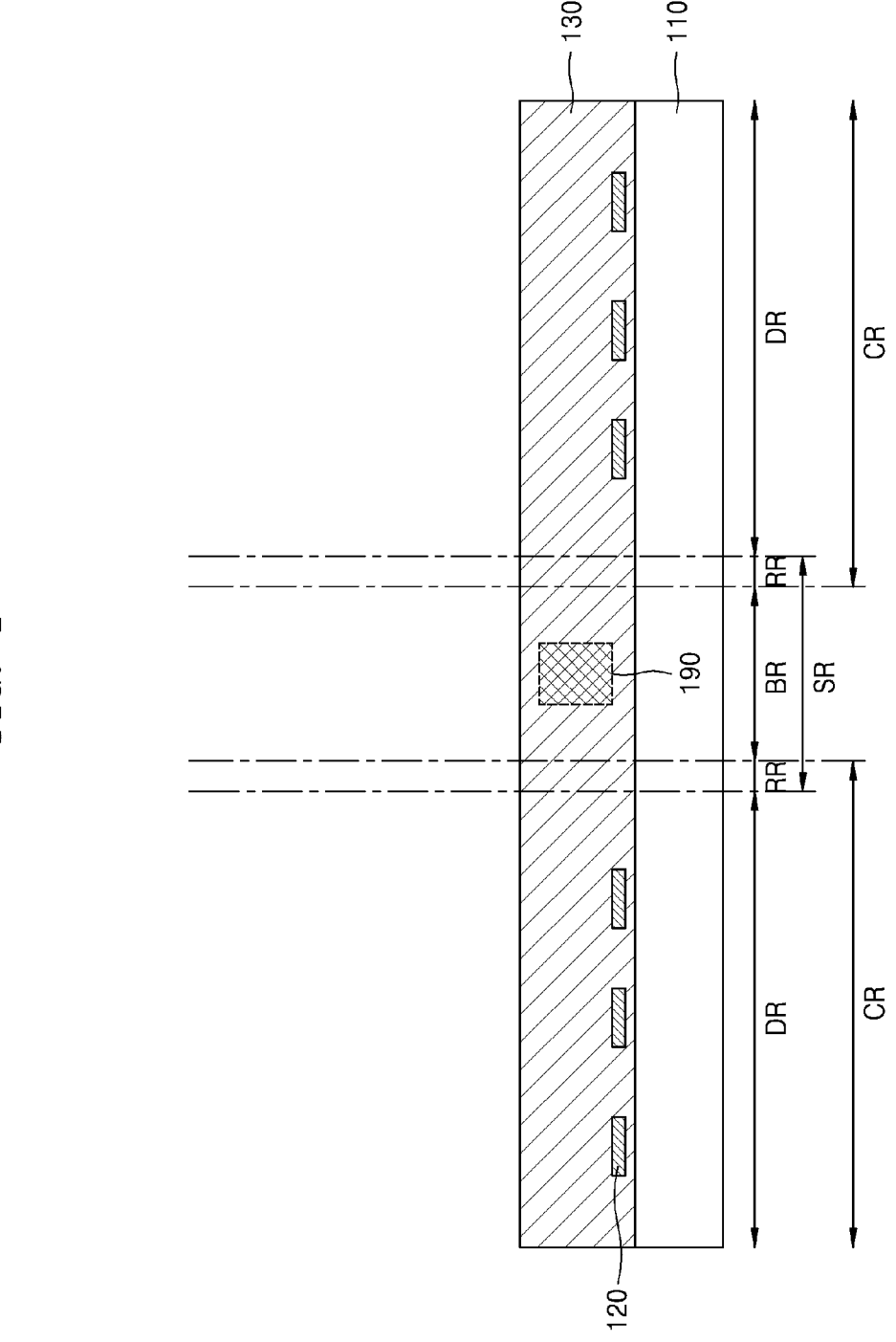

Referring to FIG. 1, a device layer 130 including a plurality of semiconductor devices 120 is formed on a substrate 110. The substrate 110 may include a device region DR, in which the semiconductor devices 120 are arranged, and a scribe lane region SR. The scribe lane region SR may surround each of a plurality of device regions DR in a plan view. Although only two device regions DR and one scribe lane region SR between two device regions DR are illustrated in FIG. 1, the substrate 110 may include a plurality of device regions DR in a matrix and a scribe lane region SR arranged between adjacent device regions DR to surround each of the device regions DR in a plan view. The scribe region SR may be a region that may be removed from a wafer in which the device regions DR formed while maintaining operability of devices (e.g., integrated circuit devices) formed within the device regions DR. The scribe region SR between the device regions DR may comprise areas of the wafer in which no circuits (e.g., no transistors) are formed and/or no circuits (e.g., no transistors) are formed that are part of the integrated circuits of the integrated circuit devices within the device regions DR.

The scribe lane region SR may include a cutting region BR and a remaining scribe region RR. In the scribe lane region SR, the remaining scribe region RR may be a portion contacting a device region DR and the cutting region BR may be a portion separated from the device region DR with the remaining scribe region RR between the cutting region BR and the device region DR To obtain a semiconductor chip 1 in FIGS. 8A and 8B by separating the device region DR including a plurality of semiconductor devices 120, a dicing process may be performed such that the substrate 110 is cut along the scribe lane region SR, in which the semiconductor devices 120 are not arranged. During the dicing process, the cutting region BR is removed and the remaining scribe region RR may remain around the device region DR. Accordingly, the device region DR and the remaining scribe region RR, which remains around the device region DR in contact with the device region DR, may form a singulated semiconductor chip and may thus be together referred to as a chip region CR.

The cutting region BR and the remaining scribe region RR, which are included in the scribe lane region SR, are defined as a result of a dicing process and may thus not be clearly defined before the dicing process is performed. However, since the scribe lane region SR is formed to have a greater area than the cutting region BR to prevent the device region DR from being damaged during the dicing process, the semiconductor chip 1 that has singulated includes the device region DR and the remaining scribe region RR, i.e., a portion of the scribe lane region SR contacting the device region DR along the edge of the device region DR.

The substrate 110 may include, for example, silicon (Si). The substrate 110 may include a semiconductor element, e.g., germanium (Ge), or a compound semiconductor such as silicon carbide (SiC), gallium arsenide (GaAs), indium arsenide (InAs), or indium phosphide (InP). The substrate 110 may have a silicon-on-insulator (SOI) structure. For example, the substrate 110 may include a buried oxide (BOX) layer. The substrate 110 may include a conductive region, e.g., an impurity-doped well or an impurity-doped structure. The substrate 110 may have various isolation structures including a shallow trench isolation (STI) structure. The substrate 110 may have an active side and an inactive side opposite to the active side. The device layer 130 including the semiconductor devices 120 may be formed in the active side of the substrate 110. For example, the active side may be a main surface of the substrate 110 on which circuits and the semiconductor devices 120 are formed, and the inactive side may be a bottom surface of the substrate 110 which is opposite to the main surface of the substrate 110.

At least some of the semiconductor devices 120 may be transistors. For example, at least some of the semiconductor devices 120 may be bipolar junction transistors (BJTs) or field effect transistors (FETs). For example, at least some of the semiconductor devices 120 may be planar transistors or FinFETs. When at least some of the semiconductor devices 120 are FinFETs, a plurality of fin-type active regions may protrude from the substrate 110 and extend in a horizontal direction in parallel with each other.

The semiconductor devices 120 may form a logic cell. The logic cell may include a plurality of circuit elements, such as a transistor and a register, in various manners. The logic cell may constitute, for example, an AND gate, a NAND gate, an OR gate, a NOR gate, an exclusive OR (XOR) gate, an exclusive NOR (XNOR) gate, an inverter (INV), an adder (ADD), a buffer (BUF), a delay (DLY), a filter (FIL), a multiplexer (MXT/MXIT), an OR/AND/inverter (OAI) gate, an AND/OR (AO) gate, an AND/OR/inverter (AOI) gate, a D flip-flop, a reset flip-flop, a master-slaver flip-flop, or a latch. The logic cell may constitute a standard cell, such as a counter or a buffer, which performs a desired logical function.

The semiconductor devices 120 may include, for example, various kinds of individual devices for constituting a central processing unit (CPU), a graphics processing unit (GPU), an application processor (AP), a dynamic random access memory (DRAM) device, a static RAM (SRAM) device, a flash memory device, an electrically erasable and programmable read-only memory (EEPROM) device, a phase-change RAM (PRAM) device, a magnetic RAM (MRAM) device, or a resistive RAM (RRAM) device.

The device layer 130 may include the semiconductor devices 120, a conductive line and a conductive plug that electrically connect the semiconductor devices 120, and an interlayer dielectric layer between conductive plugs and may include various kinds and shapes of conductive materials, semiconductor materials, and insulating materials. In some embodiments, the interlayer dielectric layer disposed between the conductive line and the conductive plugs may include oxide.

An auxiliary structure 190 may be arranged in the scribe lane region SR. The auxiliary structure 190 is irrelevant to the operation of the semiconductor devices 120 and may include any structure that is auxiliarily used during the manufacture of the semiconductor devices 120 or is used to evaluate the electrical characteristics and/or physical characteristics of the semiconductor devices 120. The auxiliary structure 190 may include, for example, a test element group (TEG) or an alignment key. Although it is illustrated that the auxiliary structure 190 is arranged in the device layer 130, it is just an example and the auxiliary structure 190 may be formed in the substrate 110, the device layer 130, or a portion at a higher level than the device layer 130 in a vertical direction from the substrate 110 illustrated in FIGS. 2 through 7, in the scribe lane region SR.

In the specification, the term "level" refers to a height from a main surface, e.g., a top surface, of the substrate 110 in the vertical direction. For example, "being at the same level" or "being at a certain level" refers to "having the same height from the main surface of the substrate 110 in the vertical direction" or "being at a certain position having a certain distance from the main surface of the substrate 110 in the vertical direction", and "being at a low/high level" refers to "being at a low/high position with respect to the main surface of the substrate 110 in the vertical direction". For example, the height/level may be a distance from the top surface of the substrate 110 in a perpendicular direction with respect to the top surface of the substrate 110.

Figure 2:
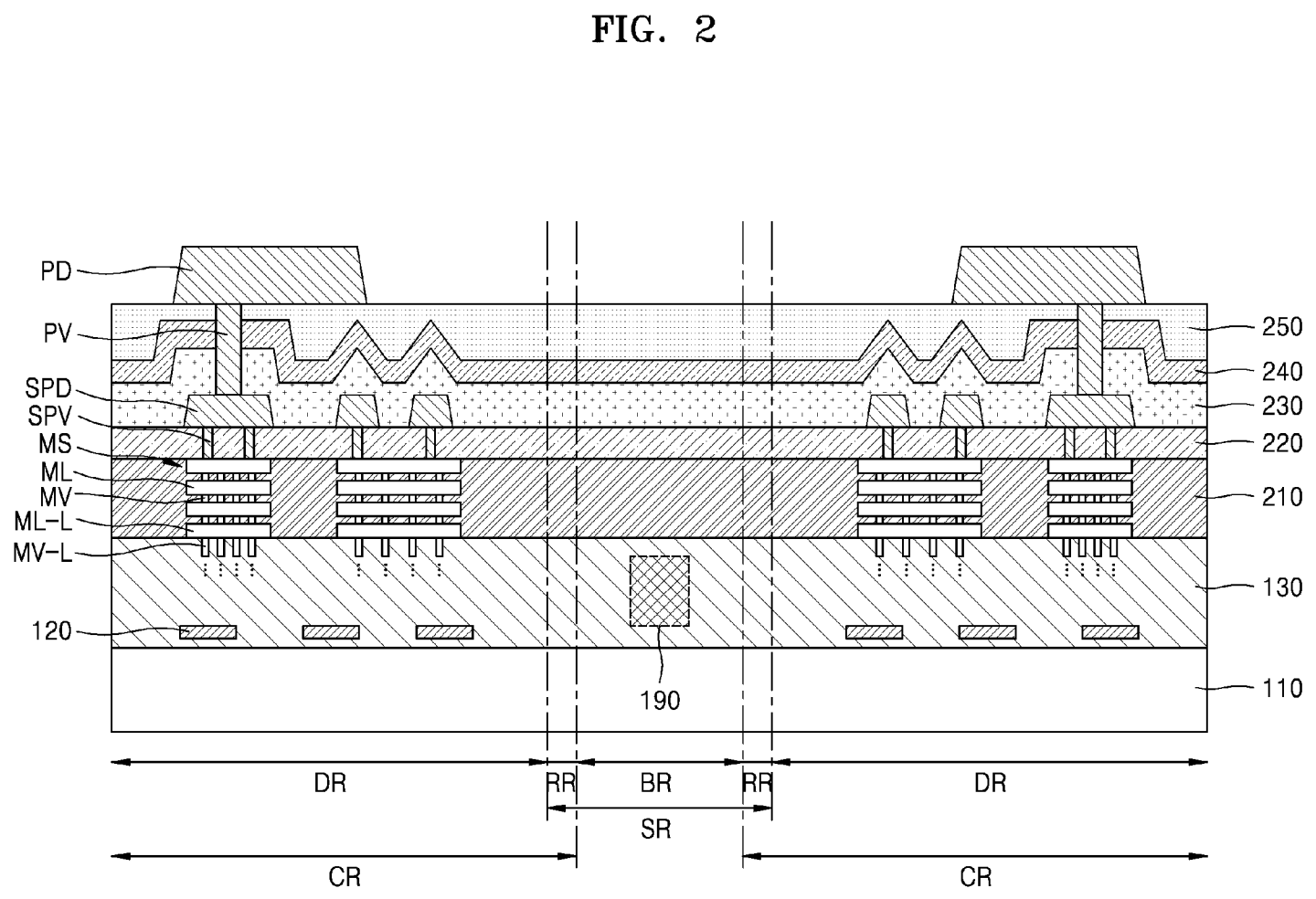

Referring to FIG. 2, a wiring structure MS and a first inter-wiring dielectric layer 210 surrounding the wiring structure MS are formed on the substrate 110 having the device layer 130. The first inter-wiring dielectric layer 210 may include an insulating material that has a lower permittivity than silicon oxide. In some embodiments, the first inter-wiring dielectric layer 210 may include an ultra low-k (ULK) film that has an ultra low dielectric constant of about 2.2 to about 2.4. The ULK film may include an SiOC film or an SiCOH film. The first inter-wiring dielectric layer 210 may be referred to as a low-k dielectric layer. In some embodiments, the level of a top surface of the first inter-wiring dielectric layer 210 may be substantially constant. For example, the top surface of the first inter-wiring dielectric layer 210 may be flat.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The wiring structure MS may include a plurality of wiring layers ML and a plurality of via plugs MV electrically/directly connected to the wiring layers ML. The wiring structure MS may include, for example, a metal such as aluminum, copper, or tungsten. In some embodiments, the wiring structure MS may include a wiring barrier layer and a wiring metal layer. The wiring barrier layer may include a nitride or an oxide of a metal, such as Ti, Ta, Ru, Mn, Co, or W, or an alloy such as cobalt tungsten phosphide (CoWP), cobalt tungsten boron (CoWB), or cobalt tungsten boron phosphide (CoWBP). The wiring metal layer may include at least one metal selected from W, Al, Ti, Ta, Ru, Mn, and Cu.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). The term "contact," as used herein, refers to a direct connection (i.e., touching) unless the context indicates otherwise.

The wiring layers ML may have a multilayer structure that has the wiring layers ML at different levels. The first inter-wiring dielectric layer 210 may have a multilayer structure, in which a plurality of low-k dielectric layers are stacked, in correspondence to the multilayer structure of the wiring layers ML. In some embodiments, the first inter-wiring dielectric layer 210 may have a multilayer structure, in which an insulating material having a lower permittivity than silicon oxide and another insulating material having a permittivity that is equal to or greater than that of silicon oxide are stacked. For example, the multilayer structure of the first inter-wiring dielectric layer 210 may include at least one oxide or nitride layer. For example, the first inter-wiring dielectric layer 210 may include an etch stop layer, which includes nitride used in a process of forming the wiring layers ML, but a proportion of the etch stop layer including nitride in the first inter-wiring dielectric layer 210 may be relatively very low. For example, the total thickness of the etch stop layer may be less than one tenth of the total thickness of the first inter-wiring dielectric layer 210. In certain embodiments, the layers having a lower permittivity and the layers having a higher permittivity than silicon oxide may be alternately stacked in the first inter-wiring dielectric layer 210.

In some embodiments, a bottom surface of a lower wiring layer ML-L that is at the lowest level among the wiring layers ML may be at the same level as a bottom surface of the first inter-wiring dielectric layer 210.

Although it is illustrated in FIG. 2 that a top surface of a wiring layer ML that is at the highest level among the wiring layers ML is at the same level as the top surface of the first inter-wiring dielectric layer 210, embodiments are not limited thereto. In some embodiments, a bottom surface of the wiring layer ML that is at the highest level among the wiring layers ML may be at the same level as the top surface of the first inter-wiring dielectric layer 210.

A lower via plug MV-L that is at the lowest level among the via plugs MV may extend from the bottom surface of the lower wiring layer ML-L toward the device layer 130. The wiring structure MS may be electrically connected to the semiconductor devices 120. The via plugs MV may extend from the bottom surface of each of the wiring layers ML, which are at different levels in a multilayer structure of the wiring layers ML, toward the substrate 110.

Some of the via plugs MV may electrically/directly connect the wiring layers ML at different levels to each other, and others of the via plugs MV may electrically connect some of the wiring layers ML to the semiconductor devices 120. For example, the lower via plug MV-L may electrically connect the lower wiring layer ML-L to the semiconductor devices 120.

A second inter-wiring dielectric layer 220 and a sub pad via SPV are formed on the wiring structure MS and the first inter-wiring dielectric layer 210. The sub pad via SPV passes through the second inter-wiring dielectric layer 220 and is electrically connected to the wiring structure MS. A sub pad SPD is formed on the second inter-wiring dielectric layer 220 to be electrically connected to the sub pad via SPV.

In some embodiments, the sub pad via SPV and the sub pad SPD may include a barrier layer and a metal layer. The barrier layer may include a nitride or an oxide of a metal, such as Ti, Ta, Ru, Mn, Co, or W, or an alloy such as CoWP, CoWB, or CoWBP. The metal layer may include at least one metal selected from W, Al, Ti, Ta, Ru, Mn, and Cu.

The second inter-wiring dielectric layer 220 may include an oxide layer, a carbide layer, a polymer, or a combination thereof. For example, the second inter-wiring dielectric layer 220 may include oxide. In some embodiments, the second inter-wiring dielectric layer 220 may include tetraethyl orthosilicate (TEOS). In some embodiments, the level of a top surface of the second inter-wiring dielectric layer 220 may be substantially constant. For example, the top surface of the second inter-wiring dielectric layer 220 may be flat.

A third inter-wiring dielectric layer 230, a protective dielectric layer 240, and a fourth inter-wiring dielectric layer 250 are sequentially formed on the sub pad SPD and the second inter-wiring dielectric layer 220. The third inter-wiring dielectric layer 230, the protective dielectric layer 240, and the fourth inter-wiring dielectric layer 250 may include an oxide layer, a carbide layer, a polymer, or a combination thereof.

For example, the third inter-wiring dielectric layer 230 may include oxide. In some embodiments, the third inter-wiring dielectric layer 230 may include high-density plasma (HDP) oxide. For example, the third inter-wiring dielectric layer 230 may include an oxide layer (e.g., a silicon dioxide layer), and the oxide layer may be formed by a high-density plasma deposition process. In some embodiments, the level of a top surface of the third inter-wiring dielectric layer 230 may change with a step according to the level of the top surfaces of the sub pad SPD and the second inter-wiring dielectric layer 220. For example, the sub pad SPD may protrude from the top surface of the second inter-wiring dielectric layer 220, and the third inter-wiring dielectric layer 230 may uneven top surface corresponding to top surfaces of the sub pad SPD and the second inter-wiring dielectric layer 220.

For example, the protective dielectric layer 240 may include nitride. The protective dielectric layer 240 may conformally cover the third inter-wiring dielectric layer 230. In some embodiments, the protective dielectric layer 240 may change with a step according to the level of the top surface of the third inter-wiring dielectric layer 230.

For example, the fourth inter-wiring dielectric layer 250 may include oxide. In some embodiments, the fourth inter-wiring dielectric layer 250 may include TEOS. In some embodiments, the level of a top surface of the fourth inter-wiring dielectric layer 250 may be substantially constant. For example, the top surface of the fourth inter-wiring dielectric layer 250 may be flat.

A pad via PV, which passes through the third inter-wiring dielectric layer 230, the protective dielectric layer 240, and the fourth inter-wiring dielectric layer 250, and a pad pattern PD, which is electrically connected to the pad via PV and arranged on the fourth inter-wiring dielectric layer 250, are formed. In some embodiments, the pad via PV and the pad pattern PD may include a barrier layer and a metal layer. The barrier layer may include a nitride or an oxide of a metal, such as Ti, Ta, Ru, Mn, Co, or W, or an alloy such as CoWP, CoWB, or CoWBP. The metal layer may include at least one metal selected from W, Al, Ti, Ta, Ru, Mn, and Cu. The pad via PV may electrically connect the sub pad SPD to the pad pattern PD. The pad pattern PD may include a redistribution pattern and a chip pad connected to the redistribution pattern. For example, the pad pattern PD may be electrically connected to the redistribution pattern and the chip pad. For example, the pad pattern PD may be directly/integrally connected to the redistribution pattern (e.g., the pad pattern PD and redistribution pattern may be a pattern of the same metal layer).

The second inter-wiring dielectric layer 220, the third inter-wiring dielectric layer 230, the protective dielectric layer 240, and the fourth inter-wiring dielectric layer 250 may include a material having a greater permittivity than the first inter-wiring dielectric layer 210. For example, each of the second inter-wiring dielectric layer 220, the third inter-wiring dielectric layer 230, the protective dielectric layer 240, and the fourth inter-wiring dielectric layer 250 may include an insulating material having a permittivity that is equal to or higher than a permittivity of silicon oxide.

Figure 3:
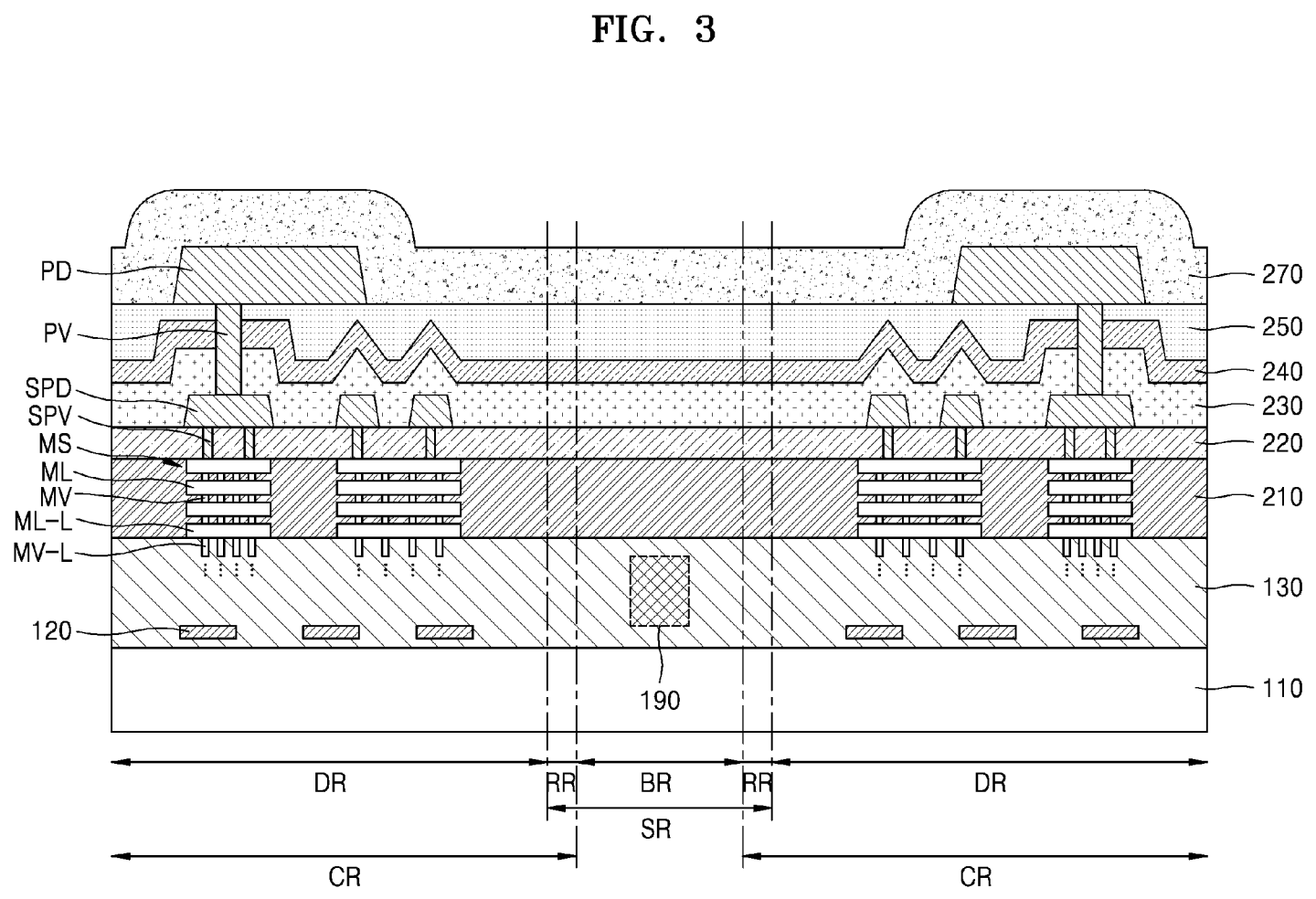

Referring to FIG. 3, a hardmask layer 270 covering the fourth inter-wiring dielectric layer 250 and the pad pattern PD is formed. In some embodiments, the hardmask layer 270 may include a carbon-based layer. For example, the carbon-based layer may include an amorphous carbon layer (ACL) or a carbon-based spin-on hardmask (C-SOH) layer. FIG. 3 illustrates a cross section of a wafer in which completed semiconductor devices are integrally formed in each of the device regions DR. Although only two device regions DR are shown, it will be appreciated that device regions DR may be formed in rows and columns within the wafer (in a two dimensional array with respect to top down view of the wafer). The device regions DR may be separated from each other by scribe lane regions SR (e.g., forming a grid in which the cells of the grid correspond to the device regions DR).

Figure 4:
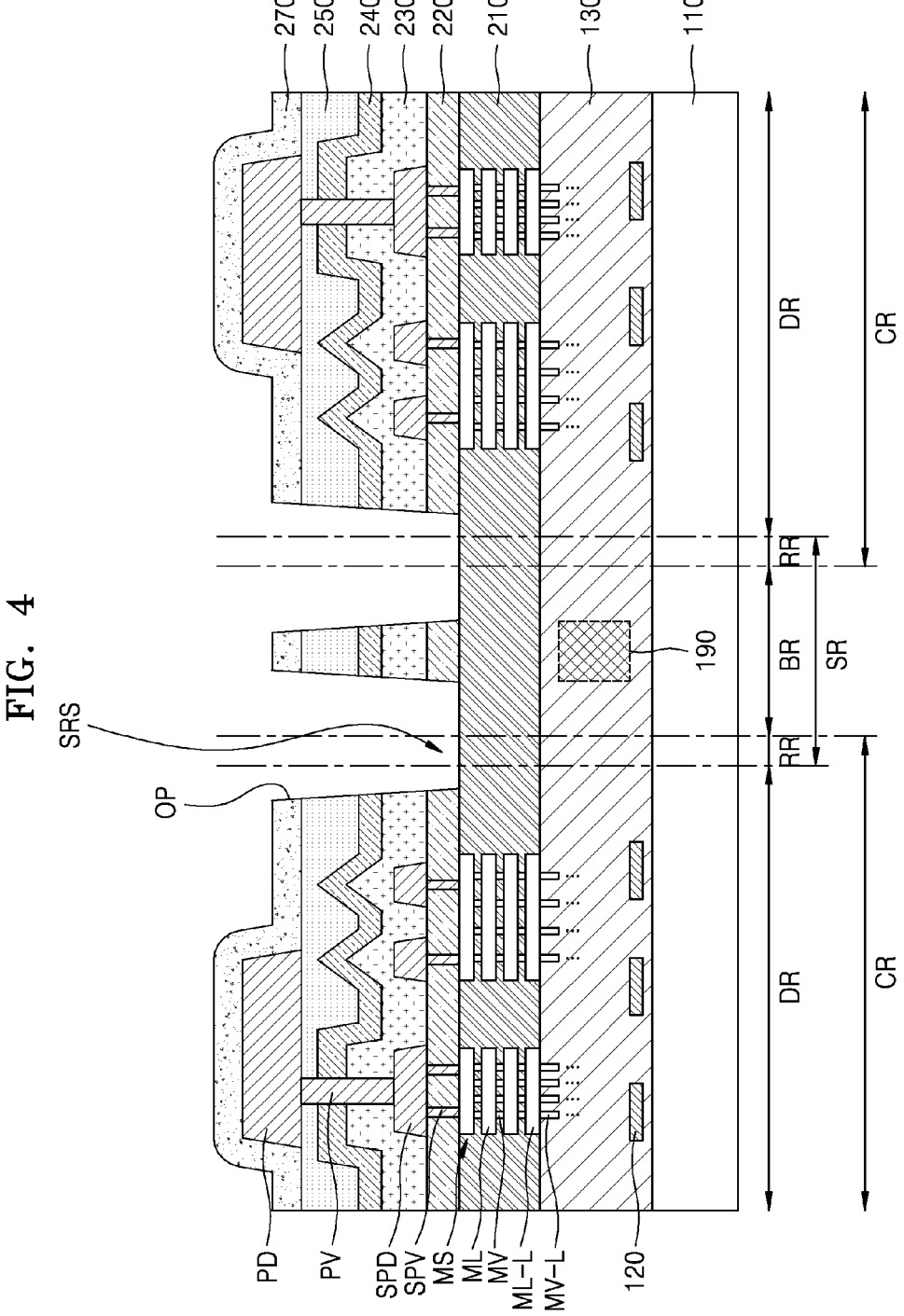

Referring to FIG. 4, the hardmask layer 270 is partially removed to form an opening OP that exposes the fourth inter-wiring dielectric layer 250 in the scribe lane region SR. In some embodiments, a portion of the fourth inter-wiring dielectric layer 250 in the scribe lane region SR and a portion of the fourth inter-wiring dielectric layer 250 in a portion of the device region DR adjacent to the scribe lane region SR may be exposed through the opening OP. For example, the portion of the device region DR, in which the portion of the fourth inter-wiring dielectric layer 250 is exposed through the opening OP, may have a width of about 5 μm or less from the scribe lane region SR.

Thereafter, the fourth inter-wiring dielectric layer 250, the protective dielectric layer 240, the third inter-wiring dielectric layer 230, and the second inter-wiring dielectric layer 220 are partially removed using the hardmask layer 270 as an etch mask so that an isolation recess SRS exposing the first inter-wiring dielectric layer 210 is formed.

For example, the fourth inter-wiring dielectric layer 250, the protective dielectric layer 240, the third inter-wiring dielectric layer 230, and the second inter-wiring dielectric layer 220 may be partially removed using an etching/ashing process.

Figure 5:
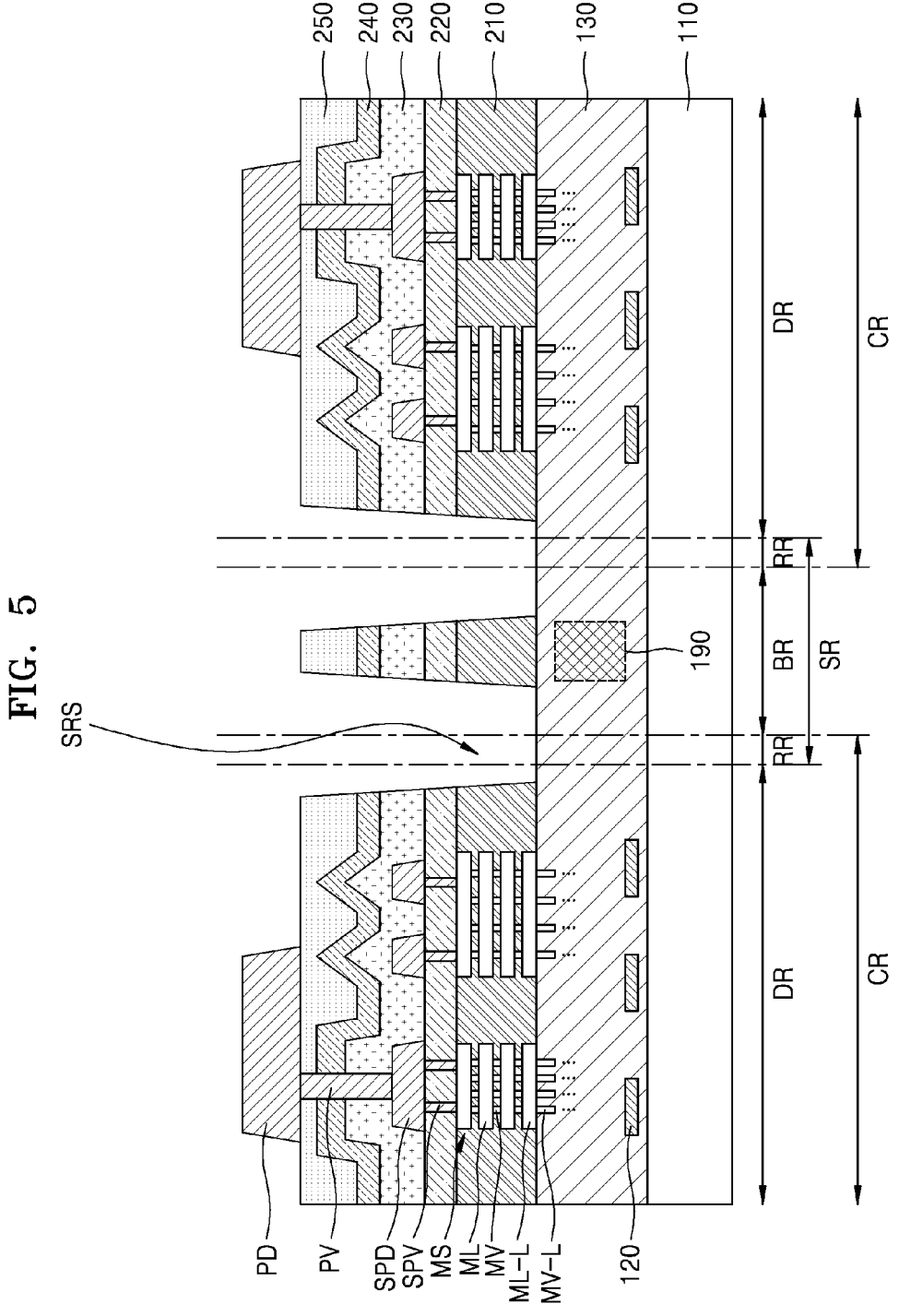

Referring to FIG. 5, a portion of the first inter-wiring dielectric layer 210, which is exposed in a bottom surface of the isolation recess SRS, is removed to expose the device layer 130. The portion of the first inter-wiring dielectric layer 210 is removed such that the isolation recess SRS may extend into/inside the first inter-wiring dielectric layer 210 and expose the device layer 130 in the bottom surface thereof. The bottom surface of the isolation recess SRS may be at the same level as the top surface of the device layer 130.

The portion of the first inter-wiring dielectric layer 210 may be removed using a dry etching process such as sputtering or reactive ion etching (RIE).

In some embodiments, a side surface of each of the fourth inter-wiring dielectric layer 250, the protective dielectric layer 240, the third inter-wiring dielectric layer 230, and the second inter-wiring dielectric layer 220, and the first inter-wiring dielectric layer 210, which are exposed in the isolation recess SRS, may be substantially smooth. For example, the isolation recess SRS may be formed on side surfaces of the first, second, third and fourth inter-wiring dielectric layers 210, 220, 230 and 250, on the side surface of the protective dielectric layer 240, and on the top surface of the device layer 130. For example, a cross-sectional view of side walls of the isolation recess SRS may be linear as shown in FIG. 5.

After the portion of the first inter-wiring dielectric layer 210 is removed, the hardmask layer 270 (in FIG. 4) that has remained may be removed.

Figure 6:
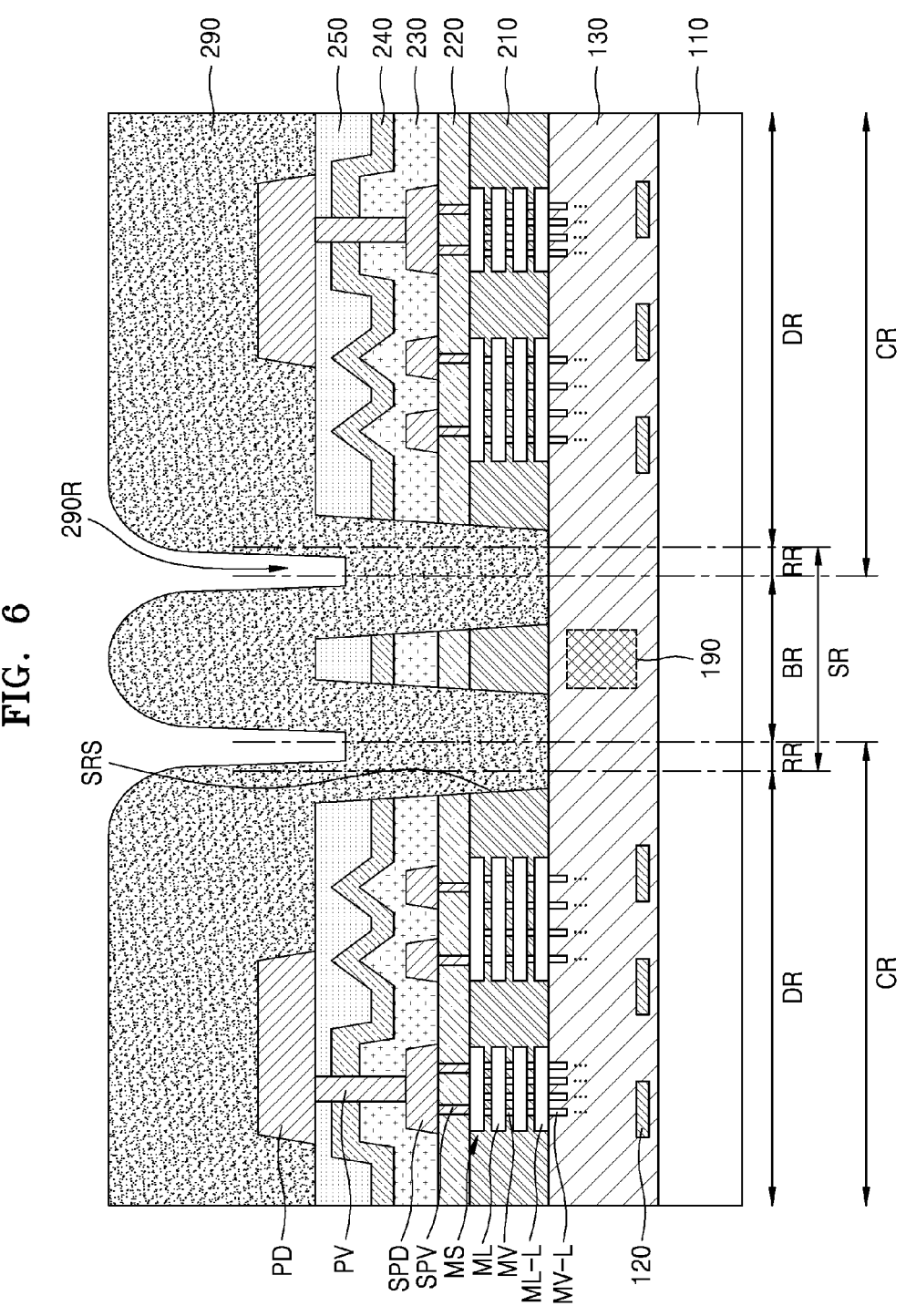

Referring to FIG. 6, an upper cover dielectric layer 290 is formed to fill at least a portion of the isolation recess SRS and to cover the fourth inter-wiring dielectric layer 250 and the pad pattern PD. The upper cover dielectric layer 290 may include a single layer including one kind of an insulating layer, a double layer including two kinds of insulating layers, or a multiple layer including a combination of at least three kinds of insulating layers. For example, the upper cover dielectric layer 290 may include oxide. In some embodiments, the upper cover dielectric layer 290 may include TEOS. For example, the upper cover dielectric layer 290 may include oxide, nitride, or a combination thereof. In some embodiments, the upper cover dielectric layer 290 may include a HDP oxide layer, a TEOS layer, a silicon nitride layer, or a combination thereof. In some embodiments, the upper cover dielectric layer 290 may have a multiple layer in which a layer formed of HDP, a layer formed of TEOS, and a layer formed of silicon nitride are sequentially stacked. In some embodiments, the upper cover dielectric layer 290 may have a multiple layer in which a layer formed of TEOS, a layer formed of HDP, and a layer formed of silicon nitride are sequentially stacked. In some embodiments, the upper cover dielectric layer 290 may have a multiple layer in which a layer formed of HDP, a layer formed of silicon nitride, and a layer formed of TEOS are sequentially stacked. The upper cover dielectric layer 290 may include a material having a greater permittivity than the first inter-wiring dielectric layer 210. The upper cover dielectric layer 290 may cover both an inner surface and the bottom surface of the isolation recess SRS. In some embodiments, the lowest level of a top surface of the upper cover dielectric layer 290 may be higher than the level of the top surface of the first inter-wiring dielectric layer 210. For example, the upper cover dielectric layer 290 may fully fill the space of a portion of the isolation recess SRS formed in the first inter-wiring dielectric layer 210.

The upper cover dielectric layer 290 may include a recess portion 290R, in which the top surface of the upper cover dielectric layer 290 drops in correspondence to the isolation recess SRS. For example, the recess portion 290R may correspond to the isolation recess SRS.

Figure 7:
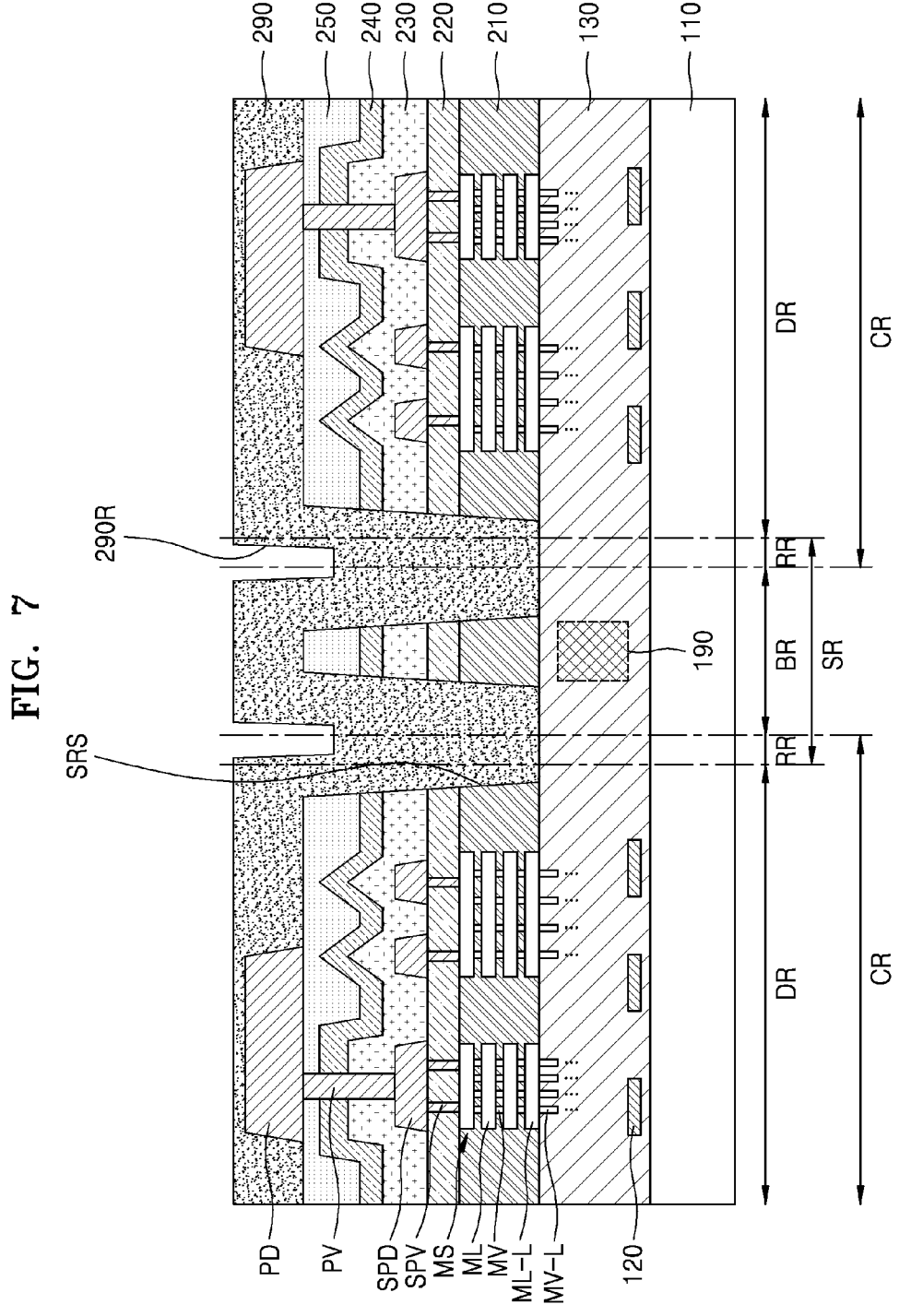
Figure 8A:
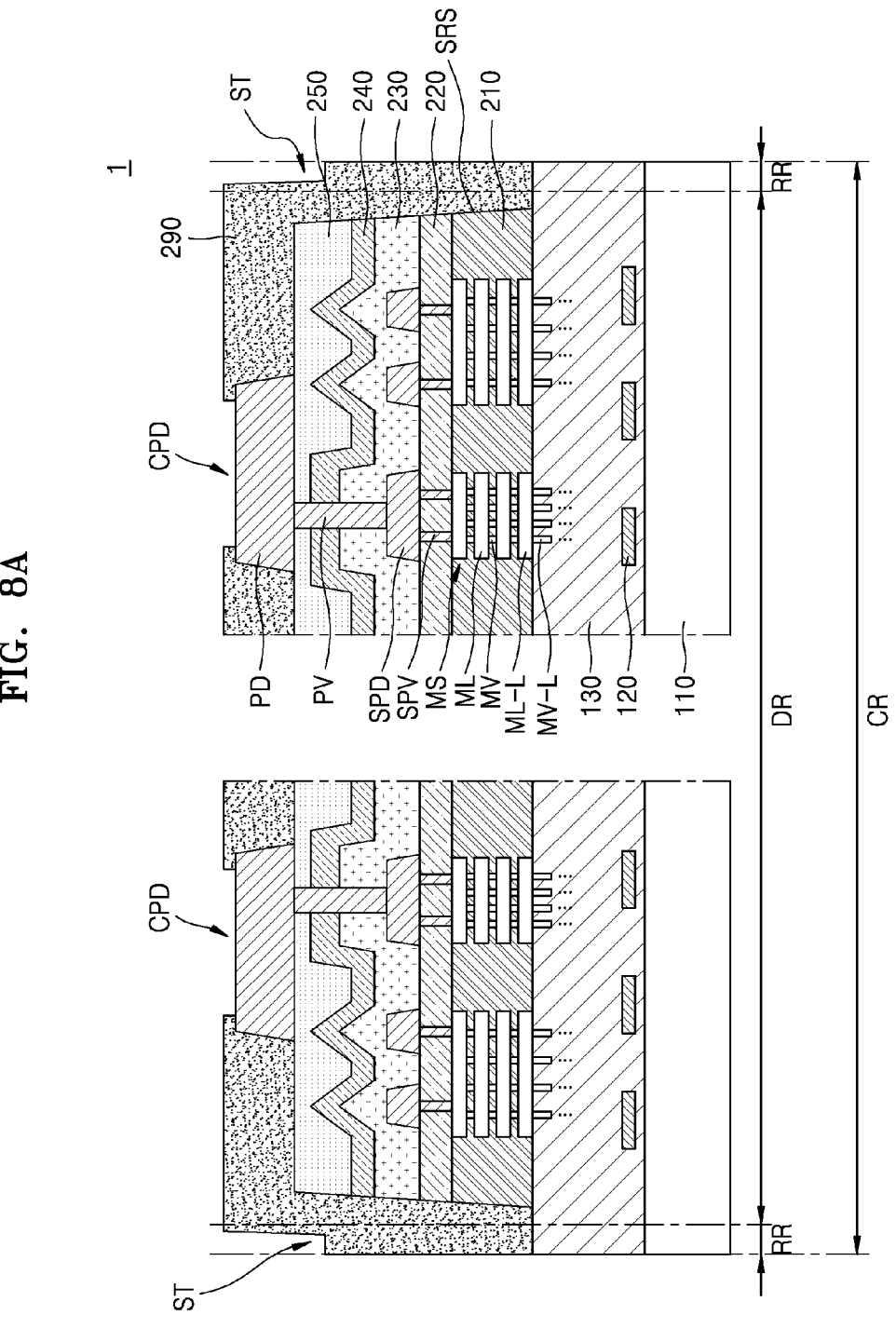
FIGS. 8A and 8B are respectively a cross-sectional view and a plan view that show main elements of a semiconductor chip, according to embodiments.
Figure 8B:
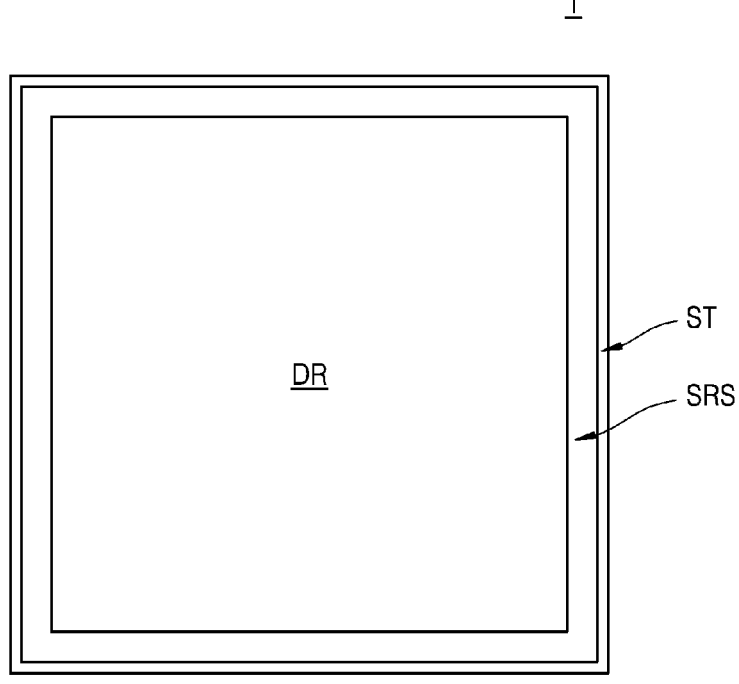

Referring to FIG. 7, an upper portion of the upper cover dielectric layer 290 is removed such that the level of the top surface of the upper cover dielectric layer 290 is substantially constant in the device region DR. For example, the top surface of the upper cover dielectric layer 290 may be flat in the device region DR. In some embodiments, the level of the top surface of the upper cover dielectric layer 290 may be lower in a portion of the remaining scribe region RR than in the device region DR. For example, when the upper portion of the upper cover dielectric layer 290 is removed, the upper cover dielectric layer 290 may include the recess portion 290R corresponding to the isolation recess SRS. For example, the upper portion of the upper cover dielectric layer 290 may be removed using a chemical mechanical polishing (CMP) process.

In some embodiments, a bottom surface of the recess portion 290R may be at a lower level than the top surface of the fourth inter-wiring dielectric layer 250.

Referring to FIGS. 7, 8A, and 8B, a portion of the upper cover dielectric layer 290 on the pad pattern PD is removed such that a chip pad portion CPD of the pad pattern PD may be exposed. At least a portion of the pad pattern PD covered with the upper cover dielectric layer 290 may be a redistribution pattern. For example, the chip pad portion CPD may be directly connected to or integrally formed with the redistribution pattern.

Thereafter, a dicing process is performed to cut the substrate 110 along the scribe lane region SR so that the semiconductor chip 1 is singulated. For example, the dicing process for obtaining the semiconductor chip 1 may be performed by sawing/cutting using a blade. A width of the cutting region BR in FIGS. 1 through 7 may be substantially the same as the kerf width of a blade used in the dicing process for obtaining the semiconductor chip 1. The kerf width of a blade may be less than the width of the scribe lane region SR (in FIGS. 1 through 7) defined between two adjacent device regions DR.

The semiconductor chip 1 includes the device layer 130 including the semiconductor devices 120 on the substrate 110. The substrate 110 may include the device region DR, in which the semiconductor devices 120 are arranged, and the remaining scribe region RR surrounding the device region DR along the edge of the semiconductor chip 1. The remaining scribe region RR may be the scribe lane region SR in the FIGS. 1 through 7, except for the cutting region BR removed by sawing/cutting using a blade.

The wiring structure MS and the first inter-wiring dielectric layer 210 surrounding the wiring structure MS are arranged on the substrate 110 having the device layer 130. The first inter-wiring dielectric layer 210 may include an insulating material having a lower permittivity than silicon oxide. The first inter-wiring dielectric layer 210 may be referred to as a low-k dielectric layer. In some embodiments, the level of the top surface of the first inter-wiring dielectric layer 210 may be substantially constant.

The wiring structure MS may include the wiring layers ML and the via plugs MV electrically connected to the wiring layers ML. The wiring structure MS may be electrically connected to the semiconductor devices 120. The wiring layers ML may have a multilayer structure that has the wiring layers ML at different levels. The via plugs MV may extend from the bottom surface of each of the wiring layers ML, which are at different levels in a multilayer structure of the wiring layers ML, toward the substrate 110. Some of the via plugs MV may electrically/directly connect the wiring layers ML at different levels to each other, and others of the via plugs MV may electrically/directly connect some of the wiring layers ML to the semiconductor devices 120.

In some embodiments, the bottom surface of the lower wiring layer ML-L that is at the lowest level among the wiring layers ML may be at the same level as the bottom surface of the first inter-wiring dielectric layer 210. The lower via plug MV-L that is at the lowest level among the via plugs MV may extend from the bottom surface of the lower wiring layer ML-L toward the device layer 130. For example, the lower via plug MV-L may electrically connect the lower wiring layer ML-L to the semiconductor devices 120.

The second inter-wiring dielectric layer 220 and the sub pad via SPV are arranged on the wiring structure MS and the first inter-wiring dielectric layer 210. The sub pad via SPV passes through the second inter-wiring dielectric layer 220 and is electrically connected to the wiring structure MS. The sub pad SPD is arranged on the second inter-wiring dielectric layer 220 to be electrically connected to the sub pad via SPV. In some embodiments, the level of the top surface of the second inter-wiring dielectric layer 220 may be substantially constant. In some embodiments, the sub pad via SPV and the sub pad SPD may be omitted.

The third inter-wiring dielectric layer 230, the protective dielectric layer 240, and the fourth inter-wiring dielectric layer 250 are sequentially stacked on the sub pad SPD and the second inter-wiring dielectric layer 220. In some embodiments, the level of the top surface of the third inter-wiring dielectric layer 230 may change with a step according to the level of the top surfaces of the sub pad SPD and the second inter-wiring dielectric layer 220. The protective dielectric layer 240 may conformally cover the third inter-wiring dielectric layer 230. In some embodiments, the level of the top surface of the protective dielectric layer 240 may change, e.g., including a step, according to the level of the top surface of the third inter-wiring dielectric layer 230. The protective dielectric layer 240 may function as a passivation layer protecting the semiconductor chip 1. In some embodiments, the level of the top surface of the fourth inter-wiring dielectric layer 250 may be substantially constant.

The pad pattern PD may be arranged on the fourth inter-wiring dielectric layer 250, and the pad via PV may pass through the third inter-wiring dielectric layer 230, the protective dielectric layer 240, and the fourth inter-wiring dielectric layer 250 to electrically connect the sub pad SPD to the pad pattern PD.

For convenience of description, the first inter-wiring dielectric layer 210 may be referred to as a lower inter-wiring dielectric layer 210, and the second inter-wiring dielectric layer 220, the third inter-wiring dielectric layer 230, the protective dielectric layer 240, and the fourth inter-wiring dielectric layer 250 may be collectively referred to as an upper inter-wiring dielectric layer. For example, the semiconductor chip 1 may include the substrate 110, the device layer 130 including the semiconductor devices 120 on the substrate 110, the wiring structure MS on the device layer 130, the lower inter-wiring dielectric layer 210 surrounding the wiring structure MS, the upper inter-wiring dielectric layer on the lower inter-wiring dielectric layer 210, the pad pattern PD including a chip pad on the upper inter-wiring dielectric layer, and the pad via PV electrically connecting the pad pattern PD to the wiring structure MS.

The upper cover dielectric layer 290 may cover a portion of the pad pattern PD and the fourth inter-wiring dielectric layer 250. A portion of the pad pattern PD that is not covered with the upper cover dielectric layer 290 may be the chip pad portion CPD, and the portion of the pad pattern PD that is covered with the upper cover dielectric layer 290 may be at least partially a redistribution pattern. For example, the pad pattern PD may include the chip pad portion CPD and the redistribution pattern.

The upper cover dielectric layer 290 may cover the side surfaces of the first inter-wiring dielectric layer 210, the second inter-wiring dielectric layer 220, the third inter-wiring dielectric layer 230, the protective dielectric layer 240, and the fourth inter-wiring dielectric layer 250 in the isolation recess SRS. The upper cover dielectric layer 290 may cover the top surface of the device layer 130 at the bottom surface of the isolation recess SRS. For example, the upper cover dielectric layer 290 may cover a top surface of an interlayer dielectric layer of the device layer 130.

The upper cover dielectric layer 290 may have a step portion ST in an edge of the semiconductor chip 1. For example, the step portion ST may be a stepped down area of the upper cover dielectric layer 290 from the highest flat surface of the upper cover dielectric layer 290. For example, the step portion ST may include a step formed in the upper cover dielectric layer 290. In certain embodiments, the step portion may refer to the step itself. In some embodiments, the step portion ST of the upper cover dielectric layer 290 may be formed in the remaining scribe region RR. In some embodiments, the step portion ST of the upper cover dielectric layer 290 may be formed across the remaining scribe region RR and a portion of the device region DR adjacent to the remaining scribe region RR. For example, the remaining scribe region RR may be an edge portion of the semiconductor chip 1. For example, semiconductor devices may not be disposed in the edge portion of the semiconductor chip 1. For example, the portion of the device region DR with which the step portion ST overlaps in a vertical direction may overlap a semiconductor device formed in the device region DR in the vertical direction.

The step portion ST may surround the device region DR along the edge of the semiconductor chip 1. For example, when the semiconductor chip 1 has four sides which form a rectangular shape in a plan view, the step portion ST may be arranged to surround the device region DR along the four sides of the semiconductor chip 1. In some embodiments, the step portion ST may extend along the four sides of the semiconductor chip 1 with a substantially uniform horizontal width. For example, the step portion ST may extend along the four sides of the semiconductor chip 1 with a horizontal width of about 5 μm or less. The isolation recess SRS may be arranged along the edge of the semiconductor chip 1. For example, the isolation recess SRS may extend along four sides of the semiconductor chip 1.

The edge or four sides of the semiconductor chip 1 may be referred to as the edge or four sides of the substrate 110.

The step portion ST, e.g., the top surface of the step portion ST, may be at a lower level than the top surface of the fourth inter-wiring dielectric layer 250. The step portion ST, e.g., the top surface of the step portion ST, may be at a higher level than the top surface of the first inter-wiring dielectric layer 210. The side surface of the upper cover dielectric layer 290 may extend below the step portion ST substantially in the vertical direction. For example, the side surface of the upper cover dielectric layer 290 may extend substantially in the vertical direction with respect to the main surface of the substrate 110 in a portion around the first inter-wiring dielectric layer 210, i.e., between the levels of the top and bottom surfaces of the first inter-wiring dielectric layer 210. In some embodiments, the side surface of the upper cover dielectric layer 290 may extend above the step portion ST at an acute angle with respect to the main surface of the substrate 110.

According to embodiments, the first inter-wiring dielectric layer 210, i.e., a low-k dielectric layer, is not chipped away by a blade during a dicing process for singulation of the semiconductor chip 1. For example, during the dicing process for obtaining the singulated semiconductor chip 1, cutting process using a blade may be performed through the upper cover dielectric layer 290, the device layer 130, and the substrate 110. Therefore, the blade may pass through the upper cover dielectric layer 290, the device layer 130 and the substrate 110, and may not touch the first inter-wiring electric layer 210 disposed in the device region DR of the semiconductor chip 1. Accordingly, chipping of a low-k dielectric layer that may occur when the low-k dielectric layer is cut using a blade may be prevented. For example, chipping defect of the low-k dielectric layer which occurs when the blade touches/goes through the low-k dielectric layer during the cutting process may be improved by the embodiments described above. Therefore, the side surface of the semiconductor chip 1 may be substantially smooth, and accordingly, when an adhesive film like a non-conductive film (NCF) is attached to the bottom surface of the substrate 110 of the semiconductor chip 1 and a dicing process is performed to singulate the semiconductor chip 1 or when an adhesive film like an NCF is attached to the top or bottom surface of the semiconductor chip 1 to stack a plurality of semiconductor chips 1, the adhesive film like an NCF may not be torn off at the edge of the semiconductor chip 1, which may be caused by chipping of a low-k dielectric layer and/or by chipped low-k dielectric layer.

Figure 9:
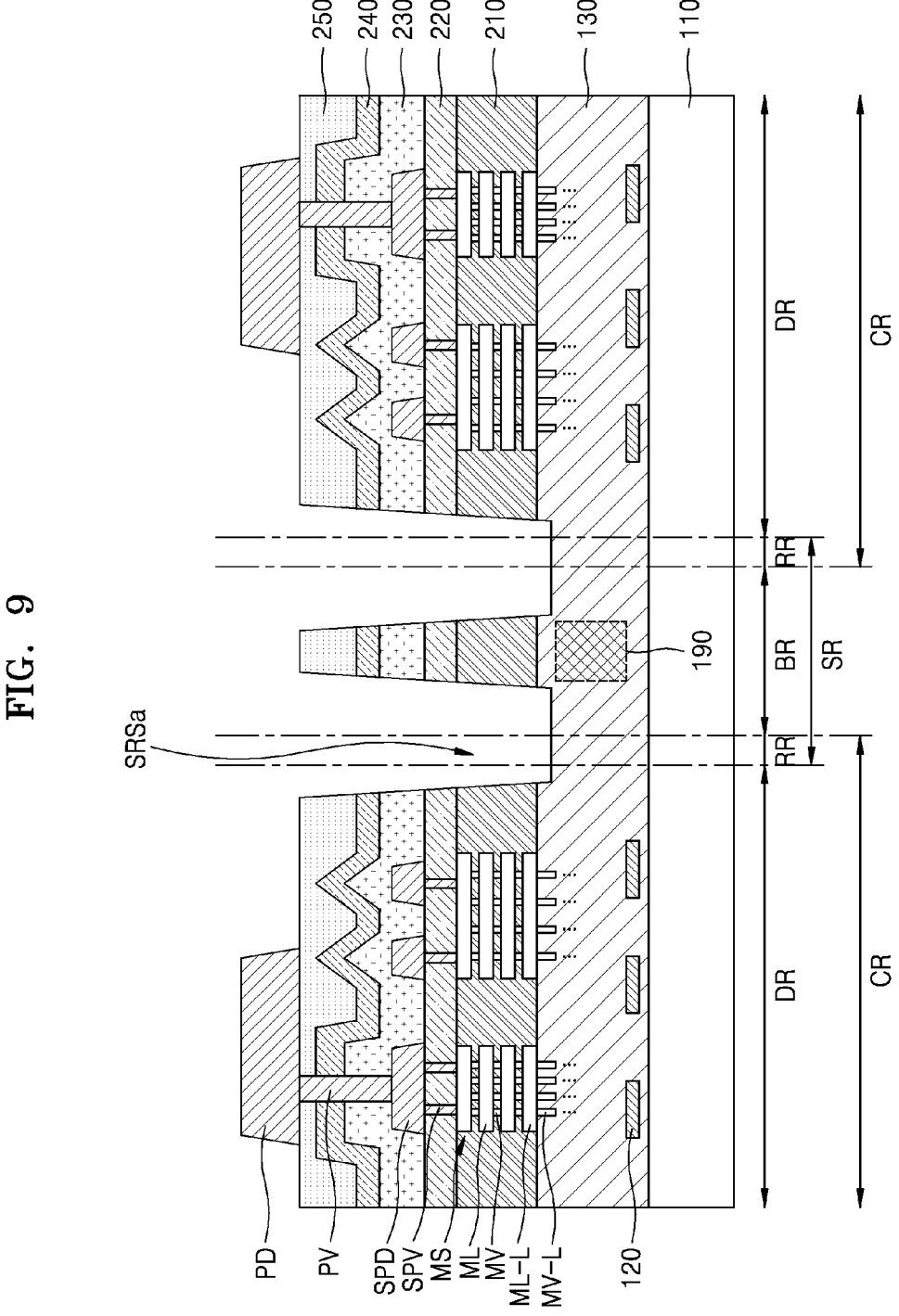
FIG. 9 is a cross-sectional view of a stage in a method of manufacturing a semiconductor chip, according to embodiments.
Figure 10:
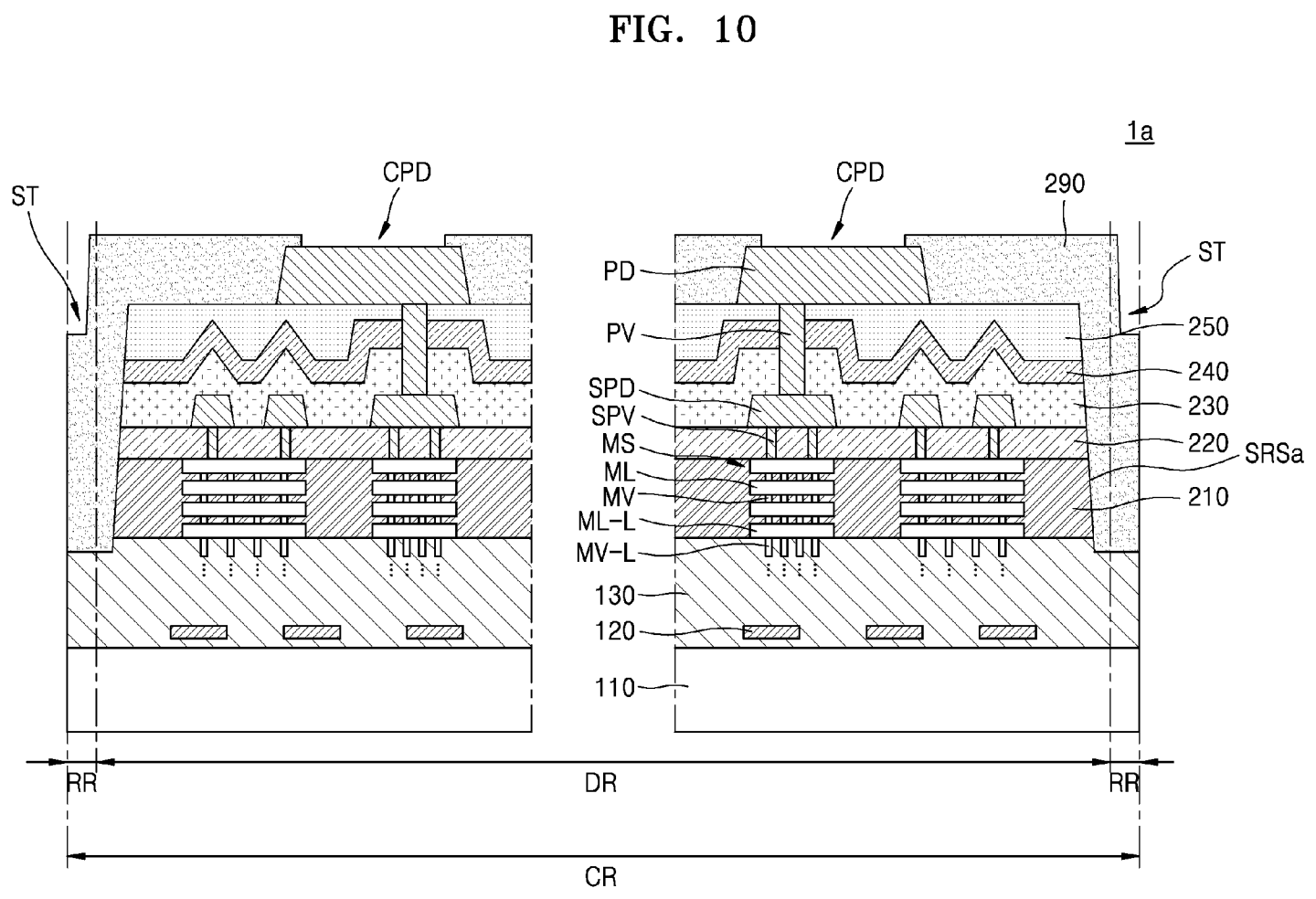

FIG. 9 is a cross-sectional view of a stage in a method of manufacturing a semiconductor chip, according to embodiments. FIG. 10 is a cross-sectional view showing main elements of a semiconductor chip, according to embodiments. FIG. 9 is the cross-sectional view of the stage following the stage of FIG. 4. Redundant descriptions similar to or the same as the ones already given with reference to FIGS. 1 through 8B may be omitted. In FIGS. 1 through 10, like reference numerals denote like elements.

Referring to FIG. 9, the device layer 130 may be partially removed in a process of partially removing the first inter-wiring dielectric layer 210 to expose the device layer 130 such that an isolation recess SRSa may pass through the first inter-wiring dielectric layer 210 and extend into the device layer 130. A bottom surface of the isolation recess SRSa may be at a lower level than a top end of the device layer 130.

Referring to FIG. 10, a semiconductor chip 1a is formed by performing the same processes as the ones described with reference to FIGS. 6 through 8B.

The semiconductor chip 1a includes the device layer 130 including the semiconductor devices 120 on the substrate 110. The substrate 110 may include the device region DR, in which the semiconductor devices 120 are arranged, and the remaining scribe region RR surrounding the device region DR along the edge of the semiconductor chip 1a.

The upper cover dielectric layer 290 may cover the side surfaces of the first inter-wiring dielectric layer 210, the second inter-wiring dielectric layer 220, the third inter-wiring dielectric layer 230, the protective dielectric layer 240, and the fourth inter-wiring dielectric layer 250 in the isolation recess SRSa and cover a side surface of an upper portion of the device layer 130. The upper cover dielectric layer 290 may extend into the device layer 130 such that the bottom surface of the upper cover dielectric layer 290 is at a lower level than the top end/surface of the device layer 130 in the isolation recess SRSa. The upper cover dielectric layer 290 may have a step portion ST in an edge of the semiconductor chip 1a.

Figure 16:
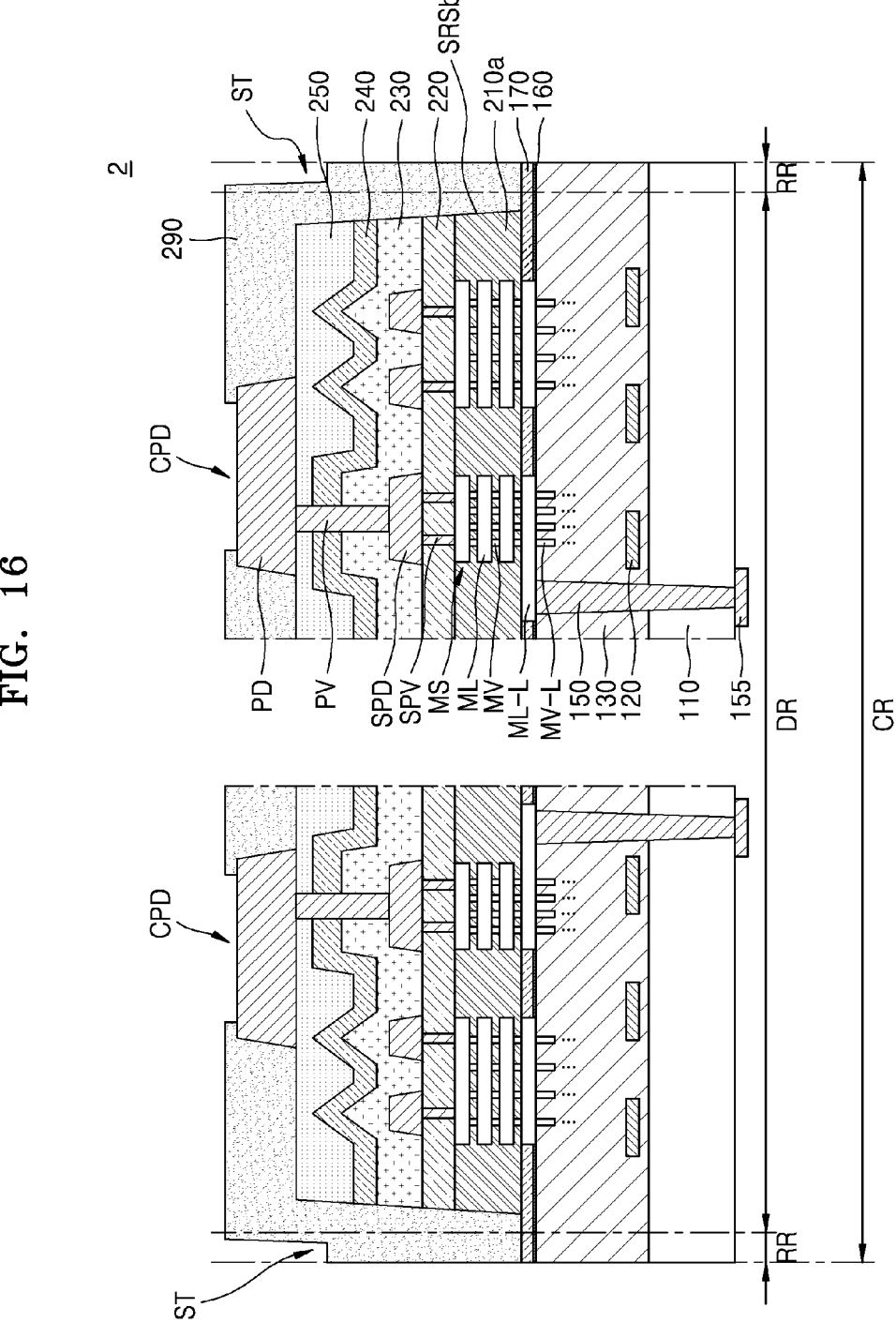
FIG. 16 is a cross-sectional view showing main elements of a semiconductor chip, according to embodiments.

FIGS. 11 through 15 are cross-sectional views of stages in a method of manufacturing a semiconductor chip, according to embodiments. FIG. 16 is a cross-sectional view showing main elements of a semiconductor chip, according to embodiments. FIG. 11 is the cross-sectional view of a stage following the stage of FIG. 1. Redundant descriptions similar to or the same as the ones already given with reference to FIGS. 1 through 8B may be omitted. In FIGS. 1 through 16, like reference numerals denote like elements.

Referring to FIG. 11, a through electrode 150 is formed to pass through the device layer 130 and extend into the substrate 110. Although the through electrode 150 extends from the top to the bottom of the substrate 110 passing through the substrate 110 in FIG. 11, this is just an example. The through electrode 150 may be formed to extend into the substrate 110 and back-grinding or back-lapping may be performed to partially remove a lower portion of the substrate 110 in a subsequent process, such that the through electrode 150 is exposed at the bottom of the substrate 110.

The through electrode 150 may include a conductive plug and a conductive barrier layer covering the surface of the conductive plug. For example, the conductive barrier layer may be disposed on the side surface of the conductive plug. For example, the conductive plug may include Cu or W. In some embodiments, the conductive plug may include Cu, CuSn, CuMg, CuNi, CuZn, CuPd, CuAu, CuRe, CuW, W, or an alloy of W but is not limited thereto. In some embodiments, the conductive barrier layer may include at least one material selected from Ti, TiN, Ta, TaN, Ru, Co, Mn, WN, Ni, and NiB. In some embodiments, a via dielectric layer may be arranged between the through electrode 150 and the device layer 130 and between the through electrode 150 and the substrate 110. For example, the via dielectric layer may include an oxide layer, a nitride layer, a carbide layer, a polymer, or a combination thereof.

In some embodiments, the conductive barrier layer and the conductive plug may be formed using physical vapor deposition (PVD) or chemical vapor deposition (CVD), but embodiments are not limited thereto. In some embodiments, the via dielectric layer may include a high-aspect-ratio process (HARP) oxide film formed using an ozone/tetra-ethyl-ortho-silicate ($O_3$/TEOS)-based sub-atmospheric CVD process.

Before or after the through electrode 150 is formed, the lower via plug MV-L may be formed to extend from the top surface of the device layer 130 into the device layer 130.

Figure 12:
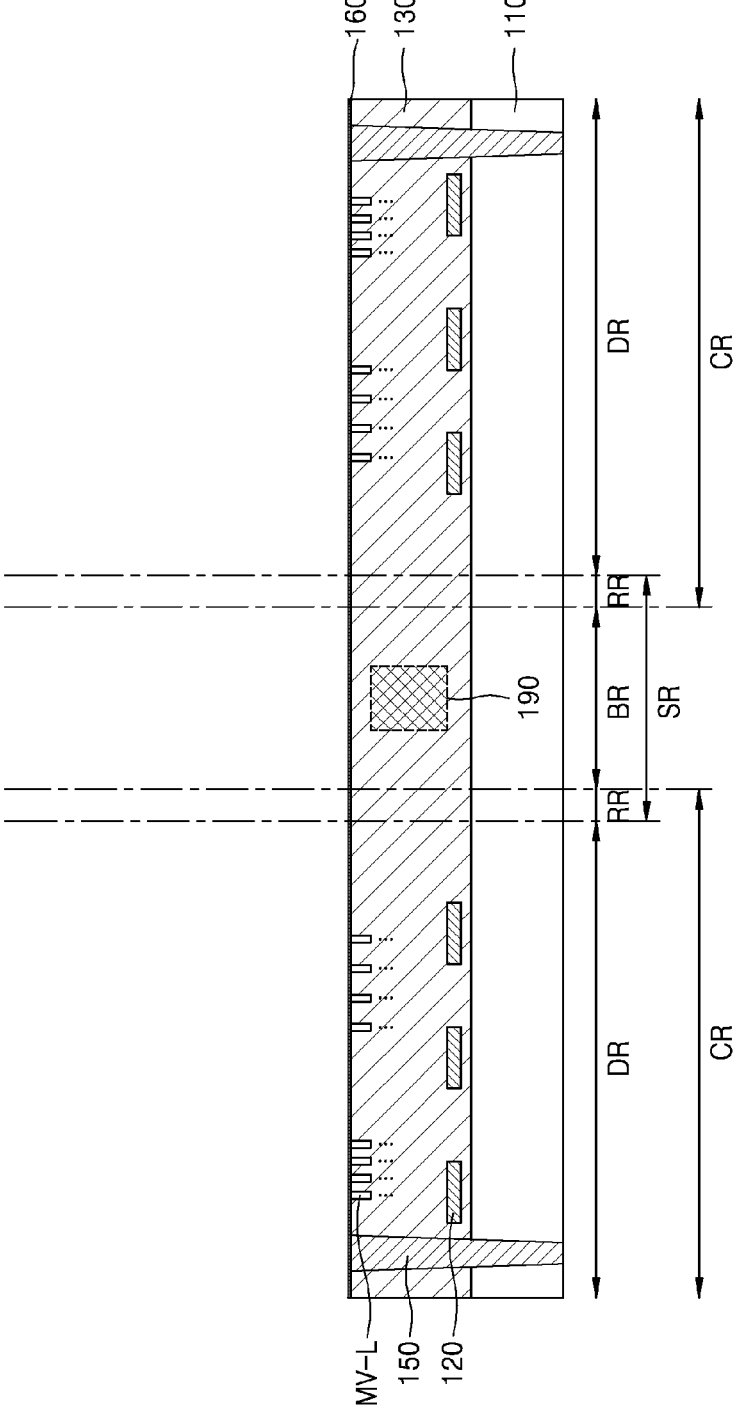

Referring to FIG. 12, a capping dielectric film 160 is formed to cover the device layer 130, the lower via plug MV-L, and the through electrode 150. The capping dielectric film 160 may include, for example, nitride.

Figure 13:
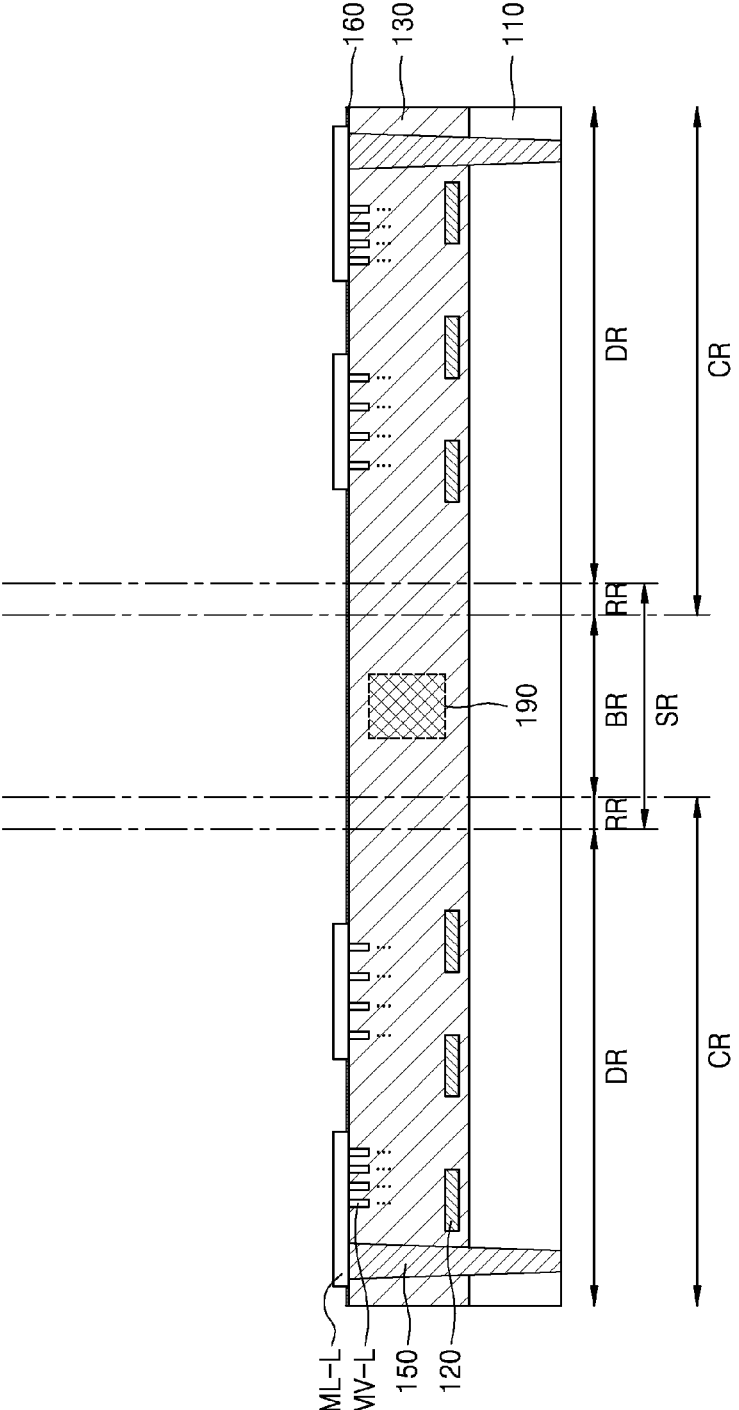

Referring to FIG. 13, the capping dielectric film 160 is partially removed to expose the lower via plug MV-L and at least portion of a top surface of the through electrode 150, and then the lower wiring layer ML-L is formed to be connected to the lower via plug MV-L and the through electrode 150. Although the capping dielectric film 160 is not between the lower wiring layer ML-L and the device layer 130 in FIG. 13, embodiments are not limited thereto. For example, the capping dielectric film 160 may be between the lower wiring layer ML-L and the device layer 130 in which the lower via plug MV-L and the through electrode 150 are not arranged.

Figure 14:
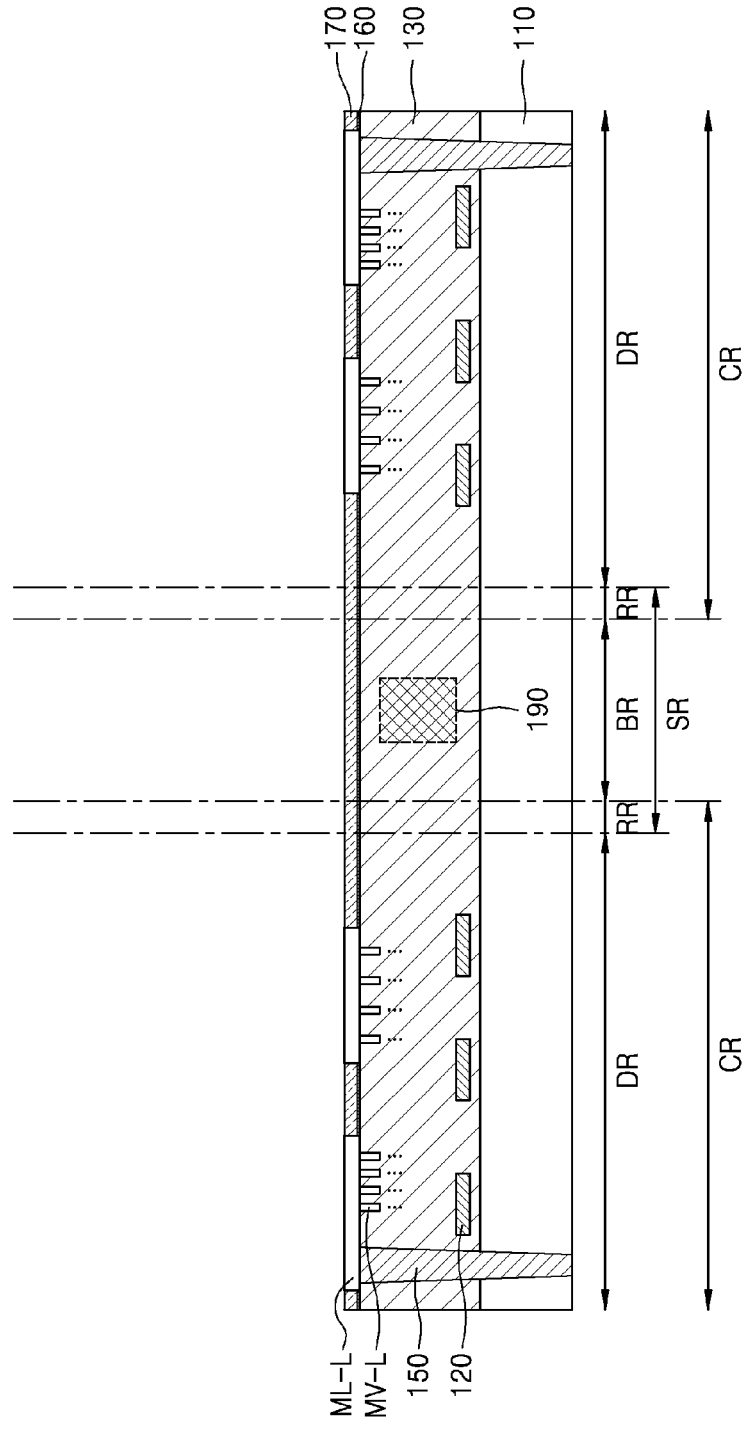

Referring to FIG. 14, a buried dielectric layer 170 is formed to cover the side surface of the lower wiring layer ML-L. For example, the buried dielectric layer 170 may include oxide. In some embodiments, the buried dielectric layer 170 may include TEOS. In some embodiments, the level of a top surface of the buried dielectric layer 170 may be substantially constant. For example, the top surfaces of the buried dielectric layer 170 and the lower wiring layer ML-L may be coplanar.

The capping dielectric film 160 and the buried dielectric layer 170 may include an insulating material having a permittivity that is equal to or higher than that of silicon oxide.

Figure 15:
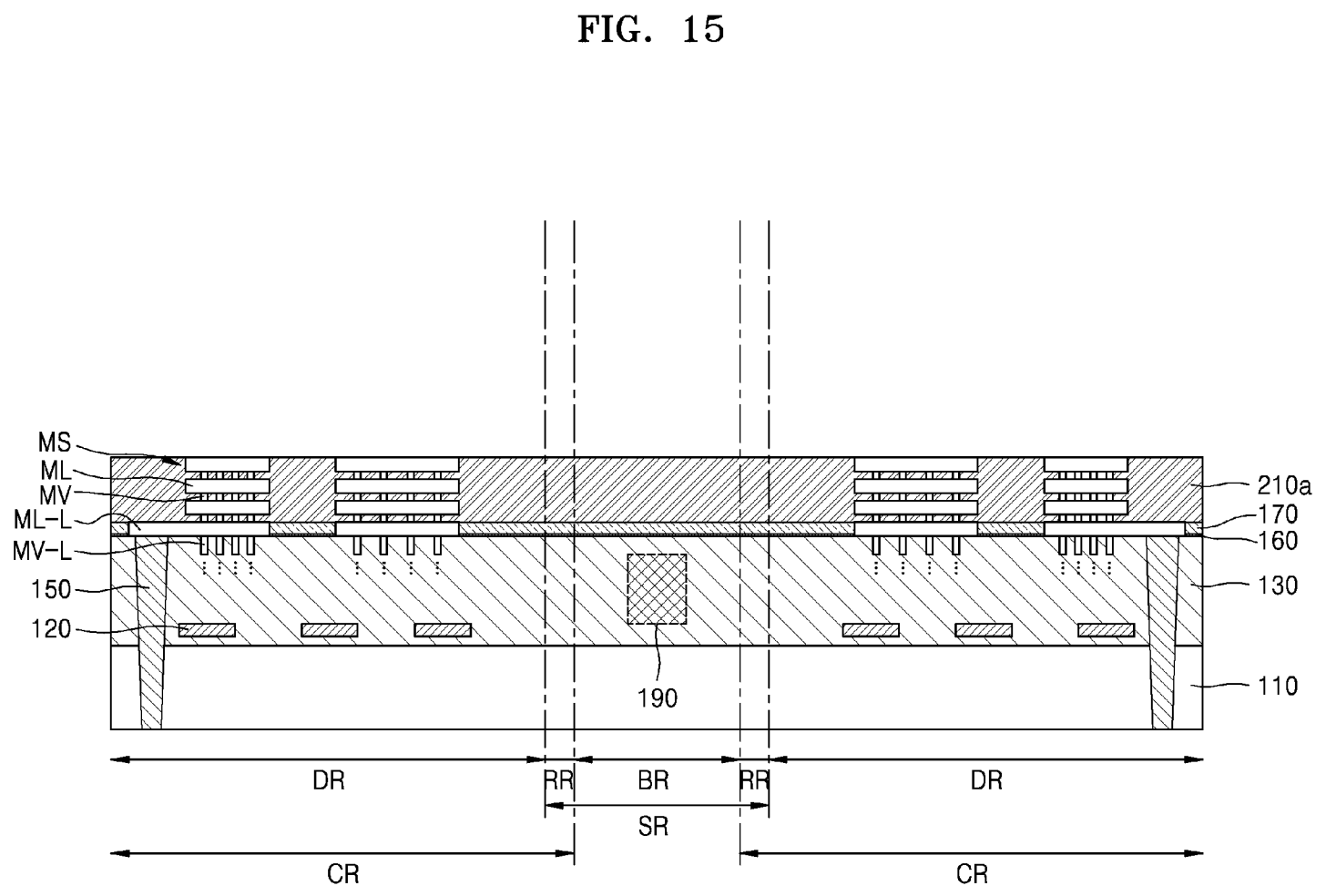

Referring to FIG. 15, the wiring structure MS and a first inter-wiring dielectric layer 210a surrounding the wiring structure MS are formed on the substrate 110 having the lower wiring layer ML-L and the buried dielectric layer 170. The wiring structure MS may include a plurality of wiring layers ML and a plurality of via plugs MV connected to the wiring layers ML. The wiring layers ML includes the lower wiring layer ML-L and the via plugs MV includes the lower via plug MV-L. However, since the lower via plug MV-L and the lower wiring layer ML-L have already been formed as described with reference to FIGS. 12 and 13, the wiring structure MS may be formed by forming the wiring layers ML and the via plugs MV except for the lower wiring layer ML-L and the lower via plug MV-L after the buried dielectric layer 170 is formed.

The first inter-wiring dielectric layer 210a may include an insulating material that has a lower permittivity than the capping dielectric film 160 and the buried dielectric layer 170. The first inter-wiring dielectric layer 210a may include an insulating material that has a lower permittivity than silicon oxide. In some embodiments, the first inter-wiring dielectric layer 210a may include an ULK film that has an ultra-low dielectric constant of about 2.2 to about 2.4. The first inter-wiring dielectric layer 210a may be referred to as a low-k dielectric layer. In some embodiments, the level of a top surface of the first inter-wiring dielectric layer 210a may be substantially constant.

In some embodiments, a top surface of the lower wiring layer ML-L that is at the lowest level among the wiring layers ML may be at the same level as a bottom surface of the first inter-wiring dielectric layer 210a.

Referring to FIG. 16, the second inter-wiring dielectric layer 220, the sub pad via SPV, the sub pad SPD, the third inter-wiring dielectric layer 230, the protective dielectric layer 240, the fourth inter-wiring dielectric layer 250, the pad via PV, and the pad pattern PD are formed by performing the process described with reference to FIG. 2. Thereafter, the processes described with reference to FIGS. 3 through 8A are performed, and a bottom pad 155 connected to the through electrode 150 is formed on the bottom surface of the substrate 110 so that a semiconductor chip 2 is formed. For example, the bottom pad 155 may include Ti, Cu, Ni, Au, NiV, NiP, TiNi, TiW, TaN, Al, Pd, CuCr, or a combination thereof.

The semiconductor chip 2 may be different from the semiconductor chip 1 of FIG. 8A in that the top surface of the lower wiring layer ML-L at the lowest level among the wiring layers ML is at the same level as the bottom surface of the first inter-wiring dielectric layer 210a. In addition, the semiconductor chip 2 may further include the through electrode 150 and the bottom pad 155. Although the through electrode 150 passes through the device layer 130 and the substrate 110 in FIG. 16, embodiments are not limited thereto. For example, the through electrode 150 may be formed to extend from the top surface to the bottom surface of the substrate 110 passing through the substrate 110 and may be electrically connected to the lower wiring layer ML-L through the lower via plug MV-L or another conductive structure.

The upper cover dielectric layer 290 may cover the side surfaces of the first inter-wiring dielectric layer 210a, the second inter-wiring dielectric layer 220, the third inter-wiring dielectric layer 230, the protective dielectric layer 240, and the fourth inter-wiring dielectric layer 250 in an isolation recess SRSb. A bottom surface of the isolation recess SRSb, which may correspond to the bottom surface of the upper cover dielectric layer 290, may be at the same level as the top surface of the buried dielectric layer 170. The upper cover dielectric layer 290 may cover the top surface of the buried dielectric layer 170 at the bottom surface of the isolation recess SRSb.

FIG. 17 is a cross-sectional view showing main elements of a semiconductor chip, according to embodiments. Redundant descriptions similar to or the same as the ones already given with reference to FIGS. 1 through 16 may be omitted. In FIGS. 1 through 17, like reference numerals denote like elements.

Referring to FIG. 17, a semiconductor chip 2a includes an upper cover dielectric layer 290 filling an isolation recess SRSc. The isolation recess SRSc may pass through the first inter-wiring dielectric layer 210a and extend into the buried dielectric layer 170. A bottom surface of the isolation recess SRSc may be at a lower level than the top surface of the buried dielectric layer 170.

The upper cover dielectric layer 290 may cover the side surfaces of the first inter-wiring dielectric layer 210a, the second inter-wiring dielectric layer 220, the third inter-wiring dielectric layer 230, the protective dielectric layer 240, and the fourth inter-wiring dielectric layer 250 and at least a portion of a side surface of the buried dielectric layer 170 in the isolation recess SRSc. The bottom surface of the upper cover dielectric layer 290 may be at a lower level than the top surface of the buried dielectric layer 170, and the upper cover dielectric layer 290 may extend into the buried dielectric layer 170.

In some embodiments, the isolation recess SRSc may pass through the buried dielectric layer 170 and the capping dielectric film 160 and extend into the device layer 130. The bottom surface of the isolation recess SRSc may be at a lower level than the top end of the device layer 130. In this case, the upper cover dielectric layer 290 may cover the side surfaces of the buried dielectric layer 170 and the capping dielectric film 160 and a side surface of an upper portion of the device layer 130.

Figure 18B:
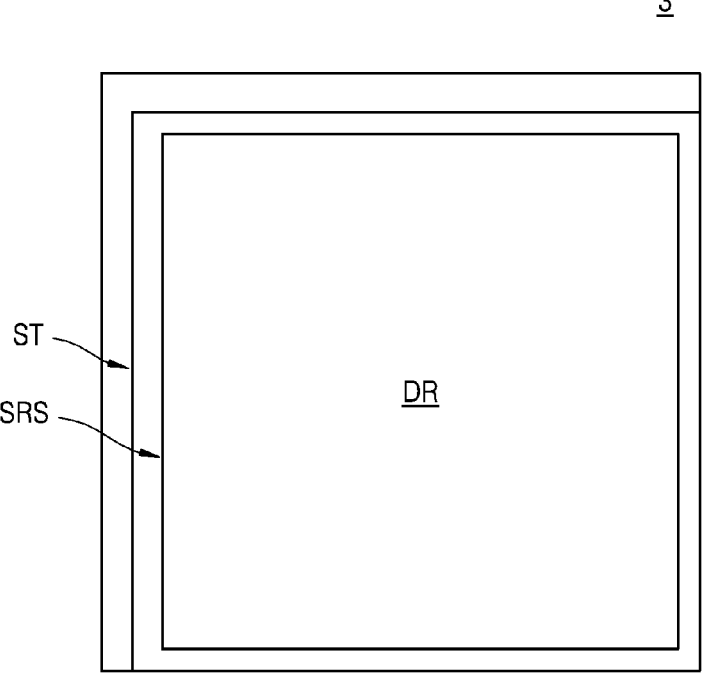

FIGS. 18A and 18B are respectively a cross-sectional view and a plan view that show main elements of a semiconductor chip, according to embodiments. Redundant descriptions similar to or the same as the ones already given with reference to FIGS. 1 through 16 may be omitted. In FIGS. 1 through 18B, like reference numerals denote like elements.

Referring to FIGS. 18A and 18B, the upper cover dielectric layer 290 of a semiconductor chip 3 may have a step portion ST in an edge portion of the semiconductor chip 3. In some embodiments, the step portion ST of the upper cover dielectric layer 290 may be formed in the remaining scribe region RR.

The semiconductor chip 3 may have the step portion ST only in a portion of the edge thereof. The step portion ST may be a portion of the bottom surface of the recess portion 290R in FIG. 7, wherein the portion remains after a dicing process is performed to form the semiconductor chip 3. Although the step portion ST extends along two sides among the four sides of the semiconductor chip 3 but not along the other two sides in FIG. 18B, embodiments are not limited thereto. For example, the step portion ST may be arranged not along at least one of the four sides of the semiconductor chip 3 but along the other one to three sides.

In a dicing process for obtaining the semiconductor chip 3, sawing using a blade may be performed along the four sides of the semiconductor chip 3. At this time, when the recess portion 290R (in FIG. 7) is entirely cut away along at least one side of the semiconductor chip 3 in a sawing process using a blade, the step portion ST is not provided at the side of the semiconductor chip 3 and may extend along the other sides thereof. The isolation recess SRS may extend along the four sides of the semiconductor chip 3.

Figure 19B:
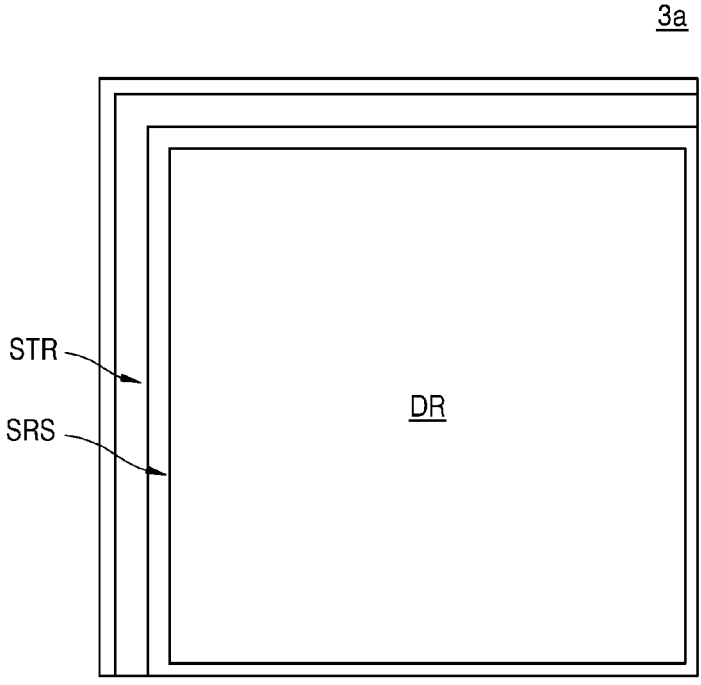

FIGS. 19A and 19B are respectively a cross-sectional view and a plan view that show main elements of a semiconductor chip, according to embodiments. Redundant descriptions similar to or the same as the ones already given with reference to FIGS. 1 through 16 may be omitted. In FIGS. 1 through 19B, like reference numerals denote like elements.

Referring to FIGS. 19A and 19B, a semiconductor chip 3$a$ includes the upper cover dielectric layer 290 having a trench portion STR adjacent to an edge of the semiconductor chip 3$a$. In some embodiments, the trench portion STR of the upper cover dielectric layer 290 may be formed in the remaining scribe region RR. The trench portion STR may be arranged in a portion of the upper cover dielectric layer 290, wherein the portion has a horizontal distance of several μm or less from the edge of the semiconductor chip 3$a$.

The semiconductor chip 3$a$ may have the trench portion STR in only a portion of the edge. The trench portion STR may be a portion of the recess portion 290R in FIG. 7, wherein the portion remains after a dicing process is performed to form the semiconductor chip 3$a$. Although the trench portion STR extends along two sides among the four sides of the semiconductor chip 3$a$ but not along the other two sides in FIG. 19B, embodiments are not limited thereto. For example, the trench portion STR may be arranged not along at least one of the four sides of the semiconductor chip 3$a$ but along the other one to three sides. In some embodiments, the trench portion STR may extend along some of the four sides of the semiconductor chip 3$a$ with a substantially uniform horizontal width. For example, the trench portion STR may extend along some of the four sides of the semiconductor chip 3$a$ with a horizontal width of about 5 μm or less. The isolation recess SRS may extend along the four sides of the semiconductor chip 3$a$. For example, the trench portion STR may be formed along one or more among the four sides of the semiconductor chip 3$a$. In certain embodiments, the trench portion STR may be formed along a portion of a side of the semiconductor chip 3$a$.

In a dicing process for obtaining the semiconductor chip 3$a$, sawing using a blade may be performed along the four sides of the semiconductor chip 3$a$. At this time, when the recess portion 290R (in FIG. 7) remains along some of the four sides of the semiconductor chip 3$a$ and is entirely cut away along the other sides of the semiconductor chip 3$a$ in a sawing process using a blade, the trench portion STR may extend along some sides of the semiconductor chip 3$a$ but not along the other sides thereof.

The step portion ST in FIGS. 8A, 8B, 10, 16, 17, 18A, and 18B and the trench portion STR in FIGS. 19A and 19B may be collectively referred to as a recess structure.

Figure 20:
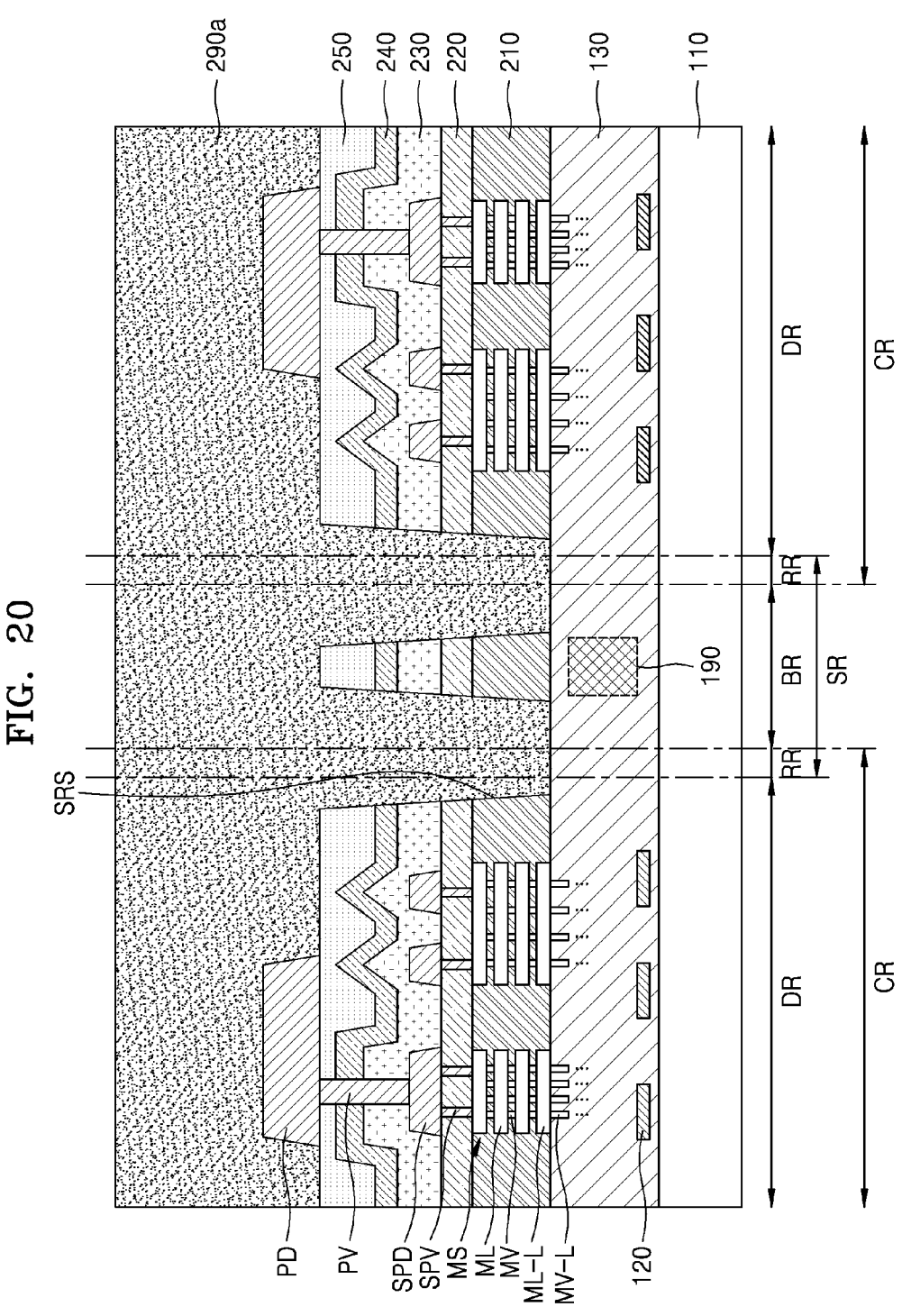
FIG. 20 is a cross-sectional view of a stage in a method of manufacturing a semiconductor chip, according to embodiments.

FIG. 20 is a cross-sectional view of a stage in a method of manufacturing a semiconductor chip, according to embodiments. FIG. 21 is a cross-sectional view showing main elements of a semiconductor chip, according to embodiments. FIG. 20 is the cross-sectional view of the stage following the stage of FIG. 5. Redundant descriptions similar to or the same as the ones already given with reference to FIGS. 1 through 8B may be omitted. In FIGS. 1 through 21, like reference numerals denote like elements.

Referring to FIG. 20, an upper cover dielectric layer 290$a$ is formed to entirely fill the isolation recess SRS and cover the fourth inter-wiring dielectric layer 250 and the pad pattern PD. The upper cover dielectric layer 290$a$ may include a single layer including one kind of an insulating layer, a double layer including two kinds of insulating layers, or a multiple layer including a combination of at least three kinds of insulating layers. For example, the upper cover dielectric layer 290$a$ may include oxide. In some embodiments, the upper cover dielectric layer 290$a$ may include TEOS. For example, the upper cover dielectric layer 290$a$ may include oxide, nitride, or a combination thereof. In some embodiments, the upper cover dielectric layer 290$a$ may include a HDP oxide layer, a TEOS layer, a silicon nitride layer, or a combination thereof. In some embodiments, the upper cover dielectric layer 290$a$ may have a multiple layer in which a layer formed of HDP, a layer formed of TEOS, and a layer formed of silicon nitride are sequentially stacked. In some embodiments, the upper cover dielectric layer 290 may have a multiple layer in which a layer formed of TEOS, a layer formed of HDP, and a layer formed of silicon nitride are sequentially stacked. In some embodiments, the upper cover dielectric layer 290 may have a multiple layer in which a layer formed of HDP, a layer formed of silicon nitride, and a layer formed of TEOS are sequentially stacked. The upper cover dielectric layer 290$a$ may include a material having a greater permittivity than the first inter-wiring dielectric layer 210.

The upper cover dielectric layer 290$a$ may have a flat top surface having a substantially constant level.

Referring to FIG. 21, an upper portion of the upper cover dielectric layer 290$a$ is partially removed. For example, the upper portion of the upper cover dielectric layer 290$a$ may be partially removed using CMP. Thereafter, a portion of the upper cover dielectric layer 290$a$ on the pad pattern PD may be removed to expose the chip pad portion CPD of the pad pattern PD. Thereafter, a dicing process is performed to cut the substrate 110 along the scribe lane region SR, thereby singulating a semiconductor chip 4.

The semiconductor chip 4 may include the upper cover dielectric layer 290$a$ covering the fourth inter-wiring dielectric layer 250 and a portion of the pad pattern PD. A portion of the pad pattern PD, which is not covered with the upper cover dielectric layer 290$a$, may be the chip pad portion CPD, and at least a portion of the pad pattern PD, which is covered with the upper cover dielectric layer 290, may be a redistribution pattern.

The upper cover dielectric layer 290$a$ may cover the side surfaces of the first inter-wiring dielectric layer 210, the second inter-wiring dielectric layer 220, the third inter-wiring dielectric layer 230, the protective dielectric layer 240, and the fourth inter-wiring dielectric layer 250 in the isolation recess SRS. The upper cover dielectric layer 290a may cover the top surface of the device layer 130 at the bottom surface of the isolation recess SRS.

The upper cover dielectric layer 290a may have a side surface that extends along an edge of the semiconductor chip 4 substantially in the vertical direction with respect to the substrate 110, e.g., with respect to the top surface of the substrate 110. The side surface of the upper cover dielectric layer 290a may extend from the top surface of the device layer 130 to at least a level higher than the top surface of the fourth inter-wiring dielectric layer 250 in the vertical direction with respect to the substrate 110, e.g., with respect to the top surface of the substrate 110. For example, the upper cover dielectric layer 290a may not have the step portion ST shown in FIGS. 8A and 8B.

Figure 22:
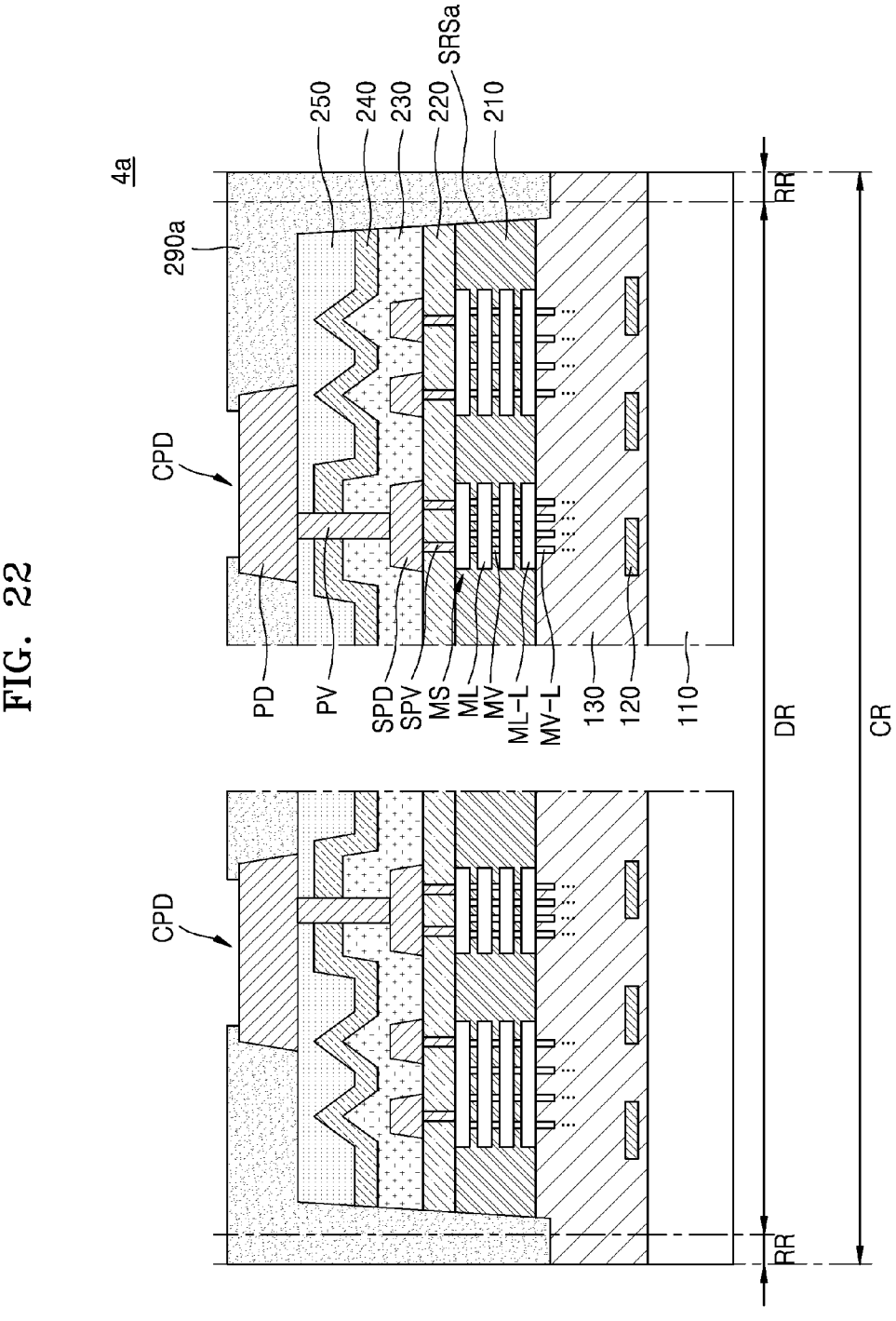
Figure 23:
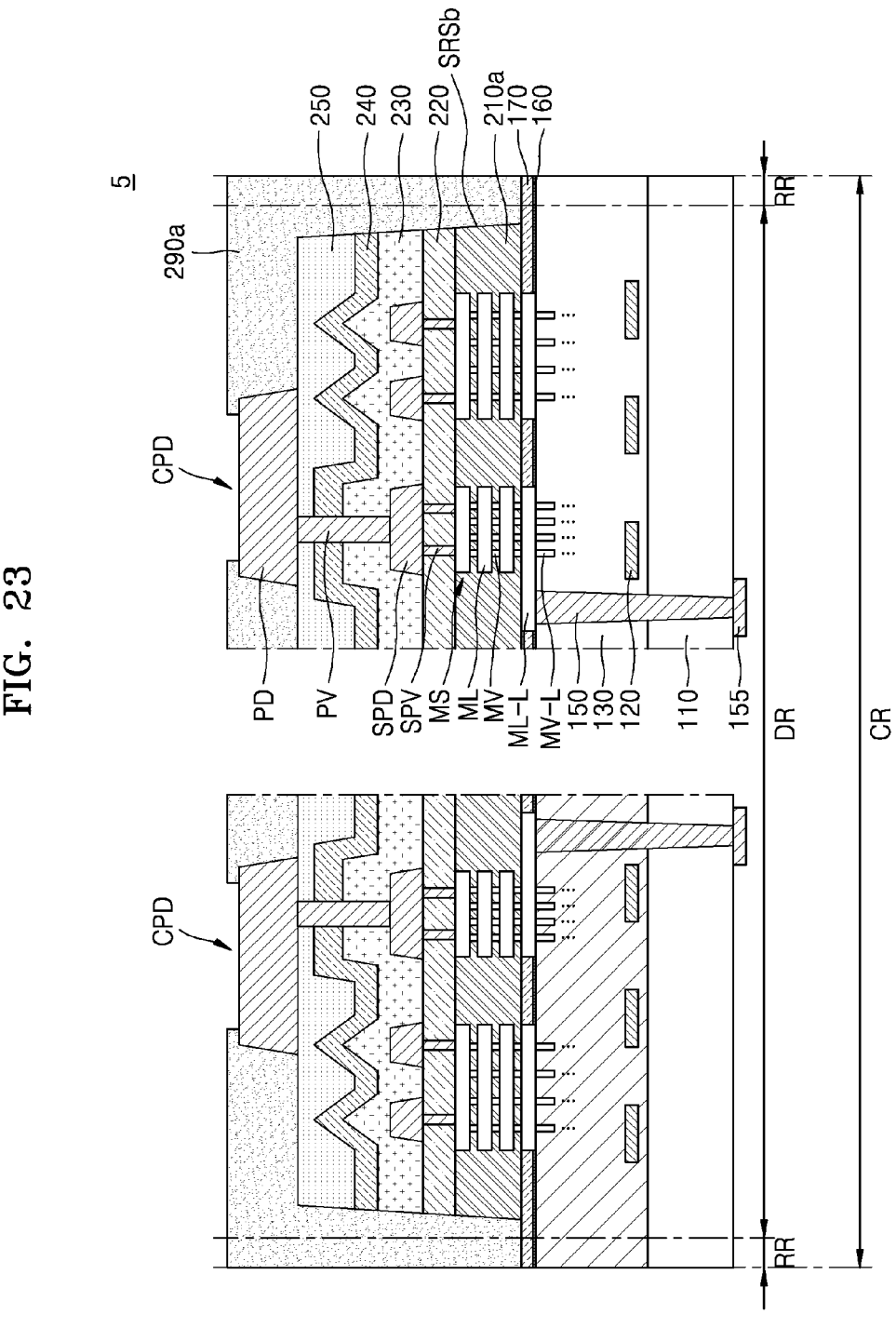

FIGS. 22 through 24 are cross-sectional views showing main elements of semiconductor chips, according to embodiments. Redundant descriptions similar to or the same as the ones already given with reference to FIGS. 1 through 20 may be omitted. In FIGS. 1 through 24, like reference numerals denote like elements.

Referring to FIG. 22, a semiconductor chip 4a may include an isolation recess SRSa, which has a bottom surface at a lower level than a top end of a device layer 130, different from the isolation recess SRS of the semiconductor chip 4 of FIG. 21.

Referring to FIG. 23, a semiconductor chip 5 may include an upper cover dielectric layer 290a similar to the one of the semiconductor chip 4 of FIG. 21 different from the upper cover dielectric layer 290 having the step portion ST in the semiconductor chip 2 of FIG. 16.

Referring to FIG. 24, a semiconductor chip 5a may include an upper cover dielectric layer 290a similar to the one of the semiconductor chip 4 of FIG. 21 different from the upper cover dielectric layer 290 having the step portion ST in the semiconductor chip 2a of FIG. 17.

FIGS. 25 and 26 are cross-sectional views of stages in a method of manufacturing a semiconductor chip, according to embodiments. FIG. 27 is a cross-sectional view showing main elements of a semiconductor chip, according to embodiments. FIG. 25 is the cross-sectional view of a stage following the stage of FIG. 3. Redundant descriptions similar to or the same as the ones already given with reference to FIGS. 1 through 8B may be omitted. In FIGS. 1 through 27, like reference numerals denote like elements.

Referring to FIG. 25, the hardmask layer 270 is partially removed to form the opening OP that exposes the fourth inter-wiring dielectric layer 250 in the scribe lane region SR, as described above with reference to FIG. 4. Thereafter, the fourth inter-wiring dielectric layer 250, the protective dielectric layer 240, the third inter-wiring dielectric layer 230, the second inter-wiring dielectric layer 220, and the first inter-wiring dielectric layer 210 are partially removed using the hardmask layer 270 as an etch mask so that an isolation recess SRSd exposing the device layer 130 is formed.

For example, the fourth inter-wiring dielectric layer 250, the protective dielectric layer 240, the third inter-wiring dielectric layer 230, the second inter-wiring dielectric layer 220, and the first inter-wiring dielectric layer 210 may be partially removed using an ashing/etching process. For example, while the isolation recess SRS in FIG. 5 may be formed by separately performing a process of removing the fourth inter-wiring dielectric layer 250, the protective dielectric layer 240, the third inter-wiring dielectric layer 230, and the second inter-wiring dielectric layer 220 and a process of removing the first inter-wiring dielectric layer 210, the isolation recess SRSd in FIG. 25 may be formed by performing a single process of removing all of the fourth inter-wiring dielectric layer 250, the protective dielectric layer 240, the third inter-wiring dielectric layer 230, the second inter-wiring dielectric layer 220, and the first inter-wiring dielectric layer 210.

In some embodiments, the side surface of each of the fourth inter-wiring dielectric layer 250, the protective dielectric layer 240, the third inter-wiring dielectric layer 230, and the second inter-wiring dielectric layer 220, which is exposed in the isolation recess SRSd, may be substantially smooth, and the side surface of the first inter-wiring dielectric layer 210 exposed in the isolation recess SRSd may have a rugged portion RGN. For example, the rugged portion RGN of the first inter-wiring dielectric layer 210 may be rougher than the side surfaces of the second inter-wiring dielectric layer 220, the third inter-wiring dielectric layer 230, the protective dielectric layer 220 and the fourth inter-wiring dielectric layer 250.

Referring to FIG. 26, a sub cover dielectric layer 260 is formed to conformally cover inner and bottom surfaces of the isolation recess SRSd and the top surfaces of the fourth inter-wiring dielectric layer 250 and the pad pattern PD. For example, the sub cover dielectric layer 260 may include nitride. The sub cover dielectric layer 260 may cover the rugged portion RGN in the side surface of the first inter-wiring dielectric layer 210.

Referring to FIG. 27, the same processes as the ones described with reference to FIGS. 6 through 8B are performed, and a portion of the sub cover dielectric layer 260 on the pad pattern PD is also removed when a portion of the upper cover dielectric layer 290 on the pad pattern PD is removed to expose the chip pad portion CPD of the pad pattern PD, thereby forming a semiconductor chip 6. The sub cover dielectric layer 260 and the upper cover dielectric layer 290 may be collectively referred to as a cover dielectric layer.

Unlike the semiconductor chip 1 of FIG. 8A, the semiconductor chip 6 may further include the rugged portion RGN in the side surface of the first inter-wiring dielectric layer 210 and the sub cover dielectric layer 260 covering the inner and bottom surfaces of the isolation recess SRSd, the top surface of the fourth inter-wiring dielectric layer 250, and a portion of the top surface and the side surface of the pad pattern PD, and the upper cover dielectric layer 290 may be arranged on the sub cover dielectric layer 260.

Since the rugged portion RGN in the side surface of the first inter-wiring dielectric layer 210 is covered with the sub cover dielectric layer 260 and the upper cover dielectric layer 290 in the semiconductor chip 6, the rugged portion RGN may not cause damages to the upper cover dielectric layer 290 or chipping of an adhesive film, e.g., an NCF.

Figure 28:
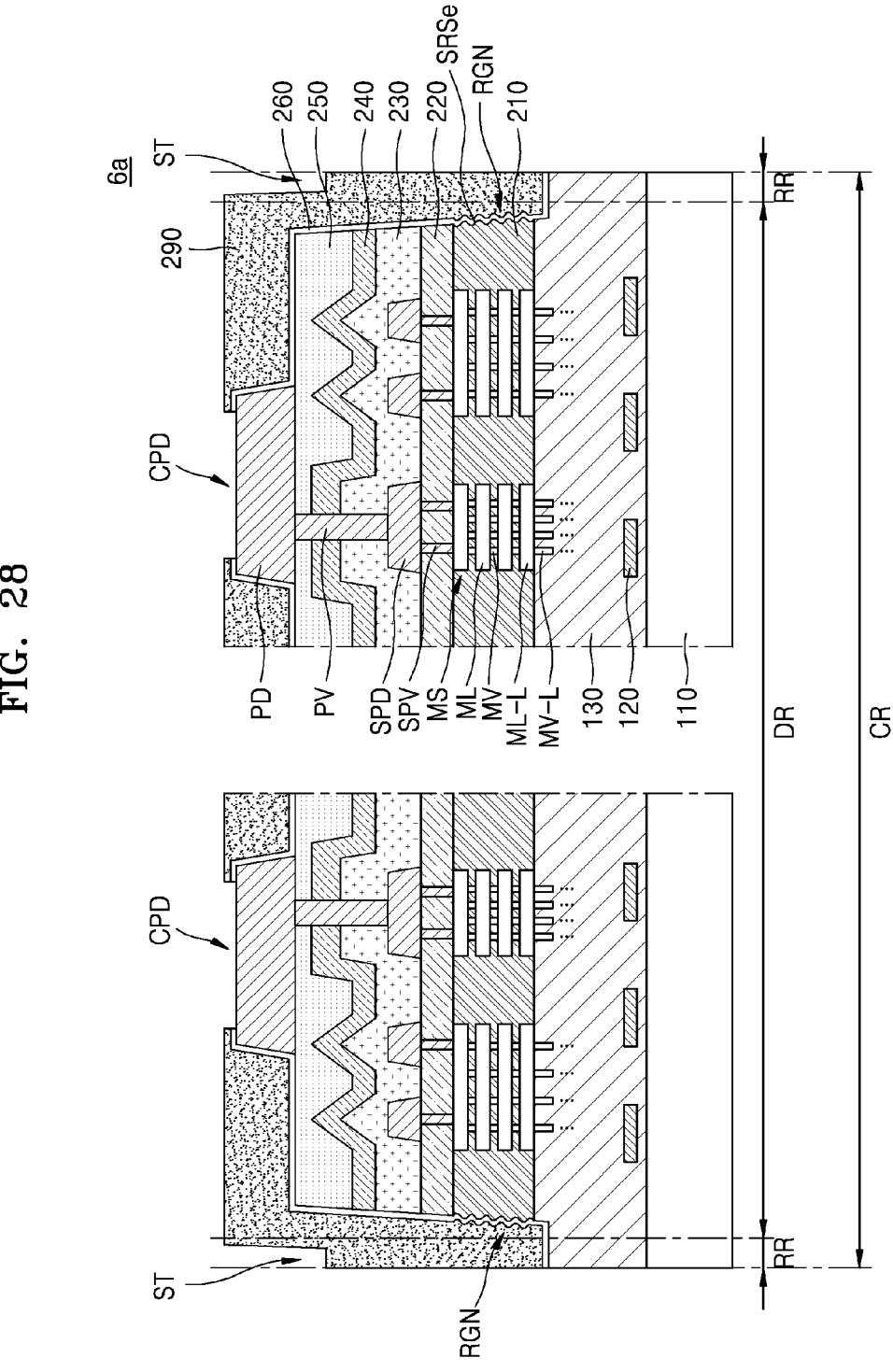
FIGS. 28 through 30 are cross-sectional views showing main elements of semiconductor chips, according to embodiments.
Figure 29:
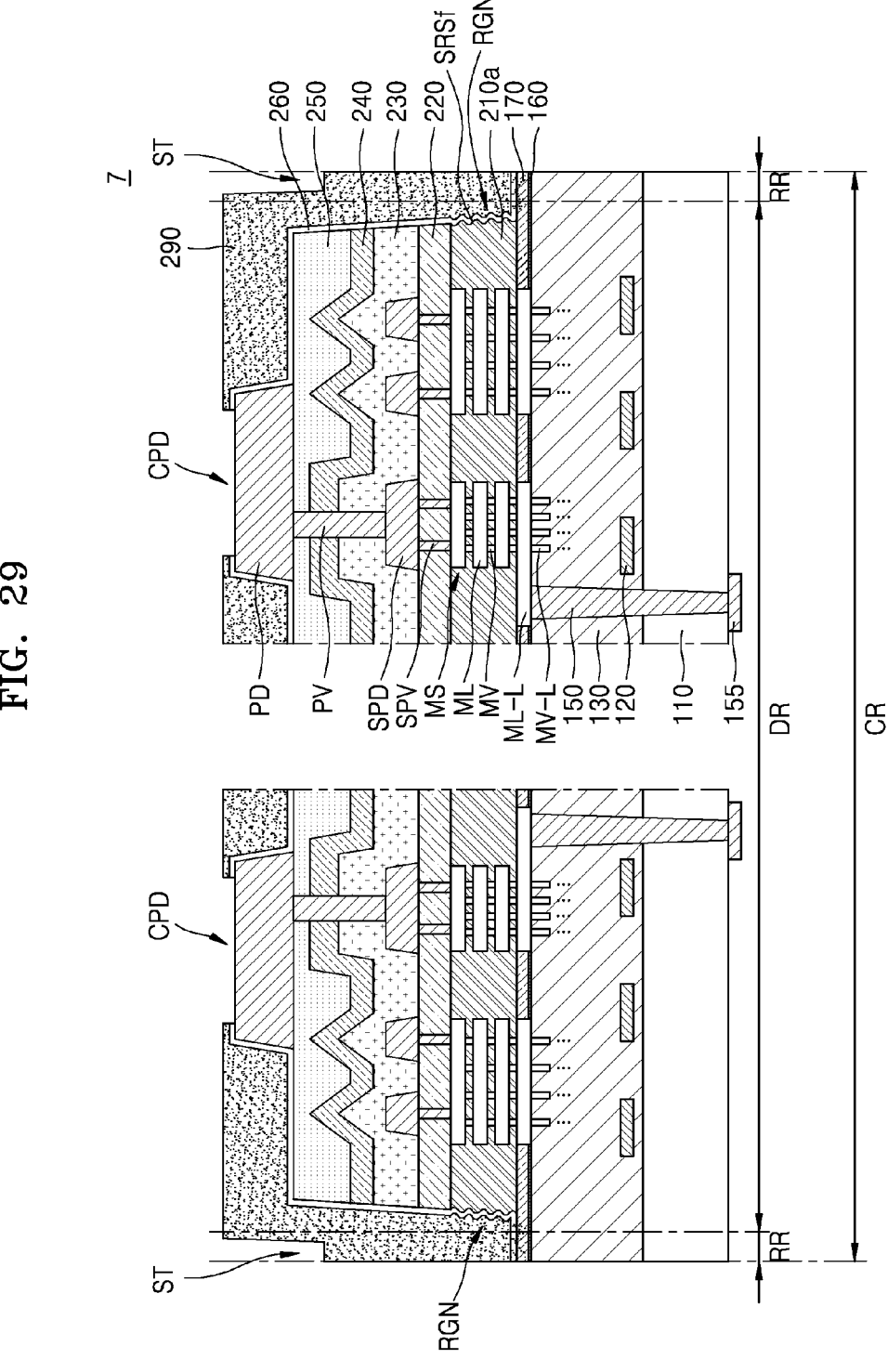
Figure 30:
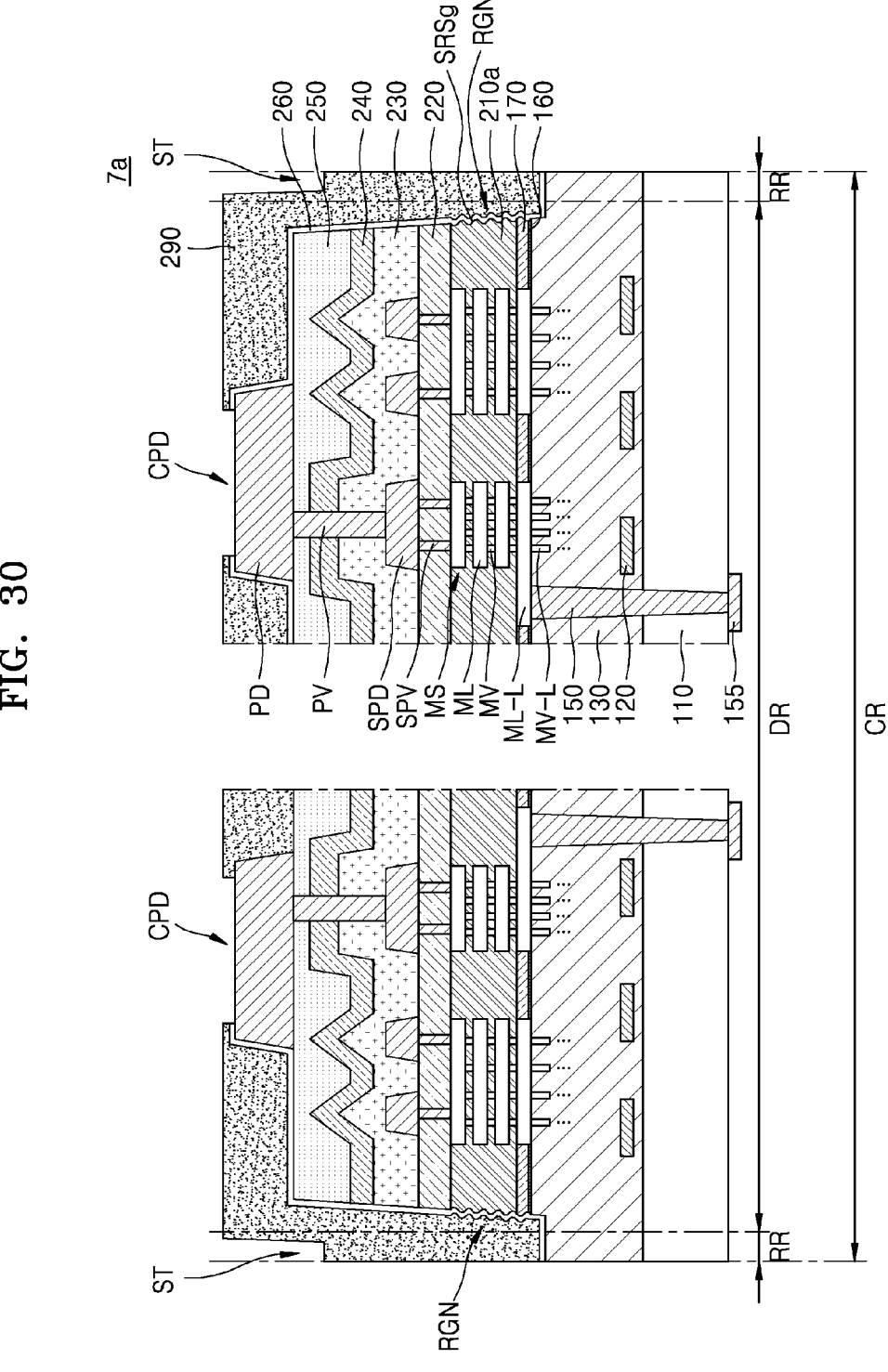

FIGS. 28 through 30 are cross-sectional views showing main elements of semiconductor chips, according to embodiments. Redundant descriptions similar to or the same as the ones already given with reference to FIGS. 1 through 27 may be omitted. In FIGS. 1 through 30, like reference numerals denote like elements.

Referring to FIG. 28, unlike the semiconductor chip 1a of FIG. 10, a semiconductor chip 6a may further include the rugged portion RGN in the side surface of the first inter-wiring dielectric layer 210 and the sub cover dielectric layer 260 covering inner and bottom surfaces of an isolation recess SRSe, the top surface of the fourth inter-wiring dielectric layer 250, and a portion of the top surface and the side surface of the pad pattern PD, and the upper cover dielectric layer 290 may be arranged on the sub cover dielectric layer 260. Similarly to the isolation recess SRSa of the semiconductor chip 1a of FIG. 10, the isolation recess SRSe may pass through the first inter-wiring dielectric layer 210 and extend into the device layer 130. The bottom surface of the isolation recess SRSe may be at a lower level than the top end of the device layer 130.

Referring to FIG. 29, unlike the semiconductor chip 2 of FIG. 16, a semiconductor chip 7 may further include the rugged portion RGN in the side surface of the first inter-wiring dielectric layer 210a and the sub cover dielectric layer 260 covering inner and bottom surfaces of an isolation recess SRSf, the top surface of the fourth inter-wiring dielectric layer 250, and a portion of the top surface and the side surface of the pad pattern PD, and the upper cover dielectric layer 290 may be arranged on the sub cover dielectric layer 260. Similarly to the isolation recess SRSb of the semiconductor chip 2 of FIG. 16, a bottom surface of the isolation recess SRSf of the semiconductor chip 7 may be at the same level as the top surface of the buried dielectric layer 170. For example, the bottom surface of the isolation recess SRSf of the semiconductor chip 7 may correspond to the top surface of the buried dielectric layer 170 in the isolation recess SRSf.

Referring to FIG. 30, unlike the semiconductor chip 2a of FIG. 17, a semiconductor chip 7a may further include the rugged portion RGN in the side surface of the first inter-wiring dielectric layer 210a and the sub cover dielectric layer 260 covering inner and bottom surfaces of an isolation recess SRSg, the top surface of the fourth inter-wiring dielectric layer 250, and a portion of the top surface and the side surface of the pad pattern PD, and the upper cover dielectric layer 290 may be arranged on the sub cover dielectric layer 260. Similarly to the isolation recess SRSc of the semiconductor chip 2a of FIG. 17, a bottom surface of the isolation recess SRSg of the semiconductor chip 7 may be at a lower level than the top surface of the buried dielectric layer 170.

Figure 31B:
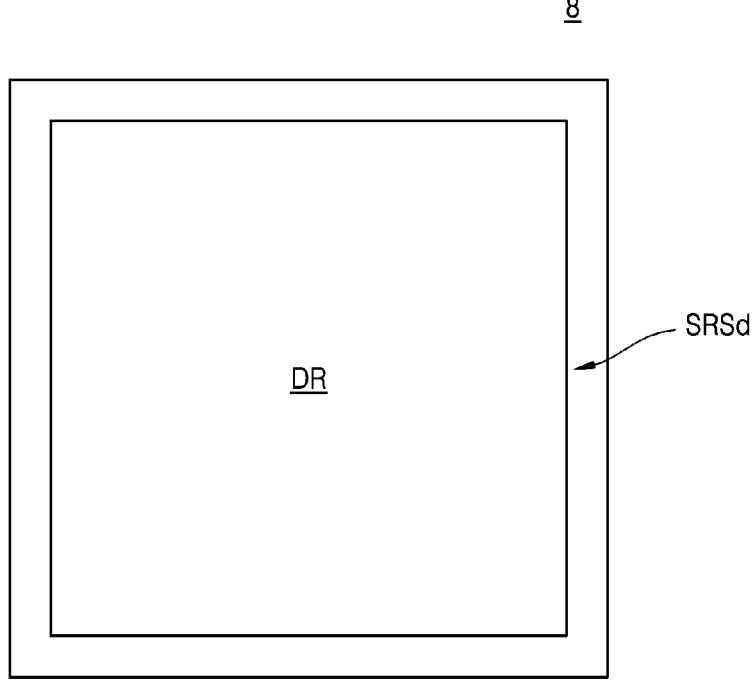

FIGS. 31A and 31B are respectively a cross-sectional view and a plan view that show main elements of a semiconductor chip, according to embodiments. Redundant descriptions similar to or the same as the ones already given with reference to FIGS. 1 through 30 may be omitted. In FIGS. 1 through 31B, like reference numerals denote like elements.

Referring to FIGS. 31A and 31B, a semiconductor chip 8 may include an upper cover dielectric layer 295 different from the upper cover dielectric layer 290 included in the semiconductor chip 6 of FIG. 27. The upper cover dielectric layer 295 may not fill the isolation recess SRSd and may be arranged only on a portion of the sub cover dielectric layer 260, wherein the portion of the sub cover dielectric layer 260 covers the top surface of the fourth inter-wiring dielectric layer 250 and the side surface and a portion of the top surface of the pad pattern PD. For example, the upper cover dielectric layer 295 may include photosensitive polyimide (PSPI).

The isolation recess SRSd may extend along four sides of the semiconductor chip 8.

Since the rugged portion RGN in the side surface of the first inter-wiring dielectric layer 210 is covered with the sub cover dielectric layer 260 in the semiconductor chip 8, chipping of an adhesive film, e.g., an NCF, may not be caused by the rugged portion RGN of the first inter-wiring dielectric layer 210.

Figure 32:
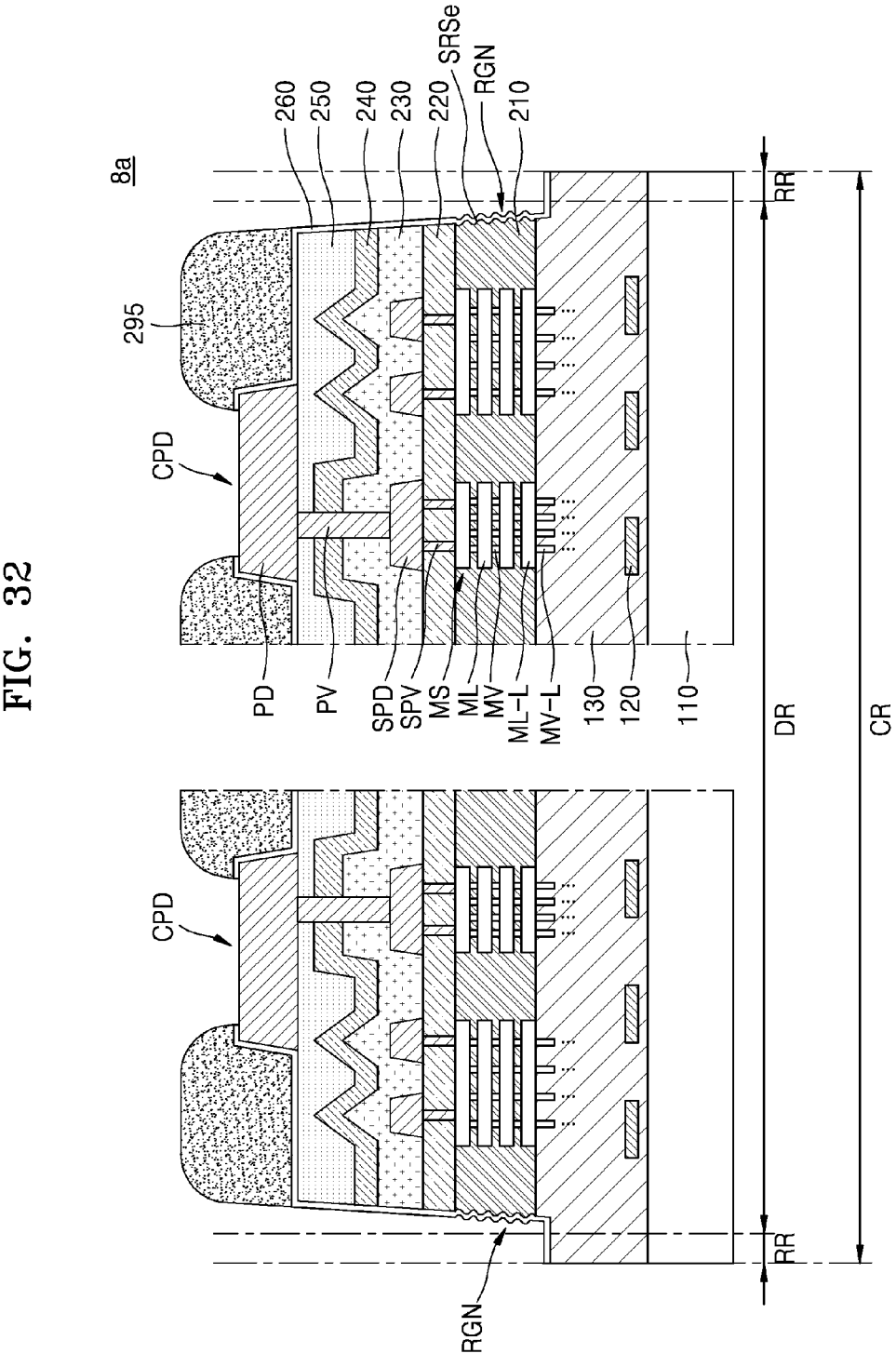
FIGS. 32 through 34 are cross-sectional views showing main elements of semiconductor chips, according to embodiments.
Figure 33:
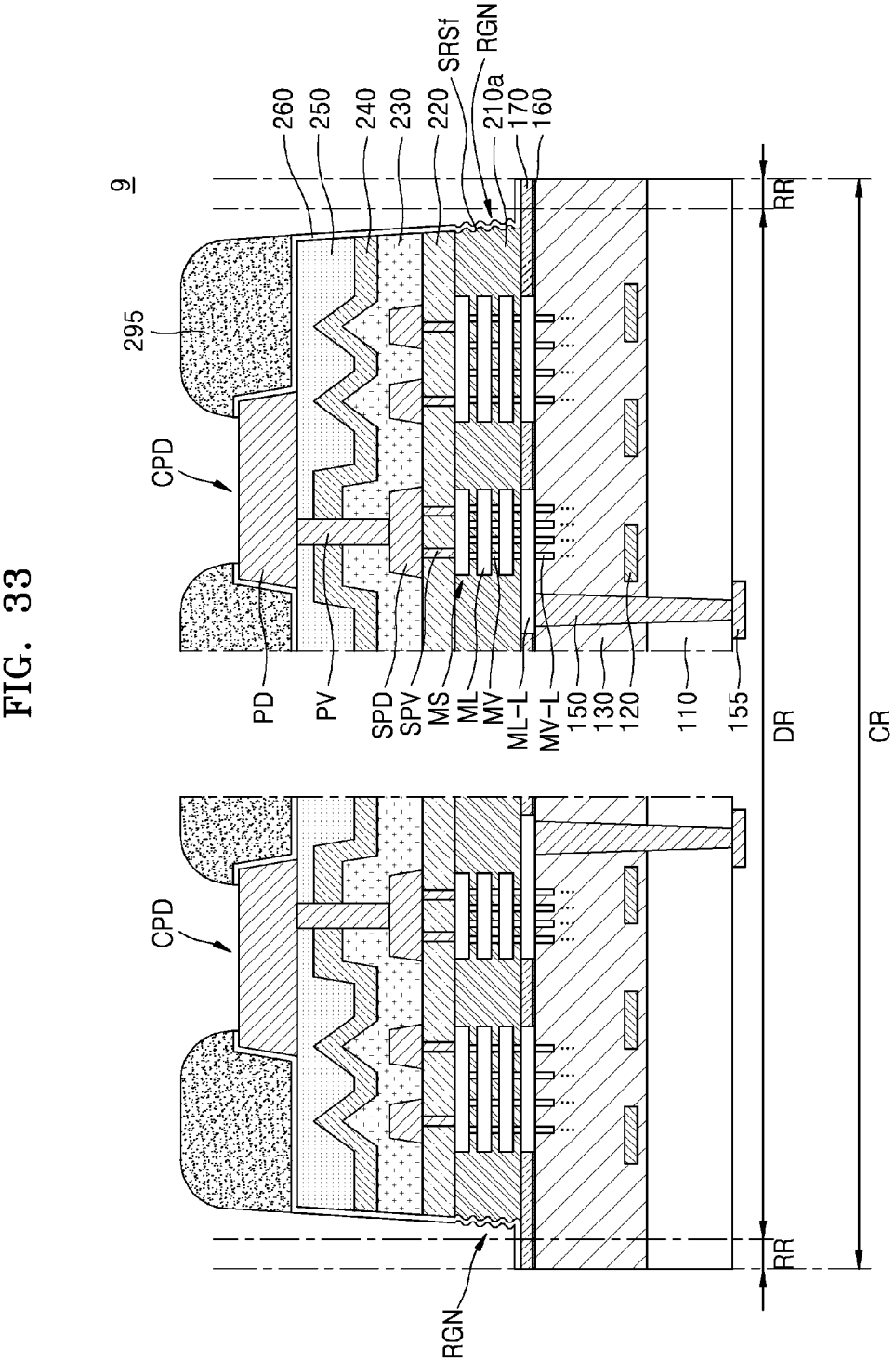
Figure 34:
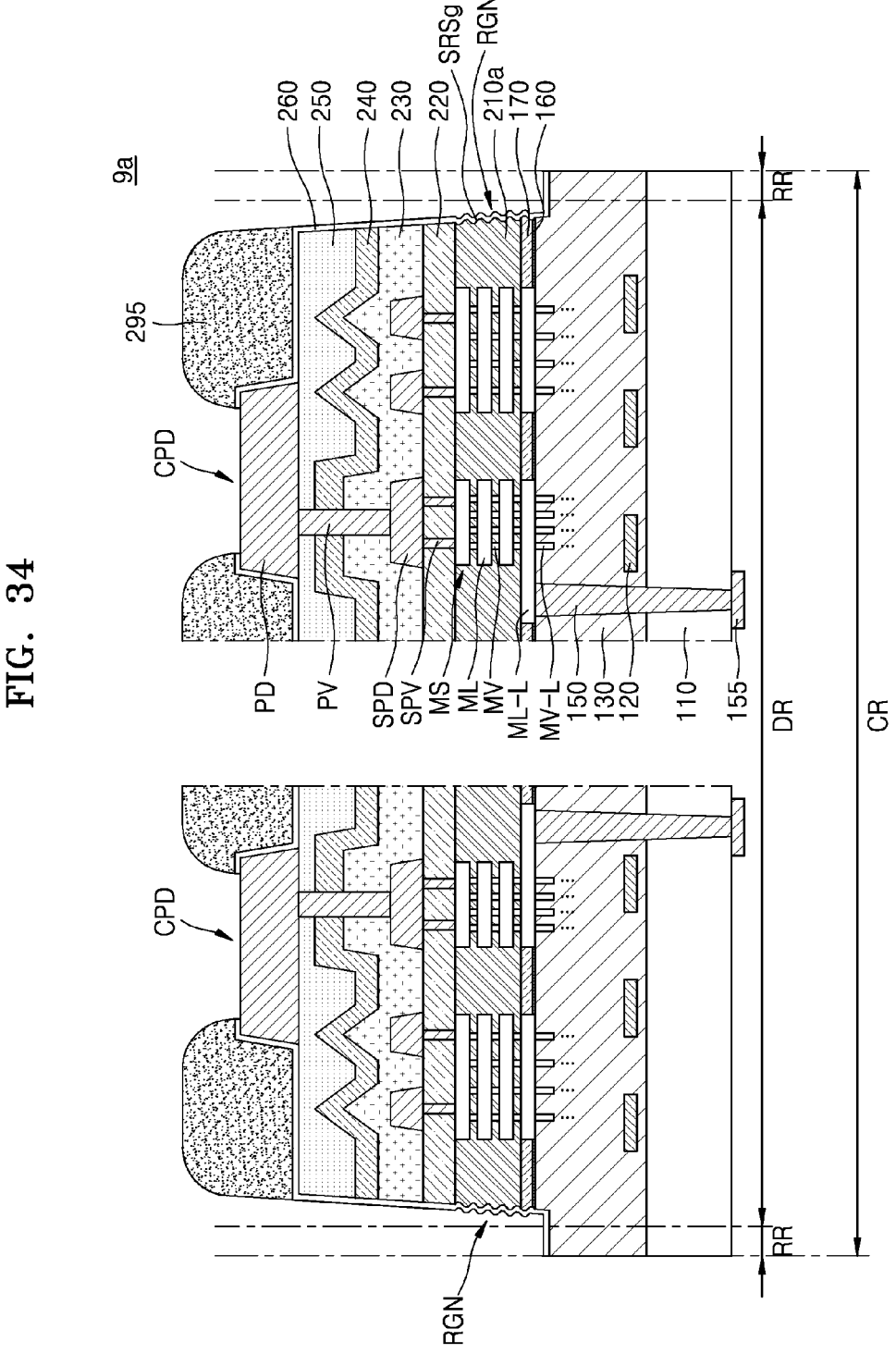

FIGS. 32 through 34 are cross-sectional views showing main elements of semiconductor chips, according to embodiments. Redundant descriptions similar to or the same as the ones already given with reference to FIGS. 1 through 31B may be omitted. In FIGS. 1 through 34, like reference numerals denote like elements.

Referring to FIG. 32, a semiconductor chip 8a may include an upper cover dielectric layer 295 different from the upper cover dielectric layer 290 included in the semiconductor chip 6a of FIG. 28. The upper cover dielectric layer 295 may not fill the isolation recess SRSe and may be arranged only on a portion of the sub cover dielectric layer 260, wherein the portion of the sub cover dielectric layer 260 covers the top surface of the fourth inter-wiring dielectric layer 250 and the side surface and a portion of the top surface of the pad pattern PD.

Referring to FIG. 33, a semiconductor chip 9 may include an upper cover dielectric layer 295 different from the upper cover dielectric layer 290 included in the semiconductor chip 7 of FIG. 29. The upper cover dielectric layer 295 may not fill the isolation recess SRSf and may be arranged only on a portion of the sub cover dielectric layer 260, wherein the portion of the sub cover dielectric layer 260 covers the top surface of the fourth inter-wiring dielectric layer 250 and the side surface and a portion of the top surface of the pad pattern PD.

Referring to FIG. 34, a semiconductor chip 9a may include an upper cover dielectric layer 295 different from the upper cover dielectric layer 290 included in the semiconductor chip 7a of FIG. 30. The upper cover dielectric layer 295 may not fill the isolation recess SRSg and may be arranged only on a portion of the sub cover dielectric layer 260, wherein the portion of the sub cover dielectric layer 260 covers the top surface of the fourth inter-wiring dielectric layer 250 and the side surface and a portion of the top surface of the pad pattern PD.

Figure 35:
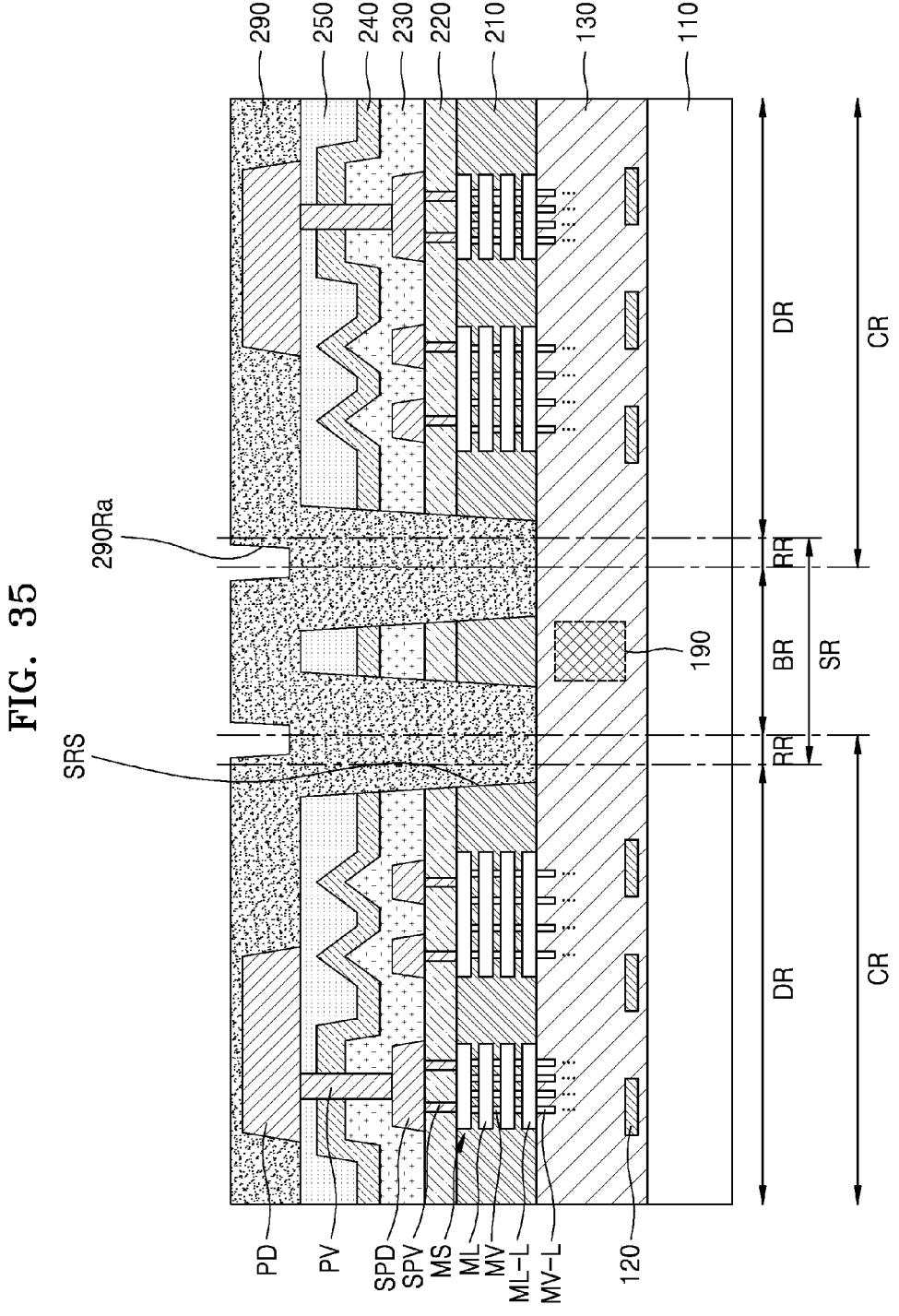
FIGS. 35 and 36 are cross-sectional views of stages in a method of manufacturing a semiconductor chip, according to embodiments.
Figure 36:
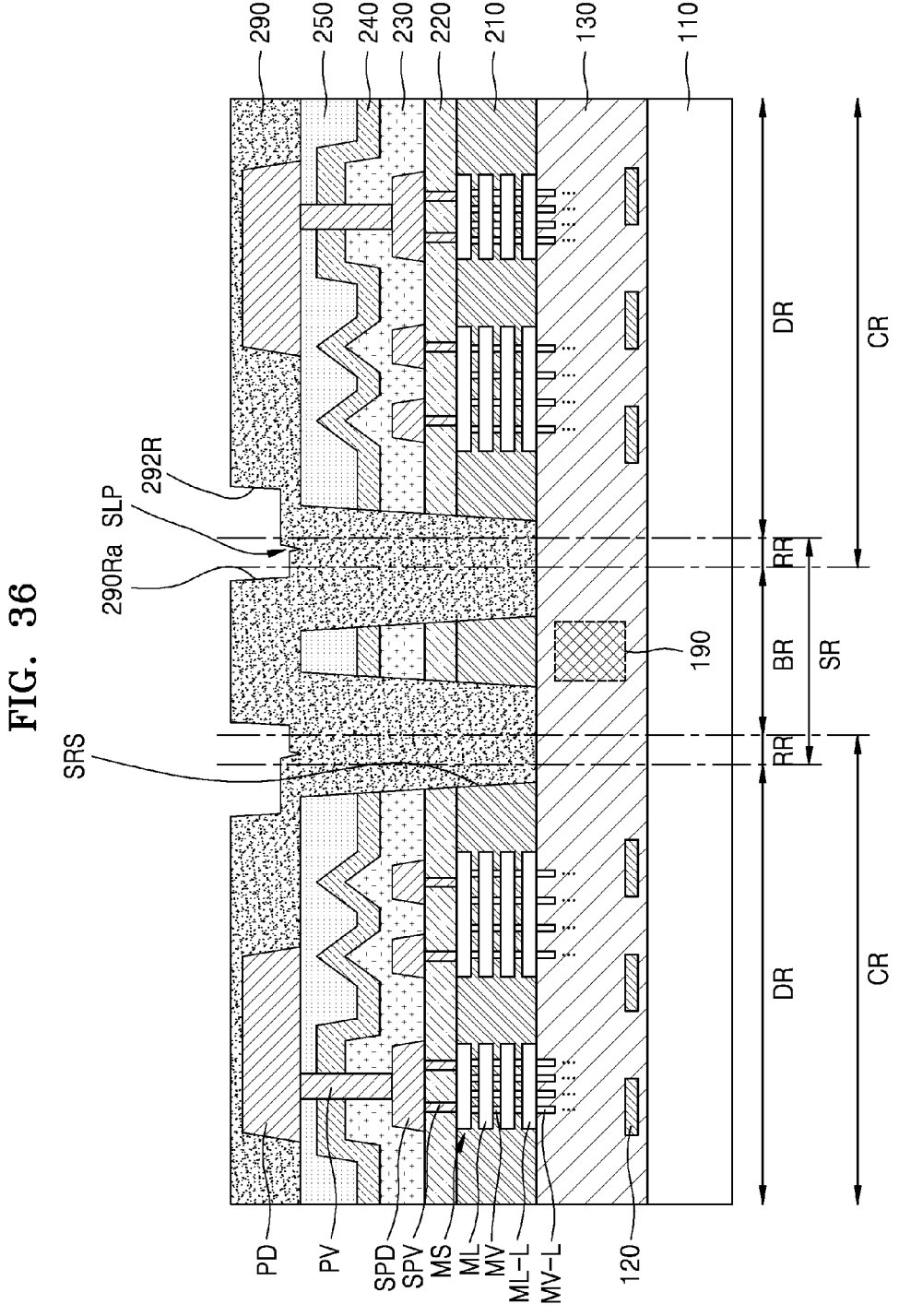
Figure 37B:
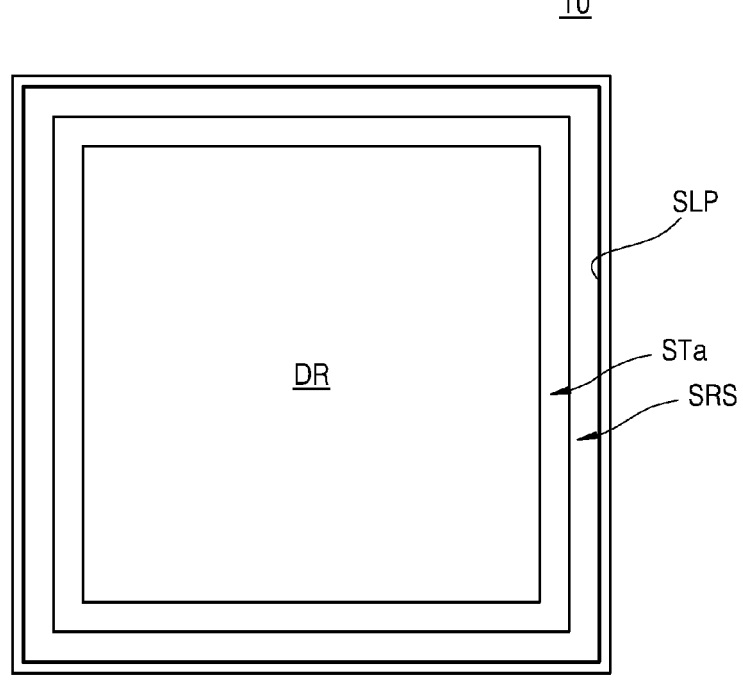

FIGS. 35 and 36 are cross-sectional views of stages in a method of manufacturing a semiconductor chip, according to embodiments. FIGS. 37A and 37B are respectively a cross-sectional view and a plan view that show main elements of a semiconductor chip, according to embodiments. FIG. 35 is the cross-sectional view of a stage following the stage of FIG. 5. Redundant descriptions similar to or the same as the ones already given with reference to FIGS. 1 through 8B may be omitted. In FIGS. 1 through 37B, like reference numerals denote like elements.

Referring to FIG. 35, similarly to the upper cover dielectric layer 290 in FIGS. 6 and 7, an upper cover dielectric layer 290 is formed to fill at least a portion of the isolation recess SRS and to cover a fourth inter-wiring dielectric layer 250 and a pad pattern PD, and an upper portion of the upper cover dielectric layer 290 is partially removed. The level of the top surface of the upper cover dielectric layer 290 is substantially constant in the device region DR. The upper cover dielectric layer 290 may include a recess portion 290Ra corresponding to the isolation recess SRS.

In some embodiments, a bottom surface of the recess portion 290Ra may be at a higher level than the top surface of the fourth inter-wiring dielectric layer 250. In some embodiments, the bottom surface of the recess portion 290Ra may be at a lower level than the top surface of the pad pattern PD.

Referring to FIG. 36, an extended recess portion 292R is formed by removing a portion of the upper cover dielectric layer 290 adjacent to the recess portion 290Ra. The extended recess portion 292R may be formed by removing a portion of the upper cover dielectric layer 290 adjacent to the recess portion 290Ra using a photolithography process or an etching process. The extended recess portion 292R may be formed to communicate with/to be open to the recess portion 290Ra. Although the recess portion 290Ra and the extended recess portion 292R are separately formed and thus individually named, the recess portion 290Ra may be considered as being extended to the extended recess portion 292R in light of the result of forming the extended recess portion 292R. Therefore, the recess portion 290Ra and the extended recess portion 292R may be collectively referred to as a recess portion.

Although a bottom surface of the extended recess portion 292R is at a higher level than the bottom surface of the recess portion 290Ra in FIG. 36, embodiments are not limited thereto. For example, the bottom surface of the extended recess portion 292R may be at the same level as or a lower level than the bottom surface of the recess portion 290Ra.

In a process of removing a portion of the upper cover dielectric layer 290 to form the extended recess portion 292R, a portion of the upper cover dielectric layer 290 between the recess portion 290Ra and the extended recess portion 292R, that is, a portion of the upper cover dielectric layer 290 in which the recess portion 290Ra overlaps the extended recess portion 292R, is further removed so that a groove portion SLP may be formed between the recess portion 290Ra and the extended recess portion 292R. A bottom end of the groove portion SLP may be at a lower level than the bottom surface of the recess portion 290Ra and the bottom surface of the extended recess portion 292R. For example, the groove portion SLP may include a groove which is an extending narrow channel formed on a surface of the upper cover dielectric layer 290 between the extended recess portion 292R and the recession portion 290Ra. In certain embodiments, the groove portion SLP may refer to the groove itself.

Referring to FIGS. 36 through 37B, a portion of the upper cover dielectric layer 290 on the pad pattern PD may be removed to expose the chip pad portion CPD of the pad pattern PD.

Thereafter, a dicing process is performed to cut the substrate 110 along the scribe lane region SR, thereby singulating a semiconductor chip 10.

Unlike the semiconductor chip 1 of FIG. 8A, the semiconductor chip 10 includes the upper cover dielectric layer 290 having a step portion STa across the remaining scribe region RR and a portion of the device region DR adjacent to the remaining scribe region RR. In some embodiments, the step portion STa may extend along four sides of the semiconductor chip 10 with a substantially uniform horizontal width. For example, the step portion STa may extend along the four sides of the semiconductor chip 10 with a horizontal width of about 10 μm or less.

The step portion STa may be at a higher level than the top surface of the fourth inter-wiring dielectric layer 250. The step portion STa may be at a lower level than the top surface of the chip pad portion CPD.

The step portion STa may have the groove portion SLP in the bottom surface thereof. The groove portion SLP may surround the device region DR along an edge of the semiconductor chip 10. For example, when the semiconductor chip 10 has four sides which form a rectangular shape in a plan view, the groove portion SLP may be arranged to surround the device region DR along the four sides of the semiconductor chip 10.

Figure 38:
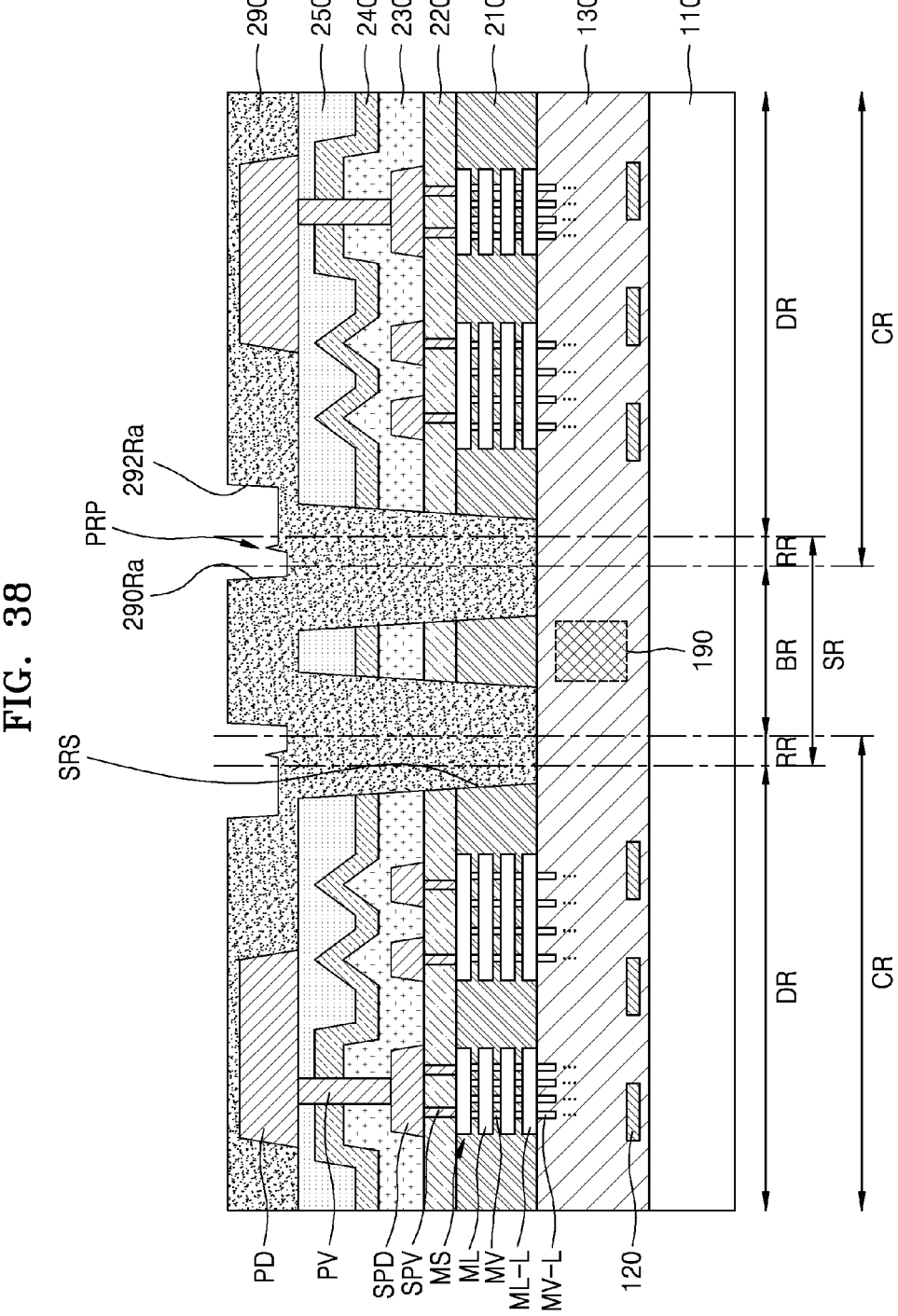
FIG. 38 is a cross-sectional view of a stage in a method of manufacturing a semiconductor chip, according to embodiments.
Figure 39B:
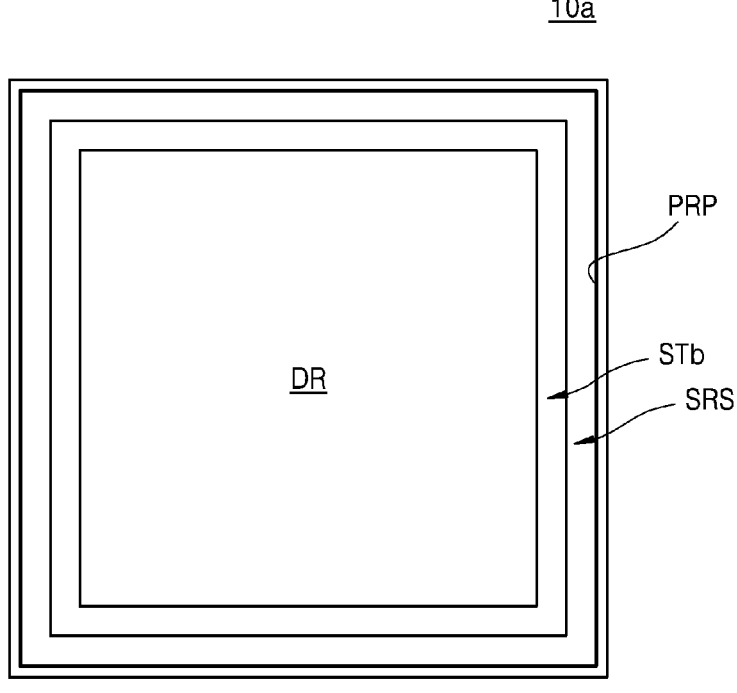

FIG. 38 is a cross-sectional view of a stage in a method of manufacturing a semiconductor chip, according to embodiments. FIGS. 39A and 39B are respectively a cross-sectional view and a plan view that show main elements of a semiconductor chip, according to embodiments. FIG. 38 is the cross-sectional view of the stage following the stage of FIG. 35. Redundant descriptions similar to or the same as the ones already given with reference to FIGS. 1 through 37B may be omitted. In FIGS. 1 through 39B, like reference numerals denote like elements.

Referring to FIG. 38, an extended recess portion 292Ra is formed by removing a portion of the upper cover dielectric layer 290 adjacent to the recess portion 290Ra. The extended recess portion 292Ra may be formed by removing a portion of the upper cover dielectric layer 290 adjacent to the recess portion 290Ra using a photolithography process or an etching process. The extended recess portion 292Ra may be formed to communicate with/to be open to the recess portion 290Ra. Although the recess portion 290Ra and the extended recess portion 292Ra are separately formed and thus individually named, the recess portion 290Ra may be considered as being extended to the extended recess portion 292Ra in light of the result of forming the extended recess portion 292Ra. Therefore, the recess portion 290Ra and the extended recess portion 292Ra may be collectively referred to as a recess portion.

Although a bottom surface of the extended recess portion 292Ra is at a higher level than the bottom surface of the recess portion 290Ra in FIG. 38, embodiments are not limited thereto. For example, the bottom surface of the extended recess portion 292Ra may be at the same level as or a lower level than the bottom surface of the recess portion 290Ra.

In a process of removing a portion of the upper cover dielectric layer 290 to form the extended recess portion 292Ra, a portion of the upper cover dielectric layer 290 between the recess portion 290Ra and the extended recess portion 292Ra may be less removed so that a protrusion portion PRP may be formed between the recess portion 290Ra and the extended recess portion 292Ra. A top end of the protrusion portion PRP may be at a higher level than the bottom surface of the recess portion 290Ra and the bottom surface of the extended recess portion 292Ra. For example, the protrusion portion PRP may include a protrusion which is extending along and between the recess portion 290Ra and the extended recess portion 292Ra on a surface of the upper cover dielectric layer 290. In certain embodiments, the protrusion portion SLP may refer to the protrusion itself.

Referring to FIGS. 38 through 39B, a portion of the upper cover dielectric layer 290 on the pad pattern PD may be removed to expose the chip pad portion CPD of the pad pattern PD.

Thereafter, a dicing process is performed to cut the substrate 110 along the scribe lane region SR, thereby singulating a semiconductor chip 10a.

Unlike the semiconductor chip 10 of FIG. 37A, the semiconductor chip 10a includes the upper cover dielectric layer 290 having a step portion STb across the remaining scribe region RR and a portion of the device region DR adjacent to the remaining scribe region RR. In some embodiments, the step portion STb may extend along four sides of the semiconductor chip 10a with a substantially uniform horizontal width. For example, the step portion STb may extend along the four sides of the semiconductor chip 10a with a horizontal width of about 10 μm or less.

The step portion STb may be at a higher level than the top surface of the fourth inter-wiring dielectric layer 250. The step portion STb may be at a lower level than the top surface of the chip pad portion CPD.

The step portion STb may have the protrusion portion PRP on the bottom surface thereof. The protrusion portion PRP may surround the device region DR along an edge of the semiconductor chip 10a. For example, when the semiconductor chip 10a has four sides which form a rectangular shape in a plan view, the protrusion portion PRP may be arranged to surround the device region DR along the four sides of the semiconductor chip 10a.

Although not shown, similarly to the semiconductor chip 3 of FIGS. 18A and 18B, the semiconductor chip 10 of FIGS. 37A and 37B and the semiconductor chip 10a of FIGS. 39A and 39B may respectively have the step portions STa and STb of which each is arranged not along at least one of the four sides of the semiconductor chip 10 or 10a but along the other one to three sides. Similarly to the semiconductor chip 3a of FIGS. 19A and 19B, the semiconductor chip 10 of FIGS. 37A and 37B and the semiconductor chip 10a of FIGS. 39A and 39B may have the trench portion STR, which is arranged not along at least one of the four sides of the semiconductor chip 10 or 10a but along the other one to three sides, instead of the step portion STa or STb.

In some embodiments, the groove portion SLP of the semiconductor chip 10 of FIGS. 37A and 37B or the protrusion portion PRP of the semiconductor chip 10a of FIGS. 39A and 39B may be arranged not along at least one of the four sides of the semiconductor chip 10 or 10a but along the other one to three sides.

While the inventive concept has been particularly shown and described with reference to embodiments thereof, it will be understood that various changes in form and details may be made therein without departing from the spirit and scope of the following claims.

What is claimed is:

1. A semiconductor chip comprising:
a substrate;
a device layer arranged on the substrate and including a plurality of semiconductor devices;
a lower inter-wiring dielectric layer arranged on the device layer and having a lower permittivity than silicon oxide;
a wiring structure in the lower inter-wiring dielectric layer;
an upper inter-wiring dielectric layer on the lower inter-wiring dielectric layer, the upper inter-wiring dielectric layer having a permittivity that is equal to or higher than a permittivity of silicon oxide;
an isolation recess arranged along an edge of the substrate, the isolation recess having a side surface that is defined by a side surface of each of the lower inter-wiring dielectric layer and the upper inter-wiring dielectric layer and a bottom surface that is defined by a top surface of the device layer, the bottom surface of the isolation recess being at a level that is equal to or lower than a level of a bottom surface of the lower inter-wiring dielectric layer;
a pad pattern arranged on the upper inter-wiring dielectric layer and electrically connected to the wiring structure; and
a cover dielectric layer including a sub cover dielectric layer and an upper cover dielectric layer,
wherein the sub cover dielectric layer covers the bottom surface of the isolation recess, the side surface of the isolation recess, a top surface of the upper inter-wiring dielectric layer, a side surface of the pad pattern and a first portion of a top surface of the pad pattern,
wherein the sub cover dielectric layer does not cover a second portion of the top surface of the pad pattern, and wherein the upper cover dielectric layer fills the isolation recess and covers the sub cover dielectric layer.

2. The semiconductor chip of claim 1, wherein the upper cover dielectric layer contacts the entire top surface of the sub cover dielectric layer.

3. The semiconductor chip of claim 1,
wherein the upper cover dielectric layer includes a first portion covering the top surface of the upper inter-wiring dielectric layer, and a second portion covering the side surface of the isolation recess and the bottom surface of the isolation recess, and
wherein the upper cover dielectric layer includes a photosensitive polyimide.

4. The semiconductor chip of claim 3, wherein the top surface of the first portion of the upper cover dielectric layer is at a higher level than the top surface of the pad pattern, and the sub cover dielectric layer is formed of nitride.

5. The semiconductor chip of claim 3, wherein the top surface of the first portion of the upper cover dielectric layer is at a higher level than a top surface of the sub cover dielectric layer.

6. The semiconductor chip of claim 1, further comprising a sub pad electrically connecting the pad pattern to the wiring structure,
wherein the upper inter-wiring dielectric layer includes a first upper inter-wiring dielectric layer covering the lower inter-wiring dielectric layer, and a second upper inter-wiring dielectric layer covering the first upper inter-wiring dielectric layer and the sub pad,
wherein the sub pad is arranged on the first upper inter-wiring dielectric layer, and
wherein the second upper inter-wiring dielectric layer contacts a side surface and a top surface of the sub pad.

7. The semiconductor chip of claim 6, wherein a top surface of the second upper inter-wiring dielectric layer that is vertically overlapped with the sub pad is higher than a top surface of the second upper inter-wiring dielectric layer that is not vertically overlapped with the sub pad.

8. The semiconductor chip of claim 7,
wherein the upper inter-wiring dielectric layer includes a third upper inter-wiring dielectric layer covering the second upper inter-wiring dielectric layer, and a fourth upper inter-wiring dielectric layer covering the third upper inter-wiring dielectric layer, and
wherein a top surface of the third upper inter-wiring dielectric layer that is vertically overlapped with the sub pad is higher than a top surface of the third upper inter-wiring dielectric layer that is not vertically overlapped with sub pad.

9. The semiconductor chip of claim 8, wherein a top surface of the fourth upper inter-wiring dielectric layer is substantially flat.

10. The semiconductor chip of claim 6, wherein a thickness of the pad pattern is greater than a thickness of the sub pad.

11. A semiconductor chip comprising:
a substrate;
a device layer arranged on the substrate and including a plurality of semiconductor devices;
a lower inter-wiring dielectric layer arranged on the device layer; a wiring structure in the lower inter-wiring dielectric layer;
an upper inter-wiring dielectric layer on the lower inter-wiring dielectric layer;
an isolation recess arranged along an edge of the substrate and extending from a top surface of the upper inter-wiring dielectric layer at least to the same level as a bottom surface of the lower inter-wiring dielectric layer;

a pad pattern arranged on the upper inter-wiring dielectric layer and electrically connected to the wiring structure; and a cover dielectric layer filling the isolation recess and covering at least a portion of the top surface of the upper inter-wiring dielectric layer, the cover dielectric layer having a step portion that is adjacent to a portion of the edge of the substrate, wherein the cover dielectric layer includes a sub cover dielectric layer covering a top surface of the device layer that is exposed by the isolation recess, a side surface of the lower inter-wiring dielectric layer, a side surface of the upper inter-wiring dielectric layer, the top surface of the upper inter-wiring dielectric layer, a side surface of the pad pattern and a first portion of a top surface of the pad pattern, and wherein the sub cover dielectric layer does not cover a second portion of the top surface of the pad pattern.

12. The semiconductor chip of claim 11, wherein the isolation recess extends below the bottom surface of the lower inter-wiring dielectric layer and extends in the device layer.

13. The semiconductor chip of claim 11, wherein the cover dielectric layer includes an upper cover dielectric layer filling the isolation recess and covering the sub cover dielectric layer, wherein the upper cover dielectric layer includes a photosensitive polyimide, and wherein an uppermost surface of the upper cover dielectric layer is at a higher level than an uppermost surface of the sub cover dielectric layer.

14. The semiconductor chip of claim 13, wherein an uppermost surface of the upper cover dielectric layer is at a higher level than an uppermost surface of the pad pattern.

15. The semiconductor chip of claim 13, wherein a top surface of a portion of the upper cover dielectric layer covering the top surface of the upper inter-wiring dielectric layer is substantially flat.

16. The semiconductor chip of claim 11, further comprising a sub pad electrically connecting the pad pattern to the wiring structure, wherein the upper inter-wiring dielectric layer includes a first upper inter-wiring dielectric layer covering the lower inter-wiring dielectric layer, a second upper inter-wiring dielectric layer covering the first upper inter-wiring dielectric layer and a side surface and a top surface of the sub pad, a third upper inter-wiring dielectric layer covering the second upper inter-wiring dielectric layer, and a fourth upper inter-wiring dielectric layer covering the third upper inter-wiring dielectric layer, and wherein each of the second upper inter-wiring dielectric layer and the third upper inter-wiring dielectric layer has an uneven top surface, and the fourth upper inter-wiring dielectric layer has a flat top surface.

17. The semiconductor chip of claim 11, wherein the lower inter-wiring dielectric layer is a low-k dielectric layer having a lower permittivity than silicon oxide, and wherein a permittivity of the upper inter-wiring dielectric layer is greater than a permittivity of the lower inter-wiring dielectric layer.

18. A semiconductor chip comprising:

a substrate;

a device layer arranged on the substrate and including a plurality of semiconductor devices;

a lower inter-wiring dielectric layer arranged on the device layer and having a lower permittivity than silicon oxide;

a wiring structure in the lower inter-wiring dielectric layer;

a first upper inter-wiring dielectric layer on the lower inter-wiring dielectric layer;

a sub pad arranged on the first upper inter-wiring dielectric layer and electrically connected to the wiring structure;

a second upper inter-wiring dielectric layer on the first upper inter-wiring dielectric layer and the sub pad, a top surface of the second upper inter-wiring dielectric layer that is vertically overlapped with the sub pad is higher than a top surface of the second upper inter-wiring dielectric layer that is not vertically overlapped with the sub pad;

a third upper inter-wiring dielectric layer on the second upper inter-wiring dielectric layer, the third upper inter-wiring dielectric layer has a top surface that is substantially flat;

an isolation recess arranged along an edge of the substrate and extending from a top surface of the third upper inter-wiring dielectric layer at least to the same level as a bottom surface of the lower inter-wiring dielectric layer;

a pad pattern arranged on the third upper inter-wiring dielectric layer and electrically connected to the sub pad;

a sub cover dielectric layer covering a top surface of the device layer that is exposed by the isolation recess, a side surface of each of the lower inter-wiring dielectric layer and the first to third upper inter-wiring dielectric layers, the top surface of the third upper inter-wiring dielectric layer, a side surface of the pad pattern and a portion of a top surface of the pad pattern; and an upper cover dielectric layer filling the isolation recess and covering the sub cover dielectric layer, wherein an uppermost surface of the upper cover dielectric layer is at a higher level than an uppermost surface of the sub cover dielectric layer and an uppermost surface of the pad pattern.

19. The semiconductor chip of claim 18, wherein a thickness of the pad pattern is greater than a thickness of the sub pad.

20. The semiconductor chip of claim 18, further comprising a fourth upper inter-wiring dielectric layer between the second upper inter-wiring dielectric layer and the third upper inter-wiring dielectric layer, wherein a top surface of the fourth upper inter-wiring dielectric layer that is vertically overlapped with the sub pad is higher than a top surface of the fourth upper inter-wiring dielectric layer that is not vertically overlapped with sub pad.

* * * * *